United States Patent
Osaka et al.

(10) Patent No.: US 6,368,049 B1
(45) Date of Patent: Apr. 9, 2002

(54) SEMICONDUCTOR MANUFACTURING METHOD AND SEMICONDUCTOR MANUFACTURING APPARATUS

(75) Inventors: Akihiro Osaka; Hiroshi Sekiyama; Kouichi Noto; Masaki Sugawara, all of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/544,463

(22) Filed: Apr. 7, 2000

(30) Foreign Application Priority Data

Apr. 7, 1999 (JP) .......................................... 11-099562

(51) Int. Cl.[7] .............................. B44C 1/12; A51H 24/00
(52) U.S. Cl. .................................. 414/783; 414/331.01
(58) Field of Search ....................... 414/331.01, 331.04, 414/783, 936, 941, 754.2

(56) References Cited

U.S. PATENT DOCUMENTS

| | | | | |
|---|---|---|---|---|
| 5,100,502 A | * | 3/1992 | Murdoch et al. | ............ 156/643 |
| 5,954,072 A | * | 9/1999 | Matusita | ..................... 134/149 |
| 5,989,342 A | * | 11/1999 | Ikeda et al. | .................... 118/52 |
| 6,052,913 A | * | 4/2000 | Kaneko et al. | ................ 33/645 |
| 6,222,991 B1 | * | 4/2001 | Davenport | .................. 392/418 |

FOREIGN PATENT DOCUMENTS

JP  4-101795  * 4/1992 .......... B24J/015/08

* cited by examiner

Primary Examiner—David H. Bollinger
Assistant Examiner—Kenneth W Bower
(74) Attorney, Agent, or Firm—Oliff & Berridge, PLC

(57) ABSTRACT

Particles are prevented from clinging to the back of a wafer in the notch alignment of the wafer, and the problems encountered when a plurality of wafers were aligned all at once are solved. Three support poles 105 are erected on a turntable 103. The substrate outer periphery 104b of wafers 104 is supported by the tapered portions of support pins 107 protruding from the support poles 105. The turntable 103 is driven by a single motor 106, and all of the wafers 104 are rotated at once. During rotation, the notches 104a of al the wafers 104 are detected by an optical sensor 116 provided to a sensor pole 117, and the angular position thereof is stored. The wafers 104 are rotated an the basis of the angular position data, and notch alignment is performed successively, starting with the bottom wafer 104. The wafers 104 that have undergone notch alignment are successively picked up by the pick-up support pins 111 of pick-up poles 110, and are retracted from the support poles 105 that are rotating for notch alignment. Once all of the alignments have been completed, the retracted wafers 104 are returned to the support pins 107.

18 Claims, 33 Drawing Sheets

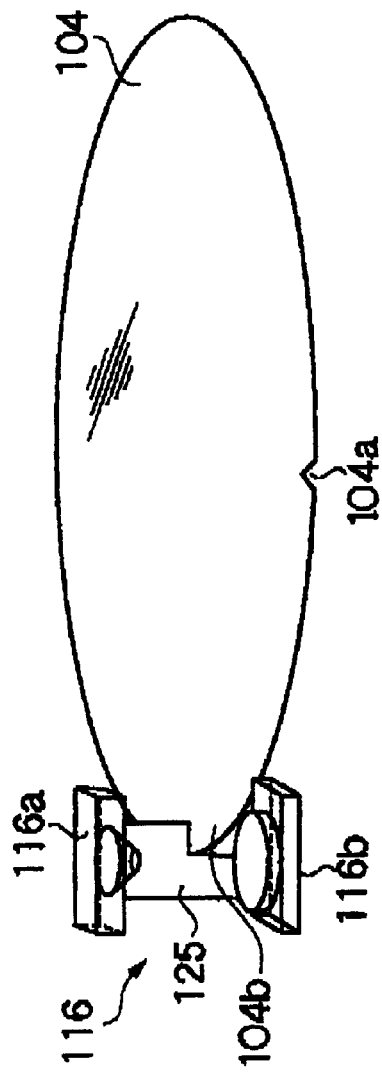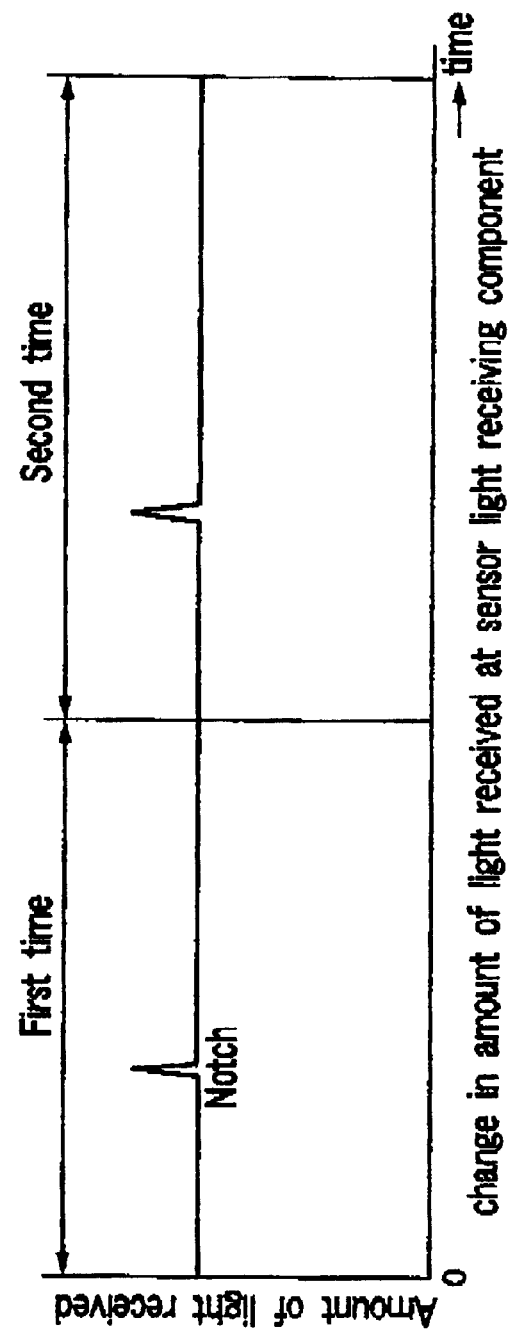

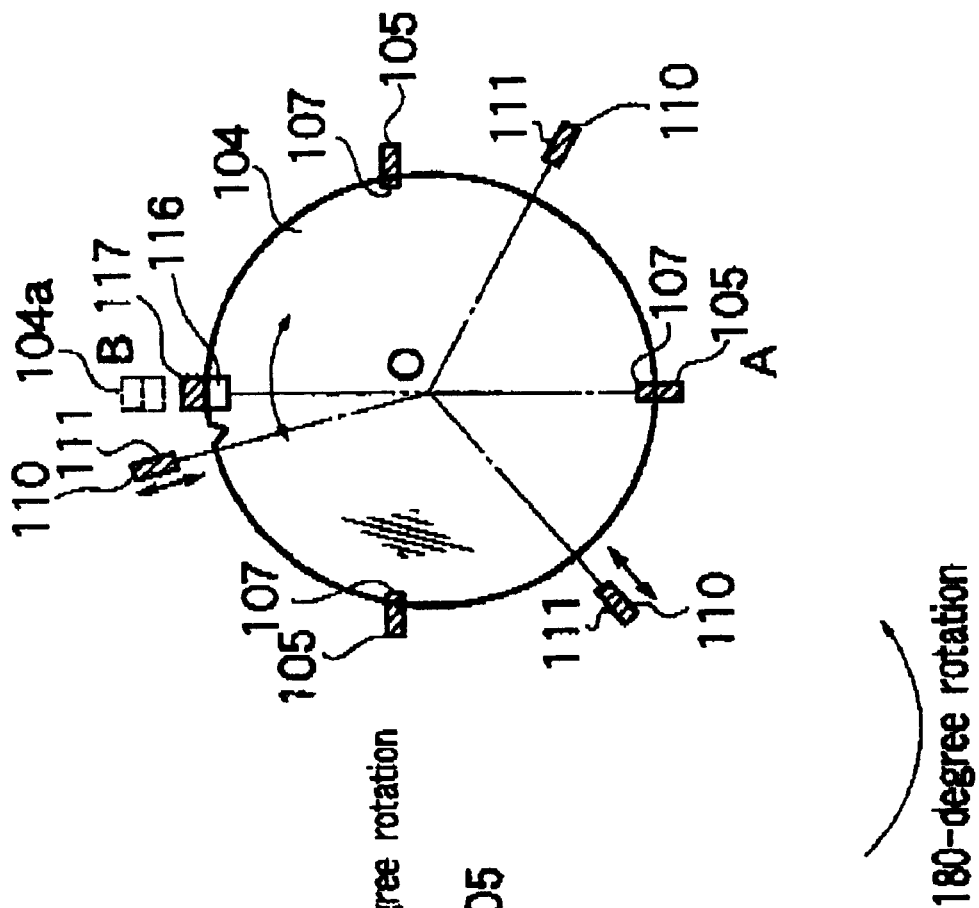
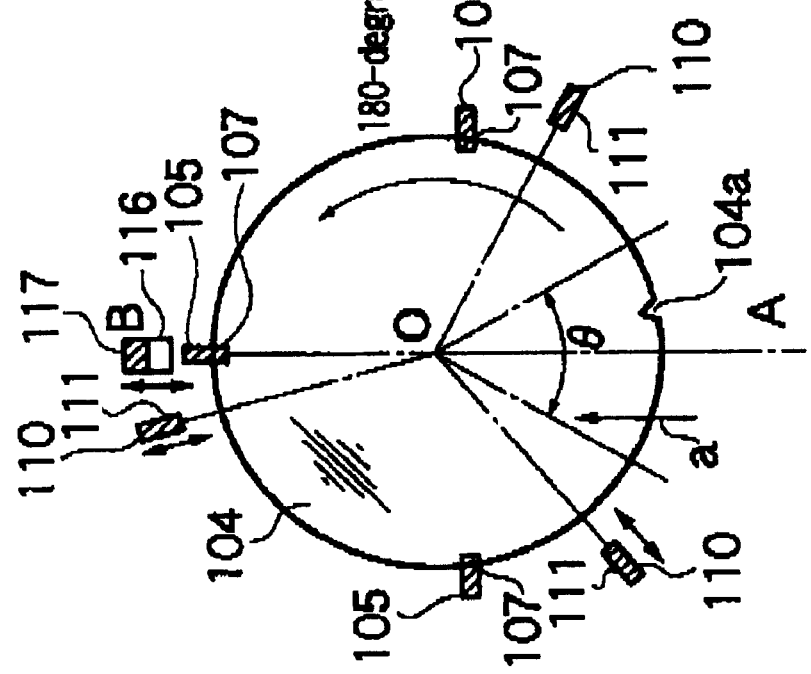

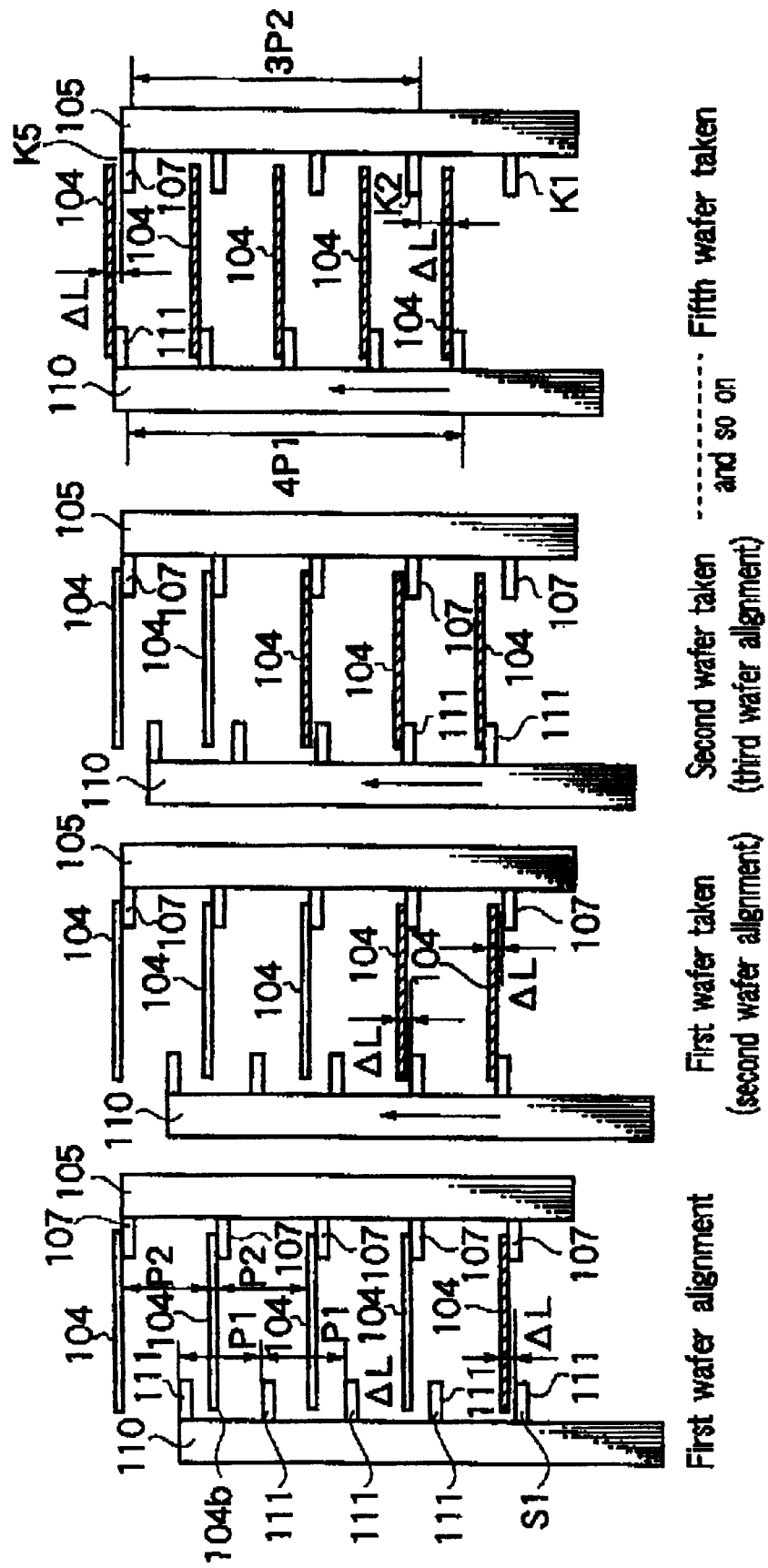

FIG.13A
(207)

- Support poles are rotated by required amount so that next region of wafer (81° region) will be searchable ~2071
- Sensors are inserted ~2072
- Notches are detected for 81° region of wafer between support poles (only for wafers whose notches have not been detected) ~2073
- Sensors are retracted ~2074

FIG.13B
(209)

- Support poles are rotated by required amount so that next region of wafer (remaining 81° region) will be searchable ~2091
- Sensors are inserted ~2092
- Notches are detected for 81° region of wafer between support poles (only for wafers whose notches have not been detected) ~2093
- Sensors are retracted ~2094

FIG.13C
(212)

- Wafers on support poles are picked up by pick-up poles ~2121
- 2122:
  - Support poles are rotated by specific amount (($360° -(148° +81° +81°$ ))/3=1.67°) so that notches enter searchable area (148°, 81°, or 81°)
  - Data is corrected (amount of rotation is added to detected notch possition data) so that detected notch position data will reflect amount of this rotation for wafers whose notches have been detected
- Pick-up poles are lowered to return wafers to support poles, and pick-up poles are retracted ~2123

FIG.13D
(218)

- wafers on support poles are picked up and retracted by pick-up poles ~2181
- Support poles are rotated by specific amount in direction opposite to direction noches are moved ~2182
- Pick-up poles are lowered and wafers are returned to support poles ~2183
- Support poles are rotated along shortest path (clockwise or counterclockwise) ~2184

Start

Just support poles rotated wafer retraction

Wafer rotation

Support pole rotation

Wafer rotation

——— Wafer rotation transition
------- Support pole rotation transition

Relationship between support pins and notch detection sensors

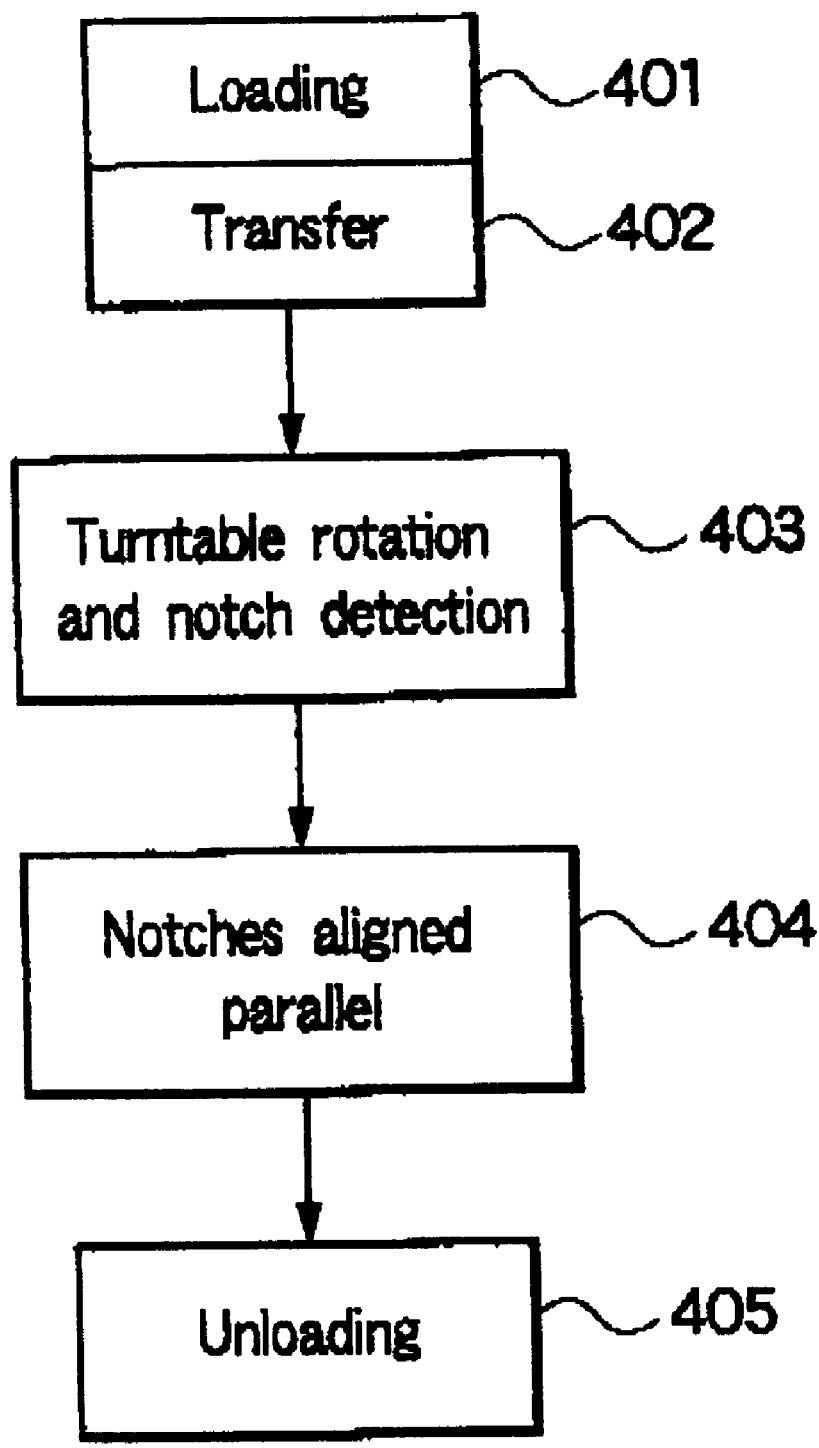

Wafer loading and unloading directions

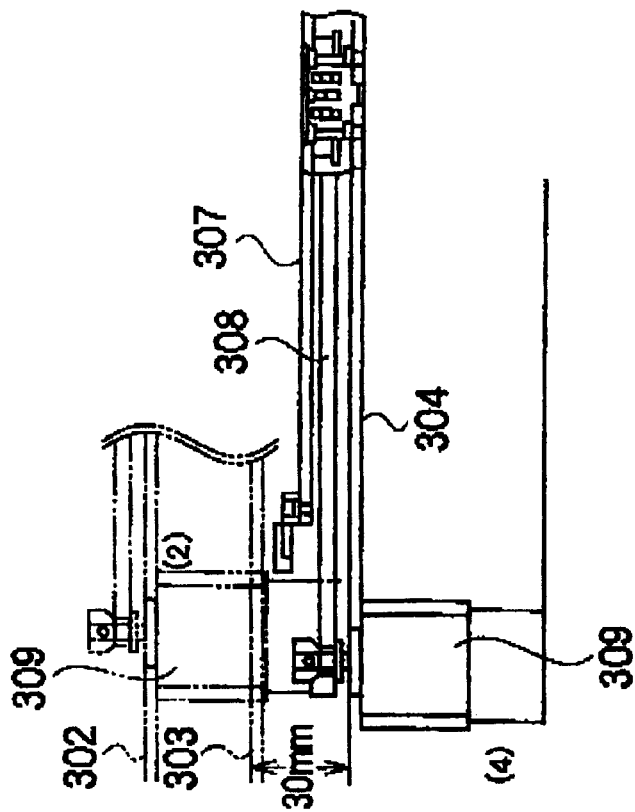
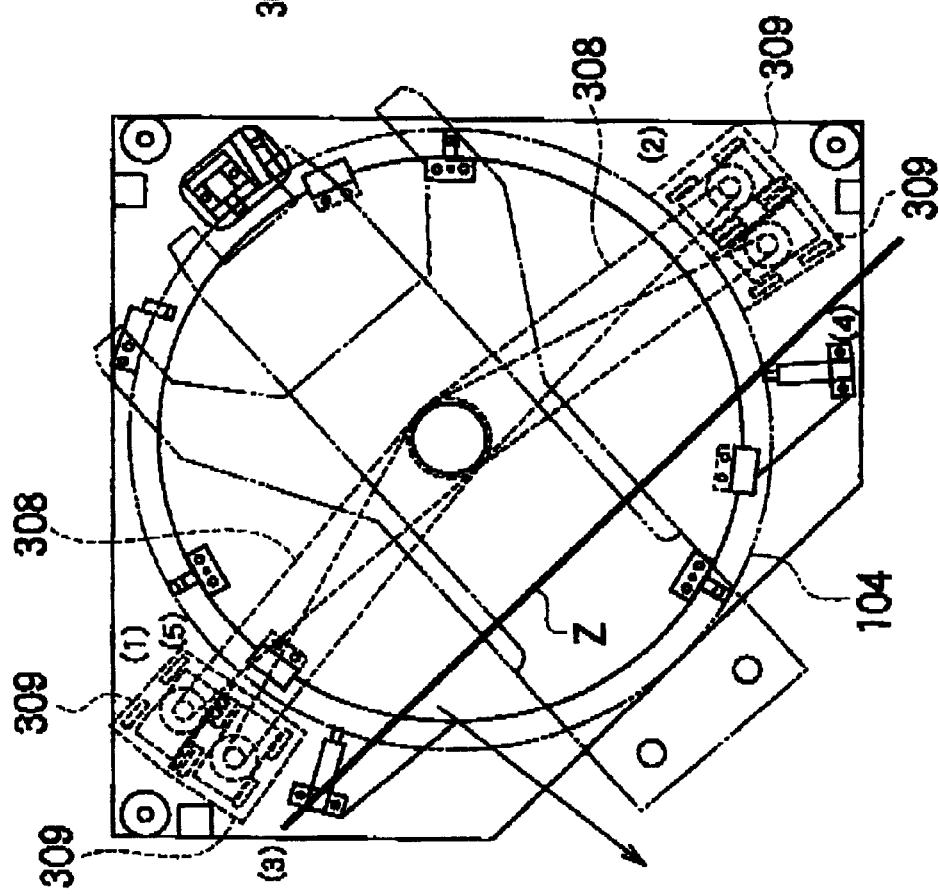

Wafer loading and unloading directions

SEMICONDUCTOR MANUFACTURING METHOD AND SEMICONDUCTOR MANUFACTURING APPARATUS

BACKGROUND OF THE INVENTION

1. Field of the Invention

The present invention relates to a semiconductor manufacturing method including a process for detecting the orientation flat or notch of a substrate and aligning it to a specified position, ad to a semiconductor manufacturing apparatus equipped with a substrate alignment apparatus.

2. Description of the Related Art

An 8-inch cassette that carries wafers generally has an open construction (with a lid-less open cassette, the bottom part is also open), so the notch alignment of the wafers can be performed from the opening in the bottom of the cassette by standing the cassette upright so that the wafers are vertical, However, a wafer carrier called a FOUP (Front Opeaing Unified Pod), which is a 12-inch cassette, has a closed construction, so notch alignment always requires the wafers to be taken out of the FOUP. Because the wafers inside the FOUP are ordinarily in a horizontal state, to align the notches in a vertical state, the FOUP has to be stood up vertically or rotated 90°. Changing the attitude of the FOUP by standing it up vertically or rotating it 90° is extremely troublesome, which is partially due to the large size of the carrier. Also, when 25 12-inch wafers are carried, the FOUP becomes quite heavy, making it difficult to rotate it by 90°. In view of this, a method in which the wafers are taken out of the FOUP while it is still horizontal and the notches of the wafers are aligned in a horizontal state is considered easier than when this is done vertically.

An example of a mechanism proposed in the past for positioning wafers in a horizontal state is Japanese Laid-Open Patent Application H6-13450. With this mechanism, the wafer is placed on an eccentricity correction jig having a conical sloped surface, the eccentricity of the wafer is corrected, the eccentricity correction jig is lowered, the water is moved from the eccentricity correction jig to a rotating stage and secured thereto by suction, the eccentricity correction jig is then further lowered and retracted, the wafer is rotated on the rotating stage in this state, and the notch on the wafer is detected by an optical sensor, allowing proper alignment to be achieved. After this alignment, the wafer is collected by the reverse operation. As a result, the eccentricity of the wafer is corrected all at once, and the wafer is positioned more accurately.

With the above alignment mechanism, however, because the back of the wafer is supported by vacuum auction during the detection of notch position, the generation of particles is inevitable, the problem with which is that these particles oling to the back of the substrate.

Also, the above alignment mechanism is only intended for a single water, and while it is effective in terms of achieving good alignment accuracy one wafer at a time and making the mechanism simpler, because only one wafer can be detected, alignment is slow when a plurality of wafers are positioned one at a time, creating a bottleneck in the process and resulting in poor throughput for the apparatus as a whole.

It is possible to provide a plurality of the above-mentioned alignment mechanisms in series in order to position a plurality of wafers all at once, but this results in a bulky mechanism. Furthermore, if an attempt is made to position a plurality of substrates all at once, this requires a complicated operation in which the angular position of previously positioned substrates is left alone while subsequent substrates are being positioned among various other problems that are encountered and solving these problems is extremely complicated in terms of both the process and the mechanism.

SUMMARY OF THE INVENTION

It is an object of the present invention to solve the problem associated with prior art where particles inevitably clung to the back side of the substrate because this side was supported, and to provide a semiconductor manufacturing method and semiconductor manufacturing apparatus with which it is possible to prevent particles from clinging to the back of the substrate during substrate alignment.

It is another object of the present invention to solve the problem associated with prior art whereby substrates could only be positioned one at a time, and to provide a semiconductor manufacturing method and semiconductor manufacturing apparatus with which it is possible to position a plurality of substrates all at once.

It is another object of the present invention to provide a semiconductor manufacturing method and semiconductor manufacturing apparatus with which throughput can be enhanced by performing substrate alignment during the idle time of the substrate transfer unit that transfers the substrates to a processing chamber or processing jig.

It is another object of the present invention to provide a semiconductor manufacturing method and semiconductor manufacturing apparatus with which it is possible to solve with ease the trouble encountered when a plurality of substrates are positioned simultaneously.

The invention of claim 1 is a semiconductor manufacturing method including a step of detecting the position of the orientation flat or notch of a substrate and aligning to a specific position, wherein a substrate transfer unit that transfers substrates to a processing chamber or processing jig is used for the orientation flat or notch alignment of the substrates.

When a substrate transfer unit that transfers substrates to a processing chamber or processing jig is used for the orientation flat or notch alignment, it is easier to place and remove the substrates with respect to the substrate alignment apparatus that performs the orientation flat or notch alignment. Also, since there is no need for a separate transfer unit to be readied, the apparatus is more compact and lower in cost.

The invention of claim 2 is the semiconductor manufacturing method according to claim 1, wherein the orientation flat or notch alignment of the substrates is performed in a transfer chamber in which the substrate transfer unit is installed.

Because the orientation flat or notch alignment is performed in a transfer chamber, the substrate transfer unit can be utilized more efficiently. Also, because the substrate alignment apparatus is installed in the empty space of the substrate transfer chamber, there is no need for a separate chamber or the like in which the substrate alignment apparatus is installed to be readied, which allows the apparatus to be more compact and lower in cost.

The invention of claim 3 is the semiconductor manufacturing method according to claim 1, wherein the substrates are removed from a substrate carrier by the substrate transfer unit and put into a substrate alignment apparatus that performs the orientation flat or notch alignment of the substrates, and the substrates are taken out of the substrate alignment apparatus by the substrata transfer unit after the orientation flat or notch alignment of the substrates and transferred to the processing chamber or processing jig.

When a substrate transfer unit that transfers the substrates to a processing chamber or processing jig is used it is easier to place and remove the substrates with respect to the substrate alignment apparatus that performs the orientation flat or notch alignment. Also, since there is no need for a separate transfer unit to be readied, the apparatus is more compact and lower in cost.

The invention of claim 4 is the semiconductor manufacturing method according to claim 1, wherein the orientation flat or notch alignment of the substrates is performed ahead of time by exchanging substrate carriers and repeating the following steps (a) to (d): (a) the substrates are removed from the substrate carrier by the substrate transfer unit and put into a substrate alignment apparatus that performs the orientation flat or notch alignment of the substrates, and orientation flat or notch alignment of the substrates is performed, (b) the substrates that have undergone orientation flat or notch alignment are taken out of the substrate alignment apparatus and returned to the substrate carrier by the substrate transfer unit, (c) repeating the above steps (a) and (b) until the orientation flat or notch alignment is finished for all of the substrates in the substrate carrier, and (4) the substrate carrier for which the orientation flat or notch alignment of the substrates has been finished is stored on a storage shelf.

If the orientation flat or notch alignment of substrates to be processed in the processing chamber the next and subsequent times is performed as much as possible during the idle time of the substrate transfer unit that transfers the substrates to the processing chamber or processing jig, such as while a substrate is being processed in the processing chamber, then substrates that have already undergone orientation flat or notch alignment can be transferred to the processing chamber directly from the substrate carrier, without having to undergo orientation flat or notch alignment again, so the substrates can be transferred more quickly and throughput is enhanced.

The invention of Claim 5 is the semiconductor manufacturing method according to Claim 4, including a step in which, if the orientation flat or notch alignment of the substrates in the substrate carrier has been performed ahead of time, this information is stored, a decision as to whether the substrates to be transferred have already undergone orientation flat or notch alignment is made on the basis of this information, and if the substrates to be transferred have already undergone orientation flat or notch alignment, then the substrates are taken out of the substrate carrier by the substrate transfer unit and transferred directly to the processing chamber or processing jig without first going through the substrate alignment apparatus.

If the orientation flat or notch alignment of a substrate to be processed has been performed ahead of time, then a transfer path is automatically selected such that a substrate is transferred from the substrate carrier directly to the processing chamber or processing jig, without going through the substrate alignment apparatus, but if the orientation flat or notch alignment of a substrate to be processed has not been performed ahead of time, then a transfer path is automatically selected such that the substrate is transferred from the substrate carrier to the substrate alignment apparatus, and is only transferred to the processing chamber or processing Jig after orientation flat or notch alignment, so there is no need for the user to be aware of whether the substrate has already undergone orientation flat or notch alignment (that is, no need to go to the trouble of checking whether the substrate has already undergone orientation flat or notch alignment and selecting the transfer path).

The invention of claim 6 is a semiconductor manufacturing method including a step of detecting the position of the orientation flat or notch of a substrate and aligning to a specific position, wherein the orientation flat or notch alignment of each substrate is performed by placing the substrate horizontally and rotating it while the outer periphery of the substrate is supported by a substrate support component.

Because the outer periphery of the substrate, rather than its back, is supported during the orientation flat or notch alignment, no particles cling to the back side of the substrate. Also, because the orientation flat or notch alignment can be performed horizontally, there is no need for the complicated operation of changing the attitude of the substrate when the substrate is transferred horizontally, and this facilitates orientation flat or notch alignment. This is particularly advantageous if the substrate has at large diameter, because changing its attitude would be more difficult.

The invention of claim 7 is the semiconductor manufacturing method according to claim 6, including a step in which the substrate is temporarily retracted from the substrate support component, and the relative positions of the substrate and the substrate support component in the peripheral direction are shifted, after which the retracted substrate is once again supported by the substrate support component.

More specifically, when orientation flat or notch alignment is performed for each substrate by rotating the substrate support component around the substrate center in a state in which the outer periphery of one or a plurality of substrates is horizontally supported by the substrate support component, it is preferable if each substrate is temporarily retracted from the substrate support component by the substrate retraction mechanism, the substrate support component is rotated around the substrate center during this retraction and the relative position of the substrate support component is shifted with respect to the peripheral direction of the substrate, and each retraced substrate is returned to and once again supported by the substrate support component.

Problems with the relative positions of the substrate and the substrate support components sometimes occurs such as in the course of aligning the orientation flats or notches of the substrates, or after orientation flat or notch alignment. When this happens, the substrates are temporarily retracted from the various substrate support components supporting each substrate, and during this retraction, the substrate support components are shifted in the peripheral direction of the substrates so as to shift the relative positions of the substrate support component with respect to the substrates. Problems with the positional relationship between the substrate and the substrate support component can be solved by moving the substrate support component while the substrate is retracted, so as to shift the position of the substrate support component with respect to the substrate The substrate retraction mechanism that retracts the substrate from the substrate support component may be, for example, a substrate pick-up mechanism provided such that it can be raised and lowered and comprising three pick-up poles having pick-up support pins for picking up and supporting one or a plurality of substrates, and this mechanism way be used to raise the substrate such that there is no interference with the substrate support component. During retraction, the angular position in the peripheral direction of the substrate is maintained with the substrate in the picked-up state, and after retraction, the substrate is directly lowered and transferred from the substrate retraction mechanism to the substrate support component.

The invention or claim 8 is the semiconductor manufacturing method according to claim 7, wherein, in the shifting of the relative positions of the substrate and the substrate support component in the peripheral direction, the position of the substrate support component is corrected so that the orientation flat or notch of the substrate will not overlap with the substrate support component, and so that the substrate support component will not block the forward path of the substrate transfer unit as the substrate is taken out of the substrate support component by the substrate transfer unit.

More specifically, in a semiconductor manufacturing method including a step of aligning a substrate, the substrate is temporarily picked up and retracted from the substrate support component without moving the substrate from its position in the peripheral direction, and during this retraction the substrate support component is rotated around the substrate center and the position of the substrate support component is corrected so that the substrate support component will not overlap with the orientation flat or notch, or so that the substrate support component will not block the forward path of the substrate transfer unit as the substrate is removed from the substrate support component by the substrate transfer unit after substrate alignment.

If the orientation flat or notch of a substrate overlaps with the substrate support component that supports the substrate prior to substrate alignment (orientation flat or notch alignment), the forward path of the substrate transfer unit may be blocked by the substrate support component as the substrate is being removed by the substrate transfer unit after substrate alignment. In such a case, the substrate is temporarily picked up and retracted from the substrate support component without moving the angular position of the substrate in the peripheral direction. In the case of an operation for eliminating the overlap between the orientation flat or notch and the substrate support component, the angular position of the substrate in the peripheral direction is maintained during the retraction of a substrate prior to notch alignment as well. During retraction, the substrate support component is rotated around the substrate center and the position of the substrate support component is corrected so that the substrate support component will not overlap with the orientation flat or notch, or so that the substrate support component will not block the forward path of the substrate transfer unit (the latter case is called return to point of origin). The problems mentioned above can be solved by performing this return to point of origin.

The invention of claim 9 is the semiconductor manufacturing method according to claim 8, wherein, if there is overlap between the substrate support component and the orientation flat or notch of the substrate while the substrate outer periphery is supported by the substrate support component, the substrate is temporarily retracted from said substrate support component and the relative positions of the substrate and the substrate support component in the peripheral direction are shifted, after which the substrate is once again supported by the substrate support component, thereby avoiding the overlap.

More specifically, in a semiconductor manufacturing method including a step of performing orientation flat or notch alignment for each substrate by rotating the substrate support component around the substrate center in a state in which one or a plurality of substrates have been placed horizontally by supporting the outer periphery of the substrates with the substrate support component, when the substrate outer periphery is supported by the substrate support component, and when the orientation flat or notch formed on the substrate outer periphery overlaps with the substrate support component so that the orientation flat or notch cannot be detected, the substrates are temporarily picked up and retracted from the substrate support component by the pick-up mechanism, during which time the substrate support component is rotated a specific amount, after which the retracted substrates are returned to the substrate support component, thereby avoiding the above-mentioned interference between the orientation flat or notch and the substrate support component.

When a substrate is placed on the substrate support component, the orientation flat or notch of the substrate may land on the substrate support component because the orientation flat or notch position of the substrate cannot be specified. It the orientation flat or notch lands on the substrate support component, the substrate support component may get in the way of the detection sensor and prevent the orientation flat or notch from being detected. In view of this, to avoid overlap between the substrate support component and the orientation flat or notch, the substrate is first picked up and retracted by the pick-up mechanism, and the substrate support component is rotated a specific amount during this retraction, thereby shifting the substrate support component with respect to the substrate and eliminating the above-mentioned overlap.

Because the substrate support component is thus shifted with respect to the substrate while the substrate is being picked up and retracted, thereby eliminating overlaps between the substrate support component and the orientation flat or notch, the problem of being unable to detect the orientation flat or notch can be eliminated.

The invention of claim 10 is the semiconductor manufacturing method according to claim 8, wherein the substrata is temporarily retracted from said substrate support component after the orientation flat or notch alignment of the substrate, and the substrate support component is set in a tolerance position that doesn't block the forward path of the substrate transfer unit, after which the substrate is once again supported by the substrate support component.

More specifically, in a semiconductor manufacturing method including a step of removing the substrates from the substrate alignment apparatus after one or a plurality of substrates have been put into the substrate alignment apparatus by the substrate transfer unit and the substrates have been positioned, the substrate support component that is provided to the substrate alignment apparatus and supports the outer periphery of the substrates is set in a tolerance position that doesn't block the forward path of the substrate transfer unit, the outer periphery of the substrates that are put into the substrate alignment apparatus is supported by the substrate support component of the substrate alignment apparatus, and the substrates supported by the substrate support component are rotated along with the substrate support component so that the orientation flats or notches of the substrates can be detected.

It is preferable if the substrates are positioned on the basis of the detection results, and the positioned substrates are picked up and temporarily retracted from the substrate support component by a substrate pick-up mechanism provided to the substrate alignment apparatus in a state in which the position of the positioned substrates is maintained, during which time the substrate support component is rotated in order to avoid interference between the substrate transfer unit and the substrate support component, which resets the substrate support component to a tolerance position that doesn't block the forward path of the substrate transfer unit (return to point of origin), and the retracted substrates are returned to the substrate support component after this resetting.

After the substrate support component has been rotated and the orientation flat or notch alignment of the substrate performed, the substrate support component may come to the substrate placement position of the substrate alignment apparatus, where the forward motion of the substrate transfer unit would be impeded. If the substrate support component comes to this placement position, the substrate transfer unit will interfere with the substrate support component and the substrate cannot be removed. In view of this, in order to avoid the interference between the substrate transfer unit and the substrate support component, all of the substrates are first picked up and retracted by the pick-up mechanism while this positioned state is maintained, and the substrate support component is rotated by a specific amount during this retraction, which resets the substrate support component to its original position and eliminates the above-mentioned interference.

While the substrates are being picked up and retracted, the substrate support component that had been shifted in the orientation flat or notch alignment process is reset to its original position, so the problem of being unable to remove the substrate after orientation flat or notch alignment is avoided.

The invention of claim 11 is a semiconductor manufacturing method including a step of detecting the position of the orientation flat or notch of a substrate and aligning to a specific position, wherein, in the orientation flat or notch alignment of a plurality of substrates, the plurality of substrates are stacked and supported by a substrate support mechanism and rotated all together by the required angle, the orientation flats or notches of all of the substrates are detected by a detection sensor, and the detection information is stored, the substrate support mechanism is rotated on the basis of the detection information, orientation flat or notch alignment is performed for one substrate at a time, each substrate that has undergone orientation flat or notch alignment to retracted from the substrate support mechanism one by one while the position of each substrate in the peripheral direction is maintained, and after the orientation flat or notch alignment and the retraction are finished for all of the substrates, the retracted substrates are returned to the substrate support mechanism.

Here, the detection information is positional information about the angle of shift from the reference angle position when the orientation flat or notch has been detected. If the orientation flats or notches of all the substrates are detected and this detection information is stored in the process of a plurality of substrates being rotated all at once and passed through the detection sensor, then even if the substrates are further rotated subsequently, the orientation flat or notch position can be accurately remembered as long as the detection information is corrected according to the amount of rotation.

The reason that the detection information needs to be corrected here is as follows. For example, when there is overlap between the substrate support component and the orientation flat or notch of the substrates, all the substrates are temporarily retracted and the substrate support component is rotated by a specific amount in order to eliminate this overlap, but in this case even those substrates that have already had their orientation flat or notch positions detected are rotated by this specific amount. Correction of the detection information is therefore necessary.

Orientation flat or notch alignment is performed for one substrate at a time, and the substrates are retracted from the substrate support mechanism while the position of the substrate in the peripheral direction is maintained, and after the orientation flat or notch alignment is complete for all the substrates, the retracted substrates are returned to the substrate support mechanism, so even if the substrate support position of the substrate support mechanism is changed, there will be no deviation in the aligned orientation flat or notch positions, and the proper orientation flat or notch alignment will still be possible.

The invention of claim 12 is the semiconductor manufacturing method according to claim 11, including a step of rotating the plurality of substrates all at once by a specified angle when the orientation flat or notch position of the plurality of substrates cannot be detected because the orientation flat or notch position is too far away from the place where the detection sensor is installed, and the orientation flat or notch position is brought closer to the place where the detection sensor is installed, where the orientation flat or notch positions can be detected, through this rotation by the required angle.

When the above-mentioned required angle is different from the specified angle, and the substrates are rotated all at once by the specified angle, it is only possible to detect the orientation flat or notch position by first rotating the substrates by the specified angle and then rotating them by the required angle. If the orientation flat or notch position is far away from the place where the detection sensor is installed, detection of the orientation flat or notch position can be facilitated by rotating the substrates by the specified angle all at once so that the orientation flat or notch position moves closer to the place where the position detection sensor is installed.

No position detection sensor is placed on the side of the substrate alignment apparatus where the substrates enter because it would obstruct the forward motion of the substrate transfer unit. Therefore, if the orientation flat or notch position is on the entry side, the orientation flat or notch position ends up being far away from the place where the sensor is installed. Accordingly, the substrates must be rotated so that the orientation flat or notch position is brought closer to the place where the sensor is installed. A similar operation is sometimes necessary even when the orientation flat or notch is not on the substrate entry side of the substrate alignment apparatus.

The invention of claim 13 is the semiconductor manufacturing method according to claim 11, wherein, when the orientation flats or notches of the substrates cannot be detected even when the substrate support mechanism is rotated by the required angle, the following steps (a) to (d) are performed so as to allow orientation flat or notch detection: (a) the substrates are retracted from the substrate support mechanism, (b) the substrate support mechanism is rotated by a specified angle, (c) the substrates are returned to the substrate support mechanism, and (d) the substrate support mechanism is rotated by the required angle and the orientation flat or notch position is detected.

More specifically, the following steps (a) to (d) are carried out when the orientation flats or notches of the substrates cannot be detected by the position detection sensor in a non-contact detection process. Once these steps have been carried out, the orientation flats or notches will go from an undetectable region to a detectable region, and the notches can be detected.

(a) The substrates are all retracted from the substrate support mechanism,
(b) the substrate support mechanism is rotated by a specific amount in order to shift the relative positions of the substrates and the substrate support mechanism in the peripheral direction,
(c) the retracted substrates are returned to the substrate support mechanism that has been rotated by the above-mentioned specific amount, and
(d) the substrates are rotated by the required amount and the positions of the orientation flats or notches of the substrates that have been returned to the substrate support mechanism are detected by the sensor.

When the orientation flat or notch positions of the substrates cannot be detected, it is preferable if the alignment of a plurality of substrates is carried out one substrate at a time by rotating the plurality of substrates all at once on the basis of the detection information, and every time alignment is completed, the substrate whose alignment is finished is retracted from the substrate support mechanism in order to preserve the alignment result, and once the alignment of all the substrates is complete, the retracted substrates are returned and supported by the substrate support mechanism.

The above-mentioned required angle is different from the specified angle, with the relationship being (required angle) >(specified angle). Even if the orientation flat or notch positions cannot be detected when the substrate support mechanism is rotated by the required angle, they will be detected if the peripheral direction position of the substrates is shifted by the specified angle with respect to the substrate support mechanism, and the detection of the orientation flat or notch positions is thus possible.

The invention of claim 14 is the semiconductor manufacturing method according to claim 11, wherein, in the alignment of the orientation flats or notches of the substrates to a specific position after completion of the orientation flat or notch position detection operation for all of the substrates, if the orientation flat or notch of the substrate cannot be aligned to the specific position with a single rotation because the orientation flat or notch position is too far away from the specific position, the following steps are repeatedly performed until the orientation flat or notch of the substrate is aligned with the specified position.

(a) The substrate support mechanism is rotated the required amount in the direction that is the shortest path from the orientation flat or notch position to the specified position.
(b) the substrates are retracted from the substrate support mechanism.
(c) the substrate support mechanism is rotated the required amount in the opposite direction from that in (a), and
(d) the substrates are returned to the substrate support mechanism.

If, after the orientation flat or notch positions have been detected for all the substrates, the orientation flat or notch positions are far away from the specified position in the alignment of the orientation flat or notch position to the specified position, then it may be impossible to align the orientation flats or notches to the specified position with a single rotation due to the limited range of motion of which the apparatus is capable. In a case such as this, the orientation flat or notch position can be moved to the specified position by repeating the above steps (a) to (d) and shifting the position a little at a time. The shortest path from the notch position to the specified position is selected from the stored detection information.

The invention of claim 15 in the semiconductor manufacturing method according to claim 8, wherein orientation flat or notch alignment is performed all at once for a plurality of substrates.

Because orientation flat or notch alignment is performed all at once for a plurality of substrates, there is a marked increase in throughput.

The invention of claim 16 is a semiconductor manufacturing apparatus equipped with a substrate alignment apparatus that performs orientation flat or notch alignment for one or a plurality of substrates supported horizontally, wherein the substrate alignment apparatus comprises a substrate support mechanism that has a substrate support component which supports the outer periphery of the substrate and that rotates the substrate support component around the substrate center to as to rotate the substrate, and a detection sensor that detects in non-contact fashion the orientation flat or notch of the substrate supported and rotated by the substrate support mechanism.

Because the substrates are supported around their outer periphery rather than on their back side, the particles that are produced in the course of substrate support do not cling to the back side. There is no friction between the detection sensor and the substrate when the orientation flat or notch is detected in non-contact fashion by the detection sensor. Therefore, with the present invention, the clinging of particles to the back of the substrate can be effectively prevented because the orientation flat or notch is detected without contact with the substrate, and the outer periphery of the substrate is supported.

The invention of claim 17 is the semiconductor manufacturing apparatus according to claim 16, wherein a supporting tapered portion is provided to the support component, and the outer periphery of the substrate is supported by this supporting tapered portion.

Because the substrate is supported in linear or point contact by the supporting tapered portion, less frictional force is produced than when a substrate is supported in surface contact, and there is also a reduction in the particle generation that accompanies orientation flat or notch alignment, so the clinging of particles to the back of the substrate can be effectively prevented.

The invention of claim 18 is the semiconductor manufacturing apparatus according to claim 16, wherein the substrate support component further has a tapered portion for correcting substrate eccentricity.

When the substrate is supported by a supporting tapered portion via a tapered portion for correcting substrate eccentricity, because the substrate is in a horizontal state the substrate is automatically centered by its own weight in the course of the orientation flat or notch alignment.

The invention of claim 19 is the semiconductor manufacturing apparatus according to any of claim 16, having a substrate retraction mechanism for retracting the substrate from the substrate support component of the substrate support mechanism.

More specifically, in a semiconductor manufacturing apparatus equipped with a substrate alignment apparatus that performs orientation flat or notch alignment for one or a plurality of substrates supported horizontally, it is preferable for the substrate alignment apparatus to have a substrate support mechanism that has a substrate support component having a tapered portion and supporting the outer periphery of the substrate with this tapered portion, with this substrate support component provided rotatably around the substrate center, and that rotates the substrate supported by this substrate support component, a detection sensor that detects in non-contact fashion an orientation flat or notch formed at the outer periphery of the substrate supported and rotated by the substrate support mechanism, and a substrate retraction mechanism that has a substrate support component for supporting the outer periphery of the substrate, with which this substrate support component is supported at the substrate outer periphery and one or a plurality of the substrate are temporarily retracted from the substrate support component of the substrate support mechanism.

Because this substrate retraction mechanism allows the substrate to be temporarily retracted from the substrate support component, it solves the problem encountered with the positional relationship between the substrate support component and the substrate.

The invention of claim 20 is the semiconductor manufacturing apparatus according to claim 19, comprising a control component for controlling the substrate support mechanism and the substrate retraction mechanism as in the following (a) to (c): (a) the rotation of the substrate support mechanism is controlled such that the orientation flats or notches of a plurality of substrates are detected and the orientation flats or notches of the substrates are aligned one by one, (b) the substrate retraction mechanism is controlled such that the substrates that have undergone orientation flat or notch alignment are successively retracted from the substrate support mechanism one by one, and (c) the substrate retraction mechanism is controlled such that the plurality of retracted substrate are returned to the substrate support mechanism after completion of the orientation flat or notch alignment of all the substrates.

More specifically, in a semiconductor manufacturing apparatus equipped with a substrate alignment apparatus that performs orientation flat or notch alignment for a plurality of substrates supported horizontally, the substrate alignment apparatus is equipped with a substrate support mechanism that supports a plurality of substrates in a horizontally stacked state and rotates them all at once, a sensor that detects in non-contact fashion the orientation flats or notches of the various substrates rotated all together by the substrate support mechanism, a substrate retraction mechanism that temporarily retracts the substrates from the substrate support mechanism, and a control component that controls the substrate support mechanism and the substrate retraction mechanism.

It is preferable for this control component to:
(a) control the rotation of the substrate support mechanism is controlled in order to rotate a plurality of substrates all at once and detect the orientation flats or notches of the various substrates, and to align the various substrates one by one on the basis of the detection value for the orientation flat or notch of each substrate, and output individual alignment completion signals when the alignment of the various substrates is complete;
(b) control the substrate retraction mechanism in order for the substrates that have been aligned to be successively retracted from the substrate support mechanism one by one on the basis of the individual alignment completion signals, and
(c) control tile substrate retraction mechanism in order for the plurality of retracted substrate to be returned to the substrate support mechanism on the basis of all the alignment completion signals.

Controlling the substrate support mechanism and substrate retraction mechanism with the control component as above allows orientation flat or notch alignment of a plurality of substrates to be performed smoothly with a single rotary drive component.

The invention of claim 21 is the semiconductor manufacturing apparatus according to claim 16, wherein the substrate support mechanism comprises a turntable, a plurality of support poles erected on the turntable, a substrate support component that is provided to each support pole and supports the outer periphery of each of a plurality of substrates, and a single rotary drive component that rotates the turntable.

More specifically, it is preferable for the substrate support mechanism to comprise a turntable, a plurality of support poles that are erected on the turntable and support a plurality of substrates, a plurality of substrate support components that are provided at a specific pitch in the axial direction of the various support poles, have tapered portions protruding in the inward radial direction of the turntable, and support the outer periphery of the substrates with these tapered portions, and a single rotary drive component that rotates the turntable on which the support poles are erected, and rotates all at once the plurality of substrates stacked and supported on the plurality of substrate support components.

Because only one turntable and one rotary drive component for rotating it are needed, the construction can be simpler. It is preferable for the substrate support components supporting the substrates to be constituted by three support pins having tapered portions that support the substrate outer periphery, but do not have to be pins as long as the contact surface area is small.

The invention of claim 22 is the semiconductor manufacturing apparatus according to claim 19, wherein the substrate retraction mechanism comprises a base provided such that it can be raised or lowered, a lifting drive component for raising or lowering the base, a plurality of pick-up poles that are erected on the base and pick up a plurality of substrates one at a time from the substrate support component as the base is raised and lowered, and a substrate support component that is provided to each of the pick-up poles and supports the outer periphery of the substrate.

More specifically, it is preferable if the substrate retraction mechanism comprises a base provided such that it can be raised or lowered, a lifting drive component for raising or lowering the base, a plurality of pick-up poles that are erected on the base so as not to interfere with the plurality of support poles and that temporarily pick up a plurality of substrates one at a time from the support poles as the base is raised and lowered, and a plurality of substrate support components that are provided to the various pick-up poles at a specific pitch in the axial direction in order to pick up the plurality of substrates successively, starting with the lowest one, and that have substrate support components that protrude in the inward radial direction of the base and support the outer periphery of the substrates, pick up the substrates from the substrate support components of the substrate support mechanism when the substrate outer periphery is supported as the base is raised, and return the picked-up substrates as the base is lowered.

The substrates can be retracted from the substrate support mechanism with the position of the substrates in the peripheral direction maintained, with a simple construction in which substrate support components are merely attached to pick-up polar.

The invention of claim 23 is the semiconductor manufacturing apparatus according to claim 22, wherein the substrate support component has a turntable, a plurality of support poles erected on the turntable, a substrate support component that is provided to each support pole and supports the outer periphery of each of a plurality of substrates, and a single rotary drive component that rotates the turntable, wherein the pitch P1 of the substrate support components provided to the pick-up poles and the pitch P2 of the substrate support components of the support poles satisfy the relationship P1<P2.

If the pitch P1 of the substrate support components and the pitch P2 of the substrate support components satisfy the relationship P1<P2, then the plurality of substrates supported by the substrate support components provided to the support poles can be successively picked up, starting from the lowest one, by the substrate support components provided to the pick-up poles.

The invention of claim 24 is the semiconductor manufacturing apparatus according to claim 23, wherein when n number of substrates are successively picked up one at a time by the pick-up poles, the pitch P1 of the substrate support components provided to the pick-up poles and the pitch P2 of the substrate support components of the support poles satisfy the relationship (n−1)P1>(n−2)P2.

If the above relationship is satisfied, then the plurality of substrates supported by the substrate support components provided to the support poles can be successively picked up, starting from the lowest one, by the substrate support components provided to the pick-up poles. Also, when the support poles are rotated in a state in which the substrates have been picked up by the pick-up poles, there will be no interference between the substrates and the substrate support components provided to the support poles or the substrate support components provided to the pick-up poles.

The invention of claim 25 is the semiconductor manufacturing apparatus according to claim 16, wherein the detection sensor is constituted such that it moves forward in the inward radial direction of the substrate when detecting the orientation flat or notch, and moves backward in the outward radial direction of the substrate when not detecting.

More specifically, it is preferable if the sensor is constituted such that It is provided so that it can move forward in the radial direction of the stacked and supported substrates, moves forward in the inward radial direction of the substrates and detects the orientation flats or notches of the substrates during the detection of the orientation flats or notches formed on the outer periphery of the substrates, and retracts in the outward radial direction of the substrates When not detecting, so that interference with the substrate support components is avoided.

The detection sensor moves forward in the inward radial direction of the substrate and detects the orientation flats or notches of the substrates during the detection of the orientation flats or notches formed on the outer periphery of the substrates, and retracts in the outward radial direction of the substrates when not detecting, so that interference with the substrate support components is avoided.

The invention of claim 26 is a semiconductor manufacturing apparatus equipped with an orientation flat or notch alignment apparatus that performs orientation flat or notch alignment for a plurality of substrates supported horizontally, wherein the substrate alignment apparatus comprises a plurality of turntables provided in a stacked state and sharing a common center of rotation, on each of which is placed one substrate, a plurality of substrate support components provided to the various turntables for supporting the outer periphery of the various substrates, a plurality of rotary drive components for independently rotating each of the plurality of turntables, and a detection sensor for detecting the orientation flats or notches in non-contact fashion.

Because there are a plurality of turntables on each of which is placed a single substrate, alignment can be carried out individually, facilitating control.

The invention of claim 27 is the semiconductor manufacturing apparatus according to claim 26, further comprising a substrate retraction mechanism for retracting the substrates from the substrate support components.

More specifically, in a semiconductor manufacturing apparatus equipped with a substrate alignment apparatus that performs the alignment of a plurality of horizontally supported substrates, the substrate alignment apparatus comprises a plurality of turntables provided in a stacked state and sharing a common center of rotation, on each of which is placed one substrate, a plurality of substrate support components attached to the various turntables and supporting the outer periphery of the plurality of substrates placed on the various turntables and having tapered portions formed at their support components, a plurality of drive components for independently rotating each of the plurality of turntables, a fixed sensor for detecting in non-contact fashion the orientation flats or notches formed at the outer periphery of the substrates supported by the tapered portions of the substrate support components, and a substrate retraction mechanism.

Even if there are problems such as with the positional relationship between the substrates and the substrate support components, the inclusion of this substrate retraction mechanism allows these problems to be solved without canceling out the orientation flat or notch alignment.

The invention of claim 28 is the semiconductor manufacturing apparatus according to claim 27, wherein the substrate retraction mechanism comprises a plurality of pick-up poles that are erected such that they can be raised or lowered, and a plurality of substrate support components that are provided to the each pick-up pole, support the substrate outer periphery and pick up the substrates from the substrate support components when raised, and return the substrates that have been picked up to the substrate support components when lowered.

It is preferable it the above-mentioned substrate retraction mechanism has a base provided such that it can be raised or lowered, a lifting drive component for raising or lowering the base, a plurality of pick-up poles that are erected on the base and temporarily pick up a plurality of substrates from the substrate support components as the base is raised and lowered, and a plurality of substrate support components that are provided at a specific pitch in the axial direction to various the pick-up poles in order to pick up a plurality of substrates, pick up the substrates from the substrate support components of the turntables when the substrate outer periphery is supported as the base is raised, and return the picked-up substrates to the substrate support components as the base is lowered.

Even if there are problems such as with the positional relationship between the substrates and the substrate support components, the inclusion of this substrate retraction mechanism allows these problems to be solved without canceling out the orientation flat or notch alignment.

The invention of claim 29 is the semiconductor manufacturing apparatus according to any of claim 26, wherein the detection sensor and the substrate support components are in a positional relationship such that there is no contact when the substrates are rotated. If the detection sensor and the substrate support components are in a positional relationship such that there is no contact, there will be no restriction on the rotation of the substrate retraction mechanism or turntables, allowing for free rotation, or the orientation flats or notches can be easily detected regardless of where the orientation flat or notch position is, and orientation flat or notch alignment can be carried out more smoothly.

The invention of claim 30 is the semiconductor manufacturing apparatus according to claim 29, wherein when the detection sensor is an optical sensor, then the structure in which the detection sensor and the substrate support components are in a non-contact positional relationship is a structure comprising a turntable that is smaller in diameter than the substrates, a substrate support component protruding in the outward radial direction from the turntable and forming a support component that supports the outer periphery of the substrate, and an optical sensor that is outside the turntable in the radial direction and has a light receiving component or light emitting component disposed on the back side of the substrate outer periphery that protrudes out from the smaller diameter turntable when the substrate is supported by the substrate support component, and a light emitting component or light receiving component disposed on the front side of the substrate outer periphery opposite the light receiving component or light emitting component.

When an attempt is made to detect the orientation flat or notch formed at the substrate outer periphery with an optical sensor, if the diameter of the substrate is the same a as the diameter of the turntable, then the turntable will block the path of the light that has passed through the orientation flat or notch, so the orientation flat or notch cannot be detected. Consequently, the diameter of the turntable is made smaller than the diameter of the substrate, so that the outer periphery of the substrate placed on the turntable will stick out beyond the turntable in the outward radial direction. As a result, contact between the optical sensor and the substrate support component during turntable rotation can be eliminated with a simple construction in which the support component that supports the outer periphery of the substrate sticking out beyond the turntable is merely formed on the substrate support component.

The invention of claim 31 is the semiconductor manufacturing apparatus according to any of claim 26, wherein a rotary drive component for rotating the turntable is not disposed beneath the turntable.

The rotary drive component is a pulse motor, for example. If the rotary drive component and the turntable are linked by a belt pulley, for example, and the rotary drive component is disposed in parallel to the side of the turntable, then the thickness of the turntable and that of the substrate supported on the turntable will be absorbed within the height of the rotary drive component, so the apparatus can be more compact in the height direction than when the rotary drive component is disposed in series beneath the turntable. Because the rotary drive component is not placed beneath the turntable, the apparatus can be shorter in height and more compact.

The invention of claim 32 is the semiconductor manufacturing apparatus according to claim 31, wherein rotary drive components that are adjacent in the vertical direction are disposed so as to have different centers of rotation.

For rotary drive components that are adjacent in the vertical direction, interference between the rotary drive components can be avoided by staggering the rotary drive components so that the centers of rotation are different, so the spacing between turntables can be kept to within the desired spacing, and the apparatus can be made even more compact.

The invention of claim 33 is the semiconductor manufacturing apparatus according to any of claim 26, wherein the substrate support components are transparent. Transparent members are made up of members that are transparent to the light handled by the optical sensor.

Because the substrate support components are transparent, even it the orientation flats or notches land on the substrate support component, the light will not be blocked by the substrate support component, allowing the orientation flats or notches to be detected. Therefore, there is no need to shift the substrate support components with respect to the substrates should the orientation flats or notches land on the substrate support components, and this facilitates operation of the apparatus.

BRIEF DESCRIPTION OF THE DRAWINGS

FIGS. 6A and 6B are principle diagrams of the optical sensor pertaining to the first embodiment, with FIG. 6A illustrating the positional relationship between the wafer and the optical sensor and FIG. 6B being a curve of the change in the amount of light received by the light receiving elements;

FIGS. 7A and FIG. 7B consist of correlation diagrams of the support poles, pick-up poles, optical sensors, and wafers in the first embodiment, with FIG. 7A being a diagram of when the wafers are put in, and FIG. 7B when the support poles have been rotated 180°;

FIGS. 8A, 8B, 8C and 8D consist of diagrams of the operation of the pick-up poles in the first embodiment, with FIG. 8A being when the first wafer is aligned, FIG. 8B when the first wafer that has been aligned is picked up, FIG. 8C when the second wafer that has been aligned is picked up, and FIG. 8D when the fifth wafer that has been aligned is picked up;

FIGS. 13A, 13B, 13C and 13D are detailed diagrams of the individual processing step, where FIG. 13A is step 207, FIG. 13B is step 209, FIG. 13C is step 212, and FIG. 13D is step 21B;

FIG. 18 is a flow chart illustrating the operation in the second embodiment;

FIGS. 22A and 22B consist of diagrams of the motor interference in the third embodiment, with FIG. 22A being a plan view and FIG. 22B a vertical cross section;

DESCRIPTION OF THE PREFERRED EMBODIMENTS

Embodiments of the present invention will now be described. The embodiments deal with a large 12-inch wafer as the alignment substrate, but the present invention is not limited to a 12-inch size. Also, a case in which the alignment mark on the substrate is a notch will be described, but this may be an orientation flat Instead. Furthermore, the number of wafers whose notches are to be detected all at once is five here, but is not limited to five, and may even be one.

Figure 30A:
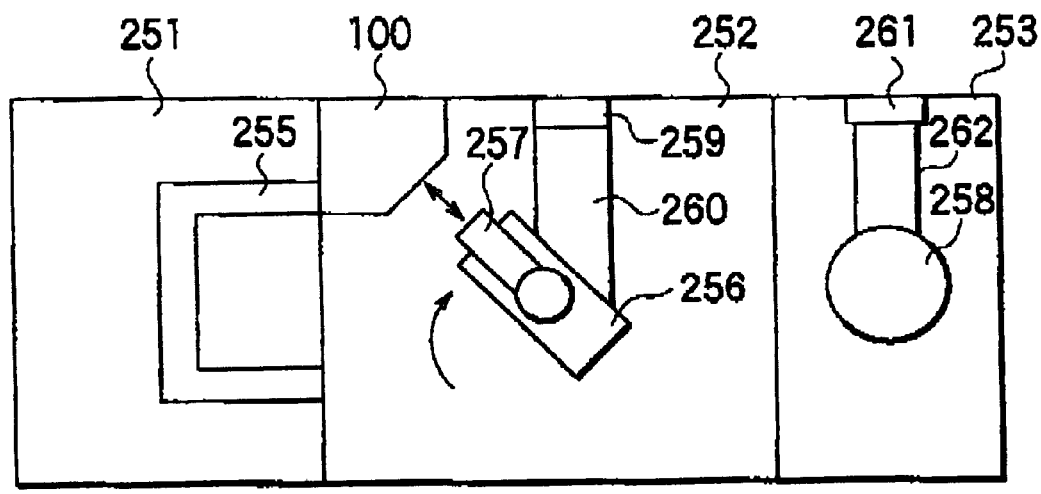
FIGS. 30A, 30B and 30C consist of diagrams illustrating the layout of the substrate alignment apparatus in the semiconductor manufacturing apparatus of this embodiment, with FIG. 30A being a plan view, 30B a front view, and 30C an oblique view of a FOUP.
Figure 30B:
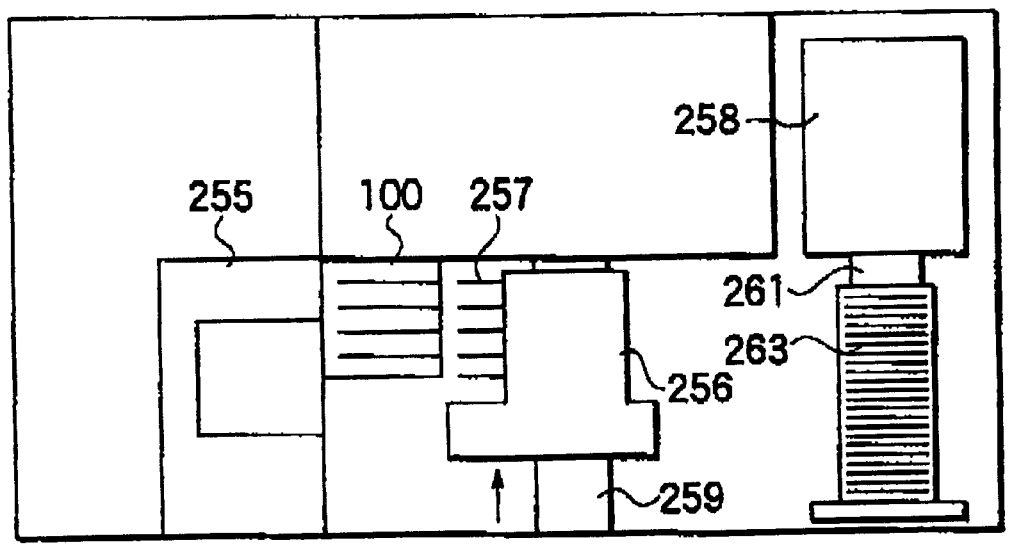
Figure 30C:
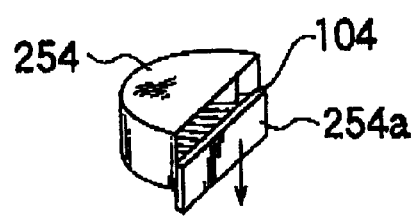

FIGS. 30A, 30B and 30C illustrate a vertical CVD/diffusion apparatus that is an example of a semiconductor manufacturing apparatus in an embodiment. FIG. 30A is a plan view, FIG. 30B is a front view, and FIG. 30C is an oblique view of a FOUP (the substrate Carrier). Also illustrated is a substrate alignment apparatus 100 provided to this apparatus. The semiconductor manufacturing apparatus primarily consists of a transfer chamber 251 into and out of which wafers are transferred in FOUP units, a transfer chamber 252 in which the wafers 104 care exchanged between the transfer chamber 251 and a processing chamber 253, and this processing chamber 253 in which the wafers 104 are subjected to film formation or other such processing. The substrate alignment apparatus 100, which is capable of aligning a plurality of substrates all at once, is located in the transfer chamber 252 in the center. Although not shown in the figure, the transfer chamber 251 is equipped with an I/O stage, a FOUP loader, and a FOUP rack (storage rack), and, as shown in the figure, is also equipped with a pod opener 255 that opens and closes the lid 254a of a FOUP 254. The design is such that when the lid 254a is opened to the FOUP 254, in which the wafers 104 are placed horizontally, the 12-inch wafers 104 can be removed horizontally from inside the FOUP 254.

The FOUP 254 holding the wafers 104 in a horizontal state is transferred from outside the apparatus into the transfer chamber 251, either manually or by a transfer apparatus. It goes along a specific path and is brought to a position provided to the pod opener 255, where the lid 254a is opened. The transfer chamber 252 is equipped with a wafer transfer unit 256 capable of transferring a plurality of wafers 104 all at once, and the substrate alignment apparatus 100 which aligns a plurality of wafers 104 all at once. A plurality of wafers 104 are moved from the open lid 254a of the FOUP 254 into the substrate alignment apparatus 100 all at once by a tweezers 257 of the wafer transfer unit 256.

After substrate alignment, the wafers 104 removed from the substrate alignment apparatus 100 by the wafer transfer unit 256 are transferred to a boat 263 in a boat pull-out position. The phrase "boat pull-out position" an used her refers to the position (unloading position) where the boat 263 is pulled out from a reaction tube 258, and where wafer charging and discharging is performed with respect to the boat 263. The boat 263 also serves as a processing jig. The boat 263 loaded with the required number of wafers 104 is transferred into the reaction tube 258 at the top of the processing chamber 253. After this, film formation, diffusion, oxidation, or other such processing is carried out in the reaction tube 258. Upon completion of this wafer processing, the boat 263 is lowered and transferred out of the reaction tube 258, the wafers 104 in the boat 263 are transferred from the processing chamber 253 to the transfer chamber 251 by the reverse operation from that described above (without going through the substrate alignment apparatus 100, however), and are loaded into the FOUP 254 and transferred out of the apparatus.

in FIGS. 30A, 30B and 30C, 259 is a transfer elevator. 260 is a transfer unit arm, 261 is a boat elevator, and 262 is a boat arm.

With the semiconductor manufacturing apparatus in this embodiment of the present invention, as mentioned above, the substrate alignment apparatus is equipped with the transfer chamber 252 in the center, and notch alignment is performed using the wafer transfer unit 256. More specifically, as mentioned above, a plurality of wafers 104 are taken out of the FOUP 254 and put into the substrate alignment apparatus 100 all at once by the wafer transfer unit 256, and after notch alignment, the wafers 104 that have been taken out of the substrate alignment apparatus 100 by the wafer transfer unit 256 are transferred directly to the boat 263. After the required number of wafers 104 have been loaded into the boat 263, the wafer transfer unit 256 is in a free state. This state continues not only during processing, but also until the processed wafers 104 are removed from the boat 263. During this time, the drive system for portions other than the reaction chamber, such as the wafer transfer unit 256, the substrate alignment apparatus 100, and the pod opener 255, can be moved freely, so this idle time can be utilized to perform notch alignment.

More specifically, during this idle time (such as during film formation), a FOUP 254 carrying wafers 104 that have yet to undergo notch alignment is brought from the storage rack (not shown) to a position of the pod opener 255, and the lid 254a is opened. A plurality of wafers 104 are transferred all at once from the open lid 254a of the FOUP 254 into the substrate alignment apparatus 100 by the tweezers 257 of the wafer transfer unit 256. After notch alignment, the wafers 104 that have undergone notch alignment are loaded by the wafer transfer unit 256 from the substrate alignment apparatus 100 into the FOUP 254 located at the pod opener 255. This procedure is then repeated until notch alignment has been completed for all of the wafers 104 in the FOUP 254, at which point the lid 254a of the FOUP 254 is closed, and the FOUP 254 carrying the notch-aligned wafers 104 is returned to the storage rack (not shown). This operation is performed as much as possible during the idle time of the wafer transfer unit 256. So doing makes it possible for the notch-aligned wafers 104 to be transferred from the FOUP 254 to the boat 263 without going through the substrate alignment apparatus 100.

When the notch alignment of the wafers 104 is performed ahead of time as above, it is preferable for this information to be stored. If this is done, then a decision as to whether the notch alignment of wafers 104 to be transferred has already been performed can be made in the transfer of the wafers 104 on the basis of the above-mentioned information, and if the wafers 104 have already undergone notch alignment, then the wafers 104 can be transferred directly from the FOUP 254 to the boat 263 without first going through the substrate alignment apparatus 100. Also, if the wafers 104 to be transferred have not already undergone notch alignment, the wafers 104 are transferred as mentioned above from the FOUP 254 to the substrate alignment apparatus 104, and then transferred to the boat 263 after notch alignment. Thus, in the transfer of the wafer 104, the appropriate wafer transfer path it automatically selected on the basis of the above-mentioned information, so there is no need for the user to be aware of whether the wafers 104 have already undergone notch alignment, nor is there any need for troublesome operations such as selecting the wafer transfer path to be performed.

By thus utilizing the idle time of the wafer transfer unit 256 to perform the notch alignment of wafers 104 that have not yet been processed, those wafers 104 that have already undergone notch alignment can be transferred directly to the boat without going through the substrate alignment apparatus, allowing the notch alignment step to be skipped and achieving a corresponding increase in throughput.

The substrate alignment apparatus 100 provided to the transfer chamber 252 will now be described in detail.

First Embodiment (FIGS. 1 to 14A, 14B, 14C, 14D and 14E)

This is an example of a substrate alignment apparatus that detects and aligns the notches of five horizontal wafers all at once with a single motor.

Figure 1:
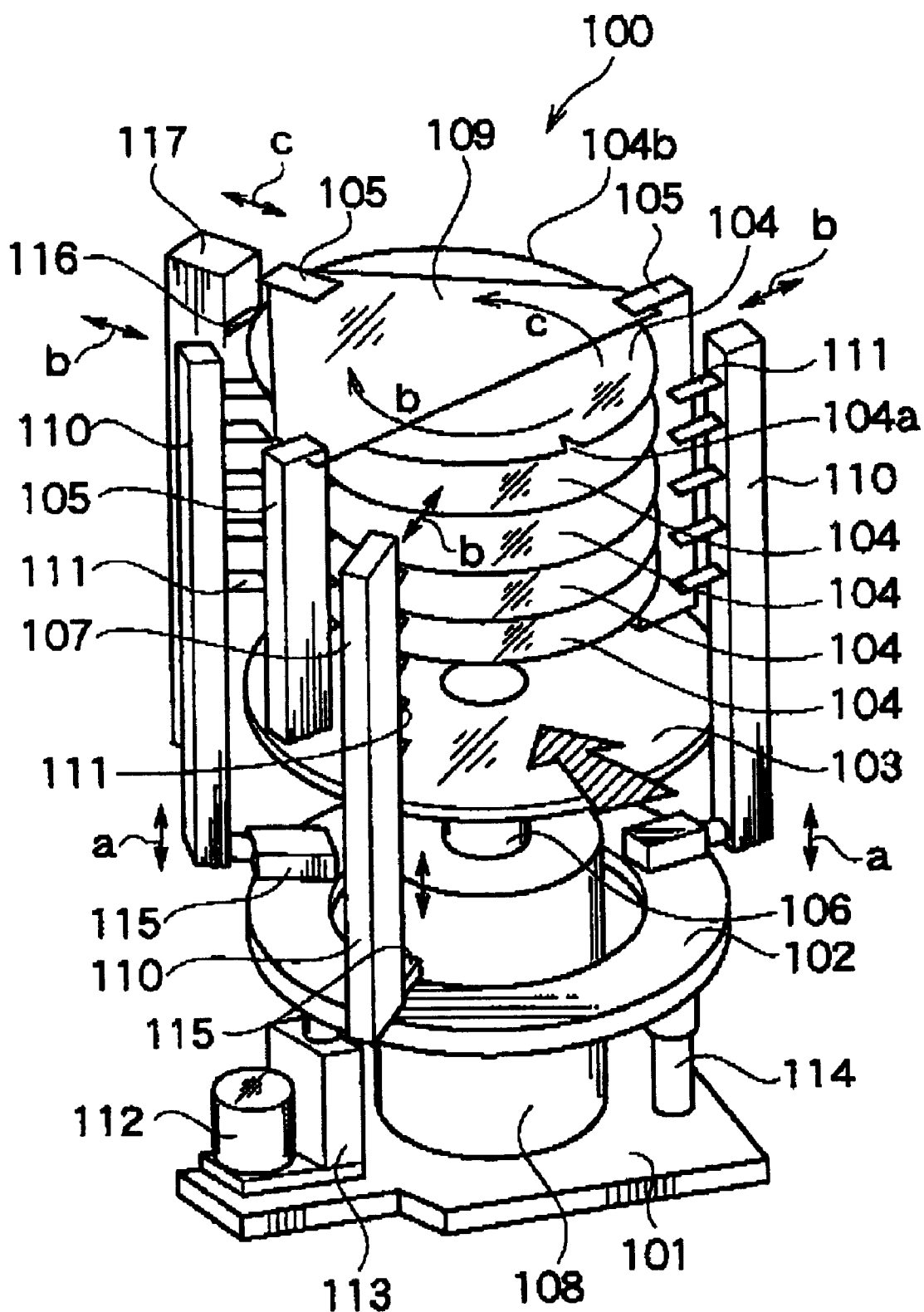
FIG. 1 is an oblique view of the substrate alignment apparatus of the semiconductor manufacturing apparatus pertaining to the first embodiment.
Figure 2:
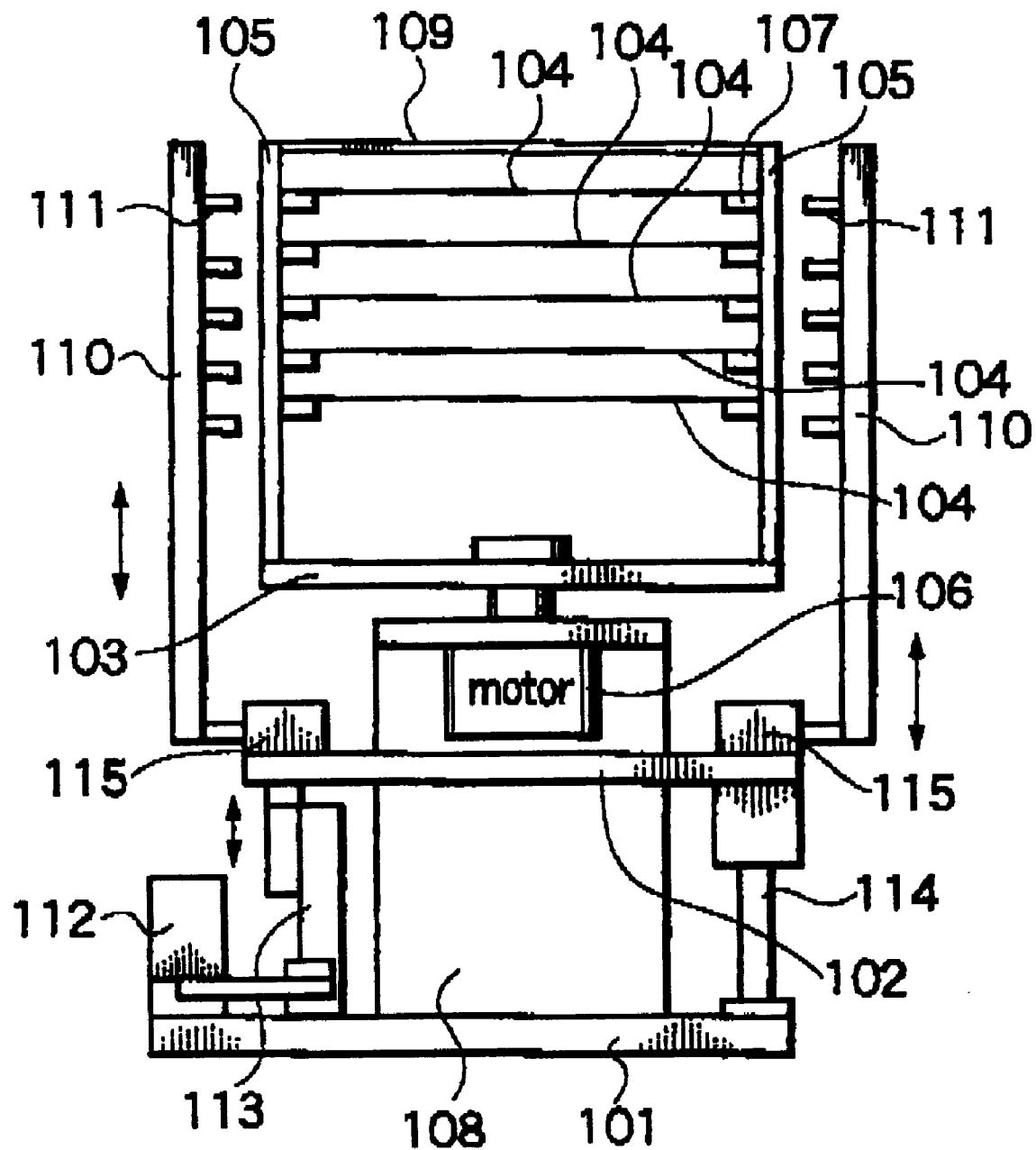
FIG. 2 is a front view of the same in the first embodiment.

FIG. 1 is an oblique view of the substrate alignment apparatus, and FIG. 2 is a front view. The substrate alignment apparatus 100 comprises a pedestal 101, an annular base 102 elevatably provided over the pedestal 101, and a turntable 103 rotatable provided over the pedestal 101 and disposed above the annular base 102.

A plurality (five in the illustrated example) of wafers 104 are supported horizontally and in a vertical stack with a specific spacing between them, with the substrate outer periphery 104b supported from below by a plurality (three in the illustrated example) of support poles 105 erected at specific angles around the outer periphery of the turntable 103.

The three support poles 105 are distributed in an approximate semicircle around the periphery of the turntable 103, which is reversibly rotated by a motor 106 (serves as the rotary drive component), and the direction in which these poles are erected is parallel to the rotational axis of the turntable 103. Support pins 107, which serve as the substrate support components that support the substrate outer periphery 104b of the wafers 104 from below, are provided at a specific pitch in the lengthwise direction to these support poles 105 such that they project like arms in the inward radial direction of the turntable 103. Therefore, the wafers 104 are rotated by the turntable 103 while horizontally supported by the support poles 105. The turntable 103 is attached to the pedestal 101 via a support 108, and the motor 106 that rotates the turntable 103 is provided inside the support 108. A plate 109 that covers the surface of the wafers 104 is provided at the top of the three support poles 105 so that particles will not cling to the surface of the wafers 104.

The substrate support mechanism of the present invention primarily comprises the above-mentioned turntable 103, support poles 105, support pins 107, and motor 106 (just one).

The five wafers 104 are picked up from the substrate support pins 107 by the raising of three elevatably (in the direction of arrow a) provided pick-up poles 110, starting with tire first wafer 104 for which notch alignment is completed. After being picked up, the wafers 104 are returned to the substrate support pins 107 by the lowering of the pick-up poles 110. Here, the base 102 supporting the pick-up poles 110 will not rotate merely by the raising or lowering of the pick-up poles 110, so the angular position of the wafers 104 in the peripheral direction does not move (remains fixed).

Pick-up support pins 111, which serve as the substrate support components and pick-up the wafers 104, project like arms toward the rotational center, supporting the outer periphery 104b of the wafers 104 at a specific pitch in the lengthwise direction. As shown in the figures, these pick-up support pins 111 are provided in a number (such as five) corresponding to the number of wafers 104. The three pick-up poles 110 are laid out in intervals of about 120° around the periphery of the base 102, which is raised and lowered by a slide mechanism 113 and a motor 112 attached to the pedestal 101, with the direction in which the pick-up poles 110 are erected being parallel to the rotational axis of the turntable 103.

This raising and lowering motion is carried out smoothly because of a guide 114 provided between the pedestal 101 and the base 102. The pick-up poles 110 are provided such that they can move forward and backward in the radial direction (the direction of arrow b) in an erect state, moving backward and out of the way so as not to interfere with the support poles 105 when the wafers 104 are rotated, and moving forward during pick-up so that the pick-up support pins 111 reach the substrate outer periphery 104b. Accordingly, the pick-up poles 110 are attached to corresponding air cylinders 115 fixed to the base 102.

The substrate retraction mechanism of the present invention primarily comprises the above-mentioned base 102, pick-up poles 110, pick-up support pins 111, air cylinders 115, and motor 112.

A sensor pole 117 having optical sensors 116 for detecting the notches 104a of the five wafers 104 supported on the substrate support pins 107 is provided to the substrate alignment apparatus 100. The sensor pole 117 is provided such that it can move backward and forward by a specific stroke in the radial direction (the direction of arrow c), just like the pick-up poles 110. When the notches 104a of the wafers 104 are to be detected, the sensor pole 117 moves forward so the optical sensors 116 can draw closer to the substrate outer periphery 104b without touching, and when there is no detection, the sensor pole 117 moves backward so as not to interfere with the support poles 105.

As to the dynamic relationship of the support poles 105, pick-up poles 110, and sensor pole 117 here, the support poles 105 are rotatable (to the extent that there is no interference with the support poles 105 when the pick-up poles 110 move backward), but do not move forward, backward, up, or down, whereas the pick-up poles 110 do not rotate, but do move forward backward, up, and down. Only backward and forward motion is permitted to the sensor pole 117.

As to the mutual positional relationship, the support poles 105 and the pick-up poles 110 are disposed concentrically. The support poles 105 are disposed at intervals of about 90°, 90°, and 180° around the circle on the wafer outer periphery, whereas the pick-up poles 110 are disposed at intervals of about 120° around a circle further to the outside than the support poles 105. The wafers 104 enter and exit through the space between the two support poles 105 that are 180° apart and are closer to the viewer in the figure. The wide black arrow is the direction of forward motion, and the opposite direction is the direction in which the wafers 104 are removed. The sensor pole 117 is disposed on the exact opposite side from the above-mentioned entrance/exit of the wafers 104, with the rotational axis of the turntable 103 in between. The reason the sensor pole 117 is provided on the opposite side is to prevent it from getting in the way of entry and exit. The five wafers 104 are put into and taken out of the substrate alignment apparatus 100 by the wafer transfer unit 256 (FIGS. 30A, 30B and 30C) in a horizontal state.

Figure 3A:
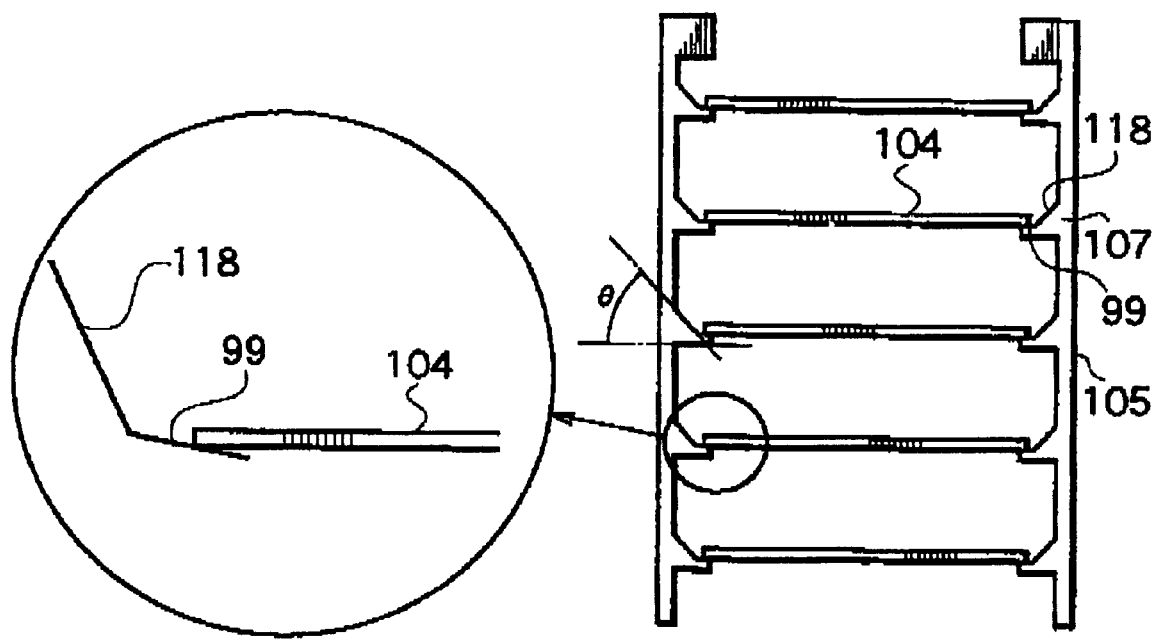
FIGS. 3A and 3b are front views of the main components in the first embodiment, with FIG. 3A illustrating the support poles and FIG. 3B the pick-up poles.

As shown in FIG. 3A, the support components supporting the wafers 104 of the five substrate support pins 107 protruding front the support poles 105 have first tapered portions 118 with a relatively large taper angle. Second tapered portions 99 with a smaller taper angle than the first tapered portions 118 are continuously formed at the lower part of the first tapered portions 118.

The support faces of the first tapered portions 118 have taper surfaces with an angle of θ=60°, which are termed first taper surfaces. The support faces of the second tapered portions 99 have taper surfaces with an angle of θ=6.6°, which are termed second taper surfaces. The first taper surfaces are used to correct the eccentricity of the wafers 104 by means of the latter's own weight. The second taper surfaces support the outer periphery of the wafers 104. The wafers 104 are not it surface contact with the substrate support pins 107, and are instead in linear or point contact, which prevents particles from clinging to the backs of the wafers. The proper angle for the second taper surfaces is 2° to 7°. In other words, the first tapered portions 118 of the substrate support ring 107 are eccentricity correcting tapered surfaces for correcting the eccentricity of the wafers 104, while the second tapered portions 99 are supporting tapered surfaces for supporting the outer periphery of the wafers 104. The taper angles given here are merely examples, and any angle can be used as long as the eccentricity of the substrate can be corrected and its outer periphery supported. A single type of tapered portion may also be used if the eccentricity correction and outer periphery support of the substrate can be accomplished at the same time.

Figure 3B:
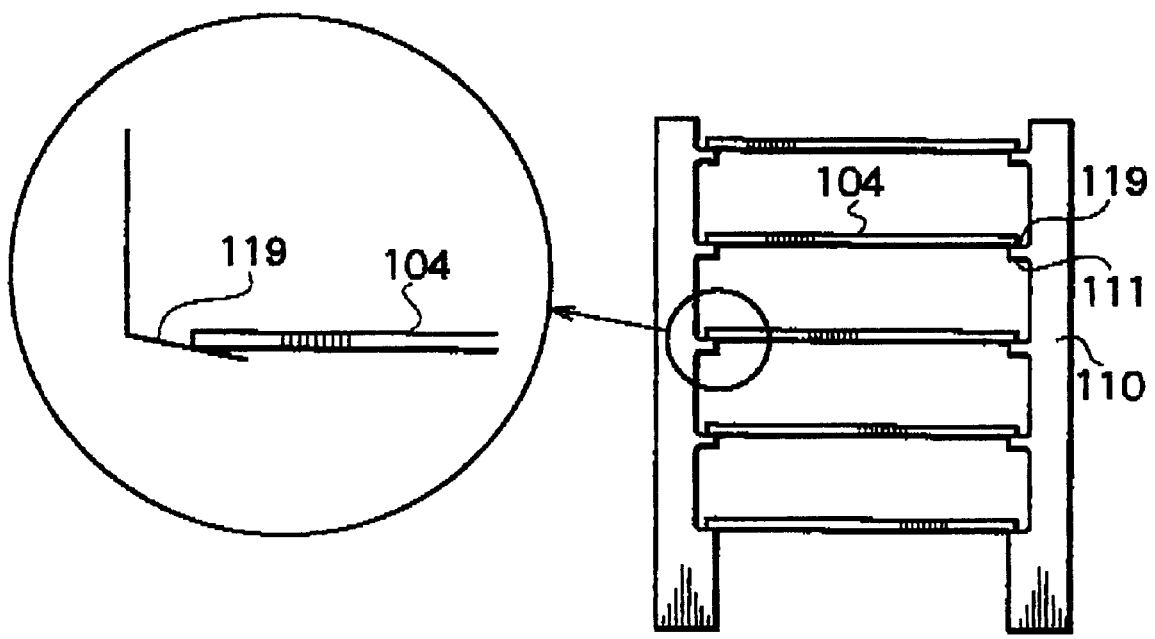

As seen in FIG. 3B, a taper, albeit very slight, is also provided to the wafer bearing edge surfaces 119 supporting the wafers 104 on the pick-up support pins 111 of the pick-up poles 110. This tapering results in point contact, and prevents particles from clinging to the backs of the wafers as they are picked up. Just as with the second tapered portions 99 of the substrate support pins 107 in FIG. 3A, the proper angle of the tapered surfaces is 2° to 7°.

There is no need for eccentricity correction at the pick-up support pins 111 of the pick-up poles 110 because the wafers 104 are placed there after notch alignment (after eccentricity correction), and these pins should be given a slight taper as mentioned above so as to reduce the contact surface area with the wafers in order to prevent particles from clinging to the backs of the wafers.

Figure 4:
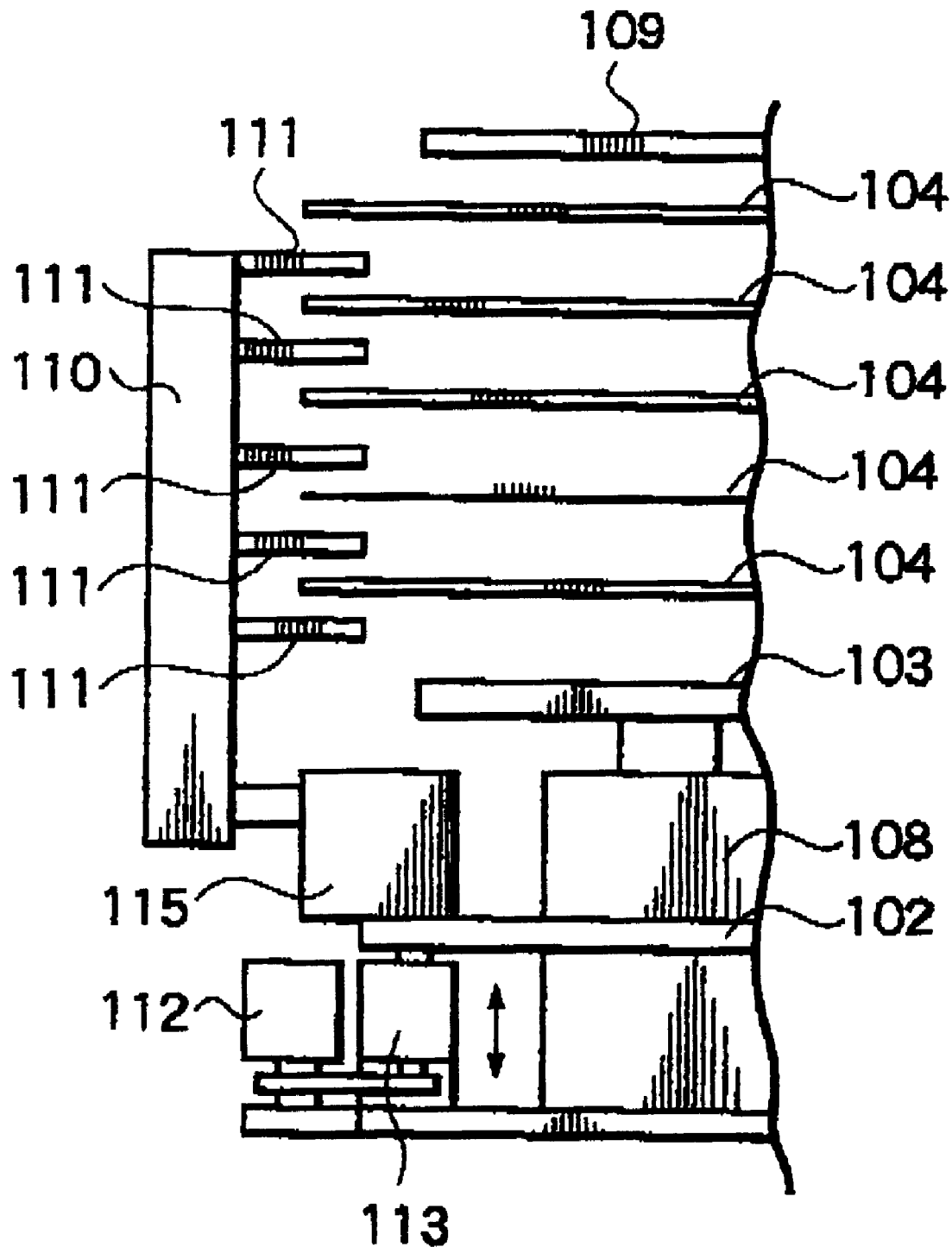
FIG. 4 is a front view of the main components in the first embodiment, and illustrates the relationship between the pick-up poles and the wafers.

FIG. 4 illustrates the relationship between the pick-up poles 110 and the wafers 104. Illustrated is a state in which the air cylinders 115 fixed to the base 102 have been actuated and the pick-up poles 110 moved forward to the wafers 104 side. Because the pick-up poles 110 are raised by the raising of the base 102 via the slide mechanism 113 by the motor 112, the wafers 104 can be picked up vertically by the pick-up support pins 111.

Figure 5A:
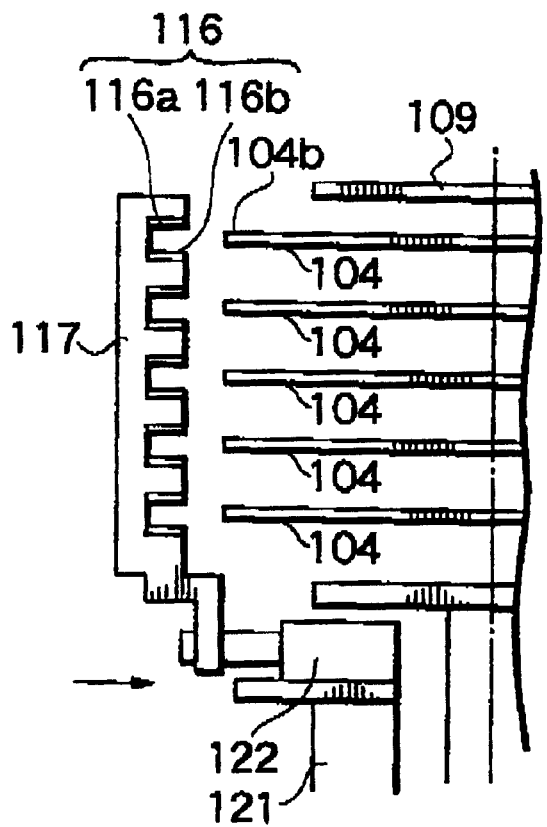
FIGS. 5A and 5B are diagrams of the relationship between the wafers and a sensor pole used for detecting notches in the first embodiment, with FIG. 5A illustrating a retracted state and FIG. 5B a state in which the sensors have been moved toward the wafers.
Figure 5B:
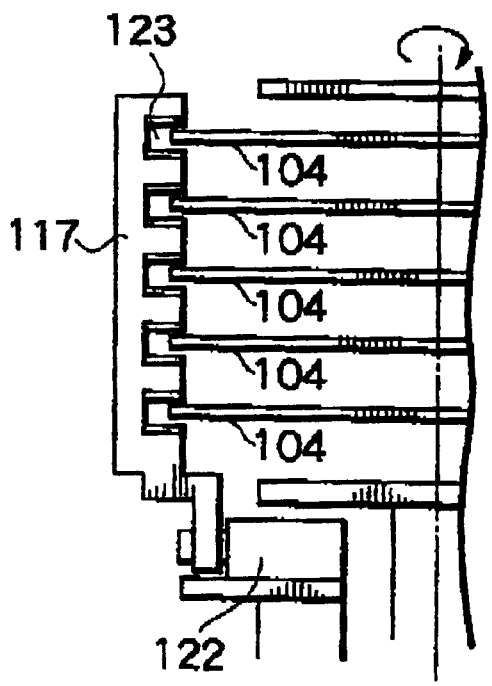

Next, the optical sensors 116 will be described. FIGS. 5A and 5B are diagrams of the relationship between the wafers 104 and the sensor pole 117 to which are attached light emitting elements 116a and light receiving elements 116b of the optical sensors 116. FIG. 5A shows the sensor pole 117 retracted, while FIG. 5B shows the sensor pole 117 advanced in order to detect notch positions.

To detect the notches, an air cylinder 122 attached to a support stand 121 fixed to the pedestal 101 is actuated, which moves the sensor pole 117 from its retracted position (FIG. 5A) in the direction of the arrow, and positions the optical sensors 116 over and under the substrate outer periphery 104b of the wafers 104 (FIG. 5B). If the wafers 104 are rotated by a specific angle in this state, the substrate outer periphery 104b of the wafers 104 will pass through the spaces 123 between the light emitting elements 116a and the light receiving elements 116b, which permits the detection of whether notches are present or not. What angular position the notches are in can be detected using an angle signal from the position detecting encoder of the motor 106. The notch angular positions of the wafers 104 are stored in a memory device (not shown). After detection of the notch angular positions, but before the pick-up operation, the sensor pole 117 is retracted (FIG. 5A). The sensors and wafers will interfere with each other if the wafers are still inserted Into the sensors when they are picked up, and this retraction is intended to avoid this interference.

The principle of notch detection with the optical sensors 116 will now be described through reference to FIGS. 6A and 6B. FIG. 6A is an oblique view, and FIG. 6B is a curve of the change in the amount of light received by the light receiving elements.

The optical sensors 116 consist of the light emitting elements 116a, comprising light emitting diodes or the like located above the substrate outer periphery 104b, and light receiving elements 116b, comprising a CCD camera or the like located below the substrate outer periphery 104b. Light 125 from the light emitting elements 116a is received by the light receiving elements 116b, and a change in the amount of this light is used to search for notches. When the wafers 104 are rotated, the amount of light received at the light receiving elements 116b changes as shown in FIG. 6B. When a notch 104a comes around, the light 125 from the light emitting element 116a which up to that point had been blocked by the substrate outer periphery 104b now passes through the notch 104a, so there is a sudden increase in the amount of light received. The peak indicating this sudden jump in the amount of light received corresponds to a notched portion. Notch alignment can be accomplished, for instance, by rotating the wafers 104, checking the distance from the starting point of the first rotation to the notches 104a and the amount of light received at the light receiving elements 116b, and halting the rotation when the notches arrive at the light receiving elements 116b on the second and subsequent rotations.

Next, the operation of the substrate alignment apparatus structured as above will be described through reference to FIGS. 7A, 7B and FIGS. 8A, 8B, 8C, 8D. FIGS. 7A and 7B consist of plan views illustrating the behavior of the wafers 104 in the detection of the notches 104a, and FIGS. 8A, 8B, 8C and 8D consist of diagrams illustrating how the wafers 104 that have undergone notch alignment (indicated by hatching) are successively picked up when five wafers are subjected to notch alignment all at once.

FIG. 7A shows the wafers being loaded. Five wafers are loaded all at ones into tire substrate alignment apparatus by the wafer transfer unit 256 in the direction of arrow a, and the loaded wafers 104 are supported by the substrate support pins 107 of the support poles 105. The sensor pole 117 is disposed to the rear of the support poles 105. The pick-up poles 110 are retracted away from the wafers 104.

We will assume at this point that the angular position in the peripheral direction of the five notches 104a supported by the substrate support pins 107 is within a range of angle θ flanking an extension line AO of the line connecting the position B of the optical sensors 116 and the rotational center O. A premise with this apparatus is that the notches 104a are within a range of θ=60° (±30°). This is because the wafers 104 handled by this apparatus have already gone through a washing step, and while the notches 104a may shift somewhat during washing, the positions of the notches 104a will never be completely random among the five wafers 104, and this shifting is generally considered to be ±30°, so the movable range of this apparatus was set at 60° (±30°) so as to cover this shifting. The movable range of this apparatus was get to a relatively narrow range here according to the shifting of the notches 104a in the washing step, but how much the apparatus can actually move is the range in which the support poles 105 and the sensor pole 117 will not interfere with each other during notch detection, and the range in which the support poles 105 and the pick-up poles 110 will not interfere with each other during notch alignment, which are determined by the shapes size, width positioning, and so forth of the support poles 105, pick-up poles 110, and sensor pole 117.

When the turntable 103 is rotated by the motor 106 and the support poles 105 are moved from the state of the starting point position in FIG. 7A, the five wafers are rotated 180° counterclockwise as indicated by the arrow, resulting in the state shown in FIG. 7B, which is the notch detection commencement position. The rotation may be in either direction, so the wafers may be rotated clockwise instead, in short, it should be possible for the optical sensors 116 to detect the notches. As a result, the support poles 105 arrive at the position shown in FIG. 7B, and the notches 104a approach the optical sensors 116. Because the pick-up poles 110 are fixed in their motion in the peripheral direction, there is no change in the angular position. Nor is their any change in the angular position of the optical sensors 116 in the peripheral direction. When the optical sensors 116 are moved toward the wafers 104 in this state, the optical sensors 116 go from the dotted line position to the solid line position. At this point the motor 106 is rotated, the angular positions of the notches 104a of the wafers 104 are checked all at once, and the resulting information about angular position is stored in a memory device. The angular position can be detected using an angle signal from the position detecting encoder of the motor 106.

The operation of successively aligning the notches 104a of the wafers 104 with the line OB on the basis of the above-mentioned angular position data Will now be described. The discussion here will be focus on aligning the notches 104a with the line OB, but the notches 104a can instead be aligned with any other position desired.

If the notch 104a of the first wafer 104 is to the left of the optical sensor 116, as seen in FIG. 79, then the wafers 104 are rotated clockwise on the basis of this angular position data to align the notch 114a at the position of the line OB, and the rotation of the motor 106 is then halted. This completes the first notch alignment. FIG. 8A illustrates a state in which the notch in the lowest wafer 104 (indicating by hatching) of the five wafers 104 has been aligned with the line OB, after which the pick-up poles 110 are moved in the inward radial direction of the wafers, and the pick-up support pins 111 are slid under the outer periphery 104b of the wafers 104, As shown in FIG. 8B, the pick-up support pins 111 are raised by the slide mechanism 113 so that the first wafer 104 that has undergone notch alignment is picked up and moved away from the substrate support pins 107 of the support poles 105.

Next, in a state in which the first wafer 104 from the bottom has been picked up, the support poles 105 are rotated and the notch 104a of the second wafer 104 from the bottom is aligned with the line OB on the basis of the detected angular position data. Once the second notch alignment is complete, the second wafer 104 is picked up by the pick-up support pins 111 as shown in FIG. 5C. Similarly, notch alignment and the picking up of the wafers is repeated in order for the third, fourth, and fifth wafers. FIG. 8D shows a state in which the last wafer 104 has been picked Up by the pick-up support pins 111 of the pick-up poles 110. In this manner all of the wafers 104 are transferred from the substrate support pins 107 to the pick-up support pins 111. At the point when the above operation is complete, the notches 104a of all the wafers 104 are on the line OB.

When the first wafer is to be aligned, the pick-up poles 110 are retracted so the support poles 105 are able to rotate freely without inferring with the pick-up poles 110. However, after the pick-up poles 110 are set in the position where the wafers can be picked up, the wafers 104 are limited to a rotational range (θ) such that there is no interference between the support poles 105 and the pick-up poles 110 in order that the picked-up state will be maintained and the notch alignment of the next wafer 104 can be performed. This range, however, must be at least large enough to cover ±30°, since that is how mach the notches may shift in the washing process. As to the timing at which the pick-up poles 110 are set in the position where the wafers can be picked up, it may be after the notch position has been detected but before the notch alignment is performed for the first wafer.

As discussed above, to pick up the wafers 104 one at a time after they have undergone notch alignment, the pitch $P_1$ of the pick-up support pins 111 of the pick-up poles 110 and the pitch $P_2$ of the substrate support pins 107 of the support poles 105 must at least be in the following relationships in FIGS. 8A, 8B, 8C and 8D.

$$P_1 < P_2 \quad (1)$$

$$4P_1 > 3P_2 \quad (2)$$

Formula 2 here holds true when the notch alignment is performed for five wafers when the notch alignment is performed for n number of wafers, Formula 2 is as follows.

$$(n-1)P_1 > (n-2)P_2 \quad (3)$$

Actually, when $P_1$ and $P_2$ are determined, wafer bending and the spacing between the wafers 104 and the substrate support pins 107 and pick-up support pins 111 must also be taken into account. For instance, if the wafer bending is 0.3, then when the spacing ΔL between the substrate support pins 107 and substrate support pins 107 at the lowest level shown in FIG. 8A is equal to 2 mm, $P_1$=19 mm, $P_2$=23 mm, and the pick-up pitch=4 mm. This will be described in detail in the examples given below.

Upon completion of the above series of operations, the three support poles 105 are away from the position shown in FIG. 7B because of the repeated notch alignment operations. Thus, the turntable 103 is rotated here to return the support poles 105 to the positions they have in FIG. 7B. Nest, the pick-up poles 110 are lowered, and all five of the wafers 104 are returned to the substrate support pins 107 of the support poles 105 from the pick-up support pins 111. After this return, the pick-up poles 110 are retracted to the outside of the wafers 104. If the support poles 105 are rotated 180° in this state, they return to their original starting point position shown in FIG. 7A. At this point the five wafers 104 are removed all at once from the substrate alignment apparatus 100 by the wafer transfer unit 256.

in the above description, we assumed a state in which the angular position of the notches 104a of the five wafers supported by the substrate support pins 107 was lifted to a range of the angle θ=60° flanking the extension line AO of the line connecting the position B of the optical sensors 116 and the rotational center O. However, it is also conceivable that the notches 104a will not be within the specified angle θ range, so this method must be universal enough that notch detection is possible even when the notches 104a are outside the specified angle θ range, Furthermore, interference between the support poles 105 and the pick-up poles 110 occurs when the wafers 104 supported on the support poles 105 are rotated in a state in which any wafer 104 has been picked up by the pick-up poles 110, so limitations imposed by this interference must also be considered.

Figure 10A:
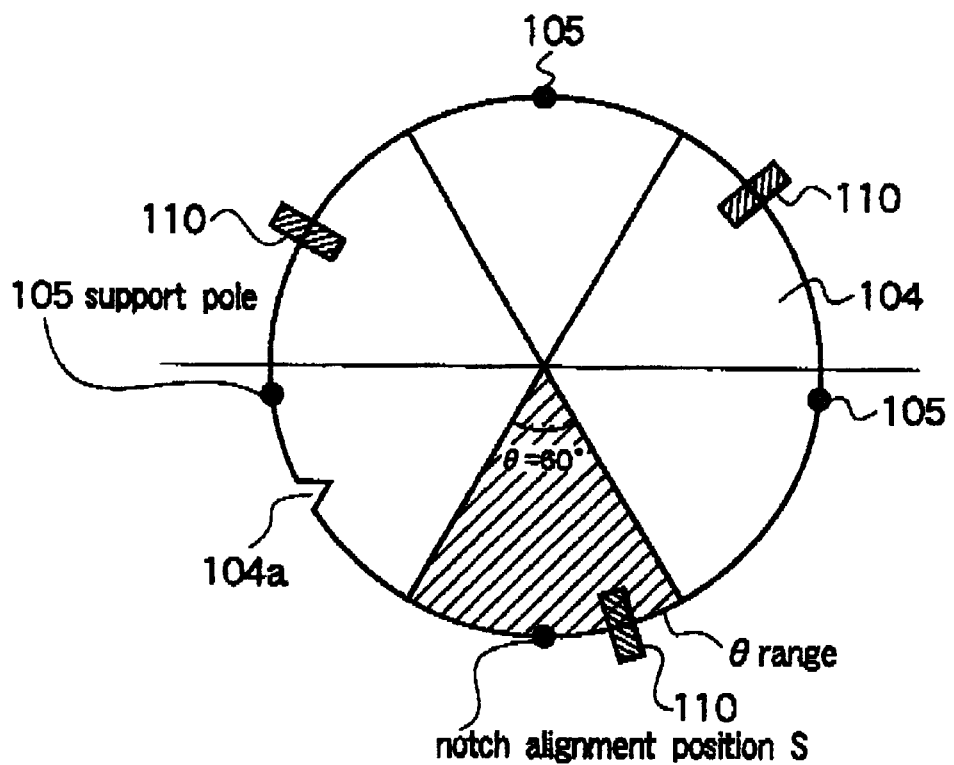
FIG. 10A is diagram of the interference between the support poles and the pick-up poles.

This problem of interference between the support poles 105 and the pick-up poles 110 will be described through reference to FIG. 10A. When the wafers 104 are finally placed on the pick-up poles 110a, we want the notch positions of the various wafers 104 to arrive at the notch alignment position (optical sensor position) S. If the notch positions of the wafers 104 on the support poles 105 at this point are not within the range of θ=60° as shown in FIG. 10A, the notches 104a cannot be moved to the notch alignment position S. This is because, there is a limited range of motion in the wafer peripheral direction in the notch alignment operation with this apparatus. In this notch alignment operation, tile pick-up poles 110 must be moved from the retracted position shown in FIG. 7B in the inward radial direction of the wafers, and set in a position that allows pick-up, as shown in FIG. 10A. Accordingly, the range over which the support poles 105 can move in the wafer peripheral direction is limited to the range in which there is no interference between the support poles 105 and the pick-up poles 110. In this apparatus, plenty of room is left between the support poles 105 and the pick-up poles 110, and the movable range is determined so as to cover at least the notch shifting (±30°) that occurs in the washing process.

Figure 10B:
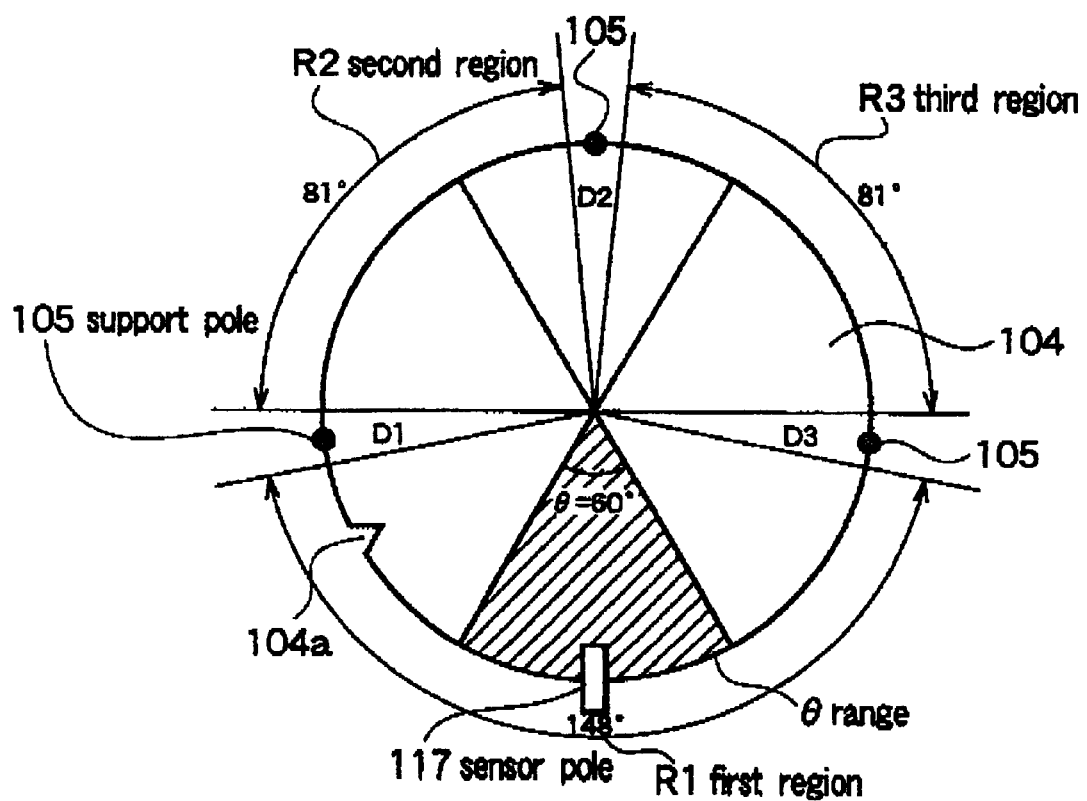
FIG. 10B is a diagram of the notch search regions of the wafer.

An apparatus that solves the above problem and which is able to accommodate notches 104a outside the specified angle θ range will now be described. First, the region of this apparatus in which a search for notches can be performed, and the region in which this search cannot be performed will be described through reference to FIG. 10B. The wafers 104 are supported by three support poles 105 disposed at approximate intervals of 180°, 90°, and 90°. When a search is conducted for the notches 104a of the wafers 104, the sensor pole 117 must be moved from its retracted position in the inward radial direction of the wafers and set in a position that allows a search for notches, as shown in FIG. 10B. Therefore, on the wafers 104 are formed three searchable regions R1 to R3, which are bounded by the support poles 105 and in which a search for the notch position can be performed within a range such that there is no interference between the sensor pole 117 and the support poles 105, and three unsearchable regions D1 to D3, which are near the support poles 105 and in which a search for the notch position cannot be conducted because the range of motion is limited so that there will be no interference between the sensor pole 117 and the support poles 105. The ranges of the notch position searchable regions R1 to R3 are 148°, 81°, and 81°, respectively. The ranges of the notch position searchable regions given here are just examples, and can be further widened by modifying, for example, the width and shape of the support poles 105 and the sensor pole 117, or the clearance between these poles in order to avoid interference between the poles.

The notch alignment method will now be briefly described. First, a search for a notch 104a is conducted in the 148°, 81°, and 81° searchable regions R1 to R3 of the wafers 104. If no notch is found, it means the notches 104a are somewhere in the unsearchable regions D1 to D3. In this case, all the wafers are temporarily picked up by the pick-up poles 110, just the support poles 105 are rotated by a specific angle, and the wafers 104 are returned onto the support poles 105. This operation allows the notch positions to be shifted with respect tot he support poles 105, moving the notches 104a from the unsearchable regions into one of the searchable regions R1 to R3. After this, the searchable regions R1 to R3 are searched again. After the notches have been detected for all the wafers 104, the next step is to align the notches 104a at the specified location. First, a decision is made as to whether the notch positions are within the θ range. This decision is made according to the angular position data for the notches 104a that has been detected and stored. If the notch positions are within the θ range, the wafers 104 are rotated so that the notches 104a come to the notch alignment position S, and placed on the substrate support pins 107. If the notches 104a are outside the θ range, then they cannot be moved to the notch alignment position S by a single rotation due to limitations of the movable range, so the notch positions are shifted a little at a time. Specifically, to shift the notch positions, the wafers 104 are temporarily picked up, the support poles 105 are rotated by the specified angle in the direction opposite to the direction in which the notch positions are moved, the wafers 104 are returned to the support poles 105, and the support poles 105 are rotated by the specified angle so that the notch positions will approach the notch alignment position S. This procedure is repeated until the notch positions enter the θ range, at which point the notches 104*a* can be aligned to the notch alignment position S. Here, the notches 104*a* are moved in the direction of the shortest path. Specifically, in FIG. 10(*a*), the notches 104*a* are moved clockwise if they are on the right side, and are moved counterclockwise if on the left side. In this figure, the notches 104*a* are on the left side, so they are moved counterclockwise. The above-mentioned shortest path is selected according to the stored angular position data.

Figure 9:
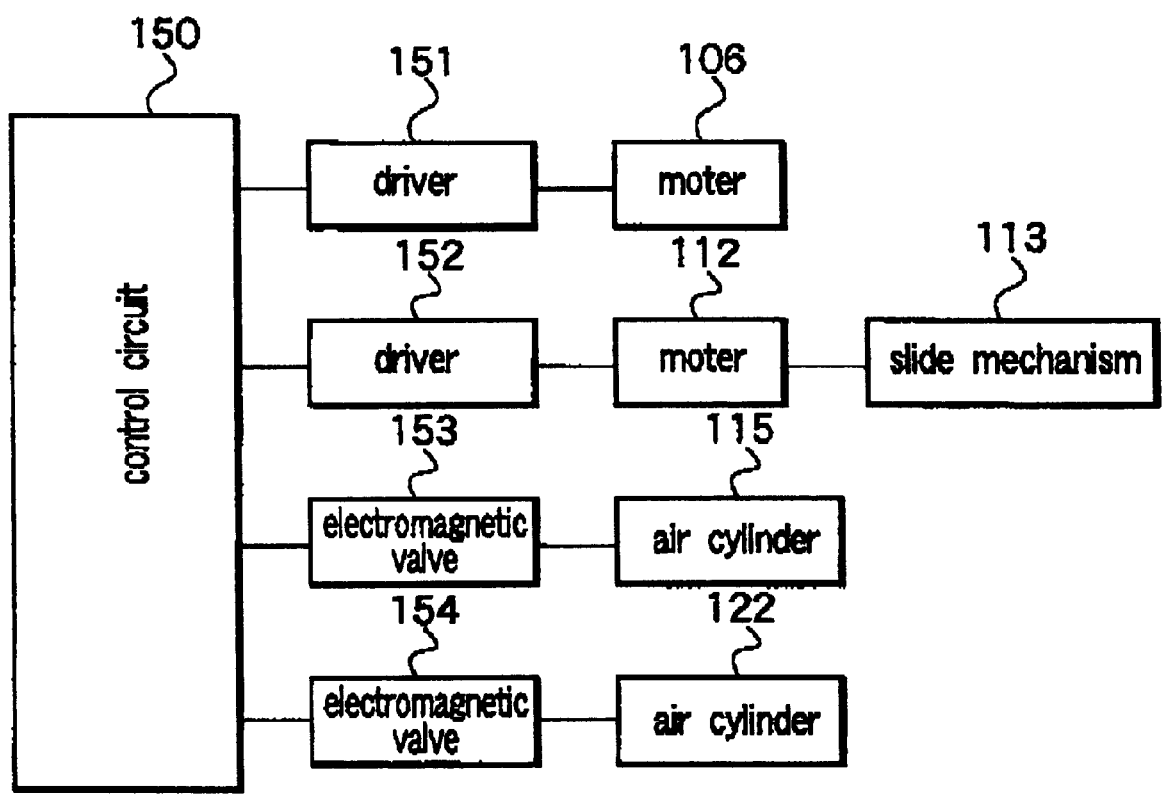
FIG. 9 is a block diagram of the control component that controls the mechanisms in the first embodiment.

FIG. 9 is a block diagram of the control component that controls the mechanisms for performing the above-mentioned notch alignment. The control component comprises a control circuit 150, drivers 151 and 152, and electromagnetic valves 153 and 154, and has the following functions.

The rotation of the motor 106 of the substrate support mechanism is controlled in order to rotate a plurality of substrates all at once and detect the notches of the various substrates.

(a) the rotation of the motor 106 of the substrate support mechanism is controlled in order to perform wafer alignment (notch alignment) one wafer at a time on the basis of the notch detection values for the various wafers, (b) an individual alignment completion signal is outputted when the alignment of a single wafer 104 Is complete, (c) the motor 112, slide mechanism 113, and air cylinders 115 of the substrate retraction mechanism are controlled in order to successively retract the wafers 104 that have undergone alignment from the substrate support mechanism one at a time on the basis of the individual alignment completion signals, (d) the control of (a) to (c) is performed for the remaining wafers 104 after the retraction of the wafers 104 that have undergone alignment, (e) an overall position completion signal is outputted when aliment is completed for all the wafers, (f) the rotation of the motor 106 of the obstructed support mechanism is control so that the substrate support mechanism will be returned to its initial state prior to the notch detection, while all the aligned substrates are still retracted by the substrate retraction mechanism, and (g) the motor 112, slide mechanism 113, and air cylinders 115 of the substrate retraction mechanism are controlled in order to return to the substrate support mechanism all of the plurality of aligned wafers that had been retracted.

Figure 11:
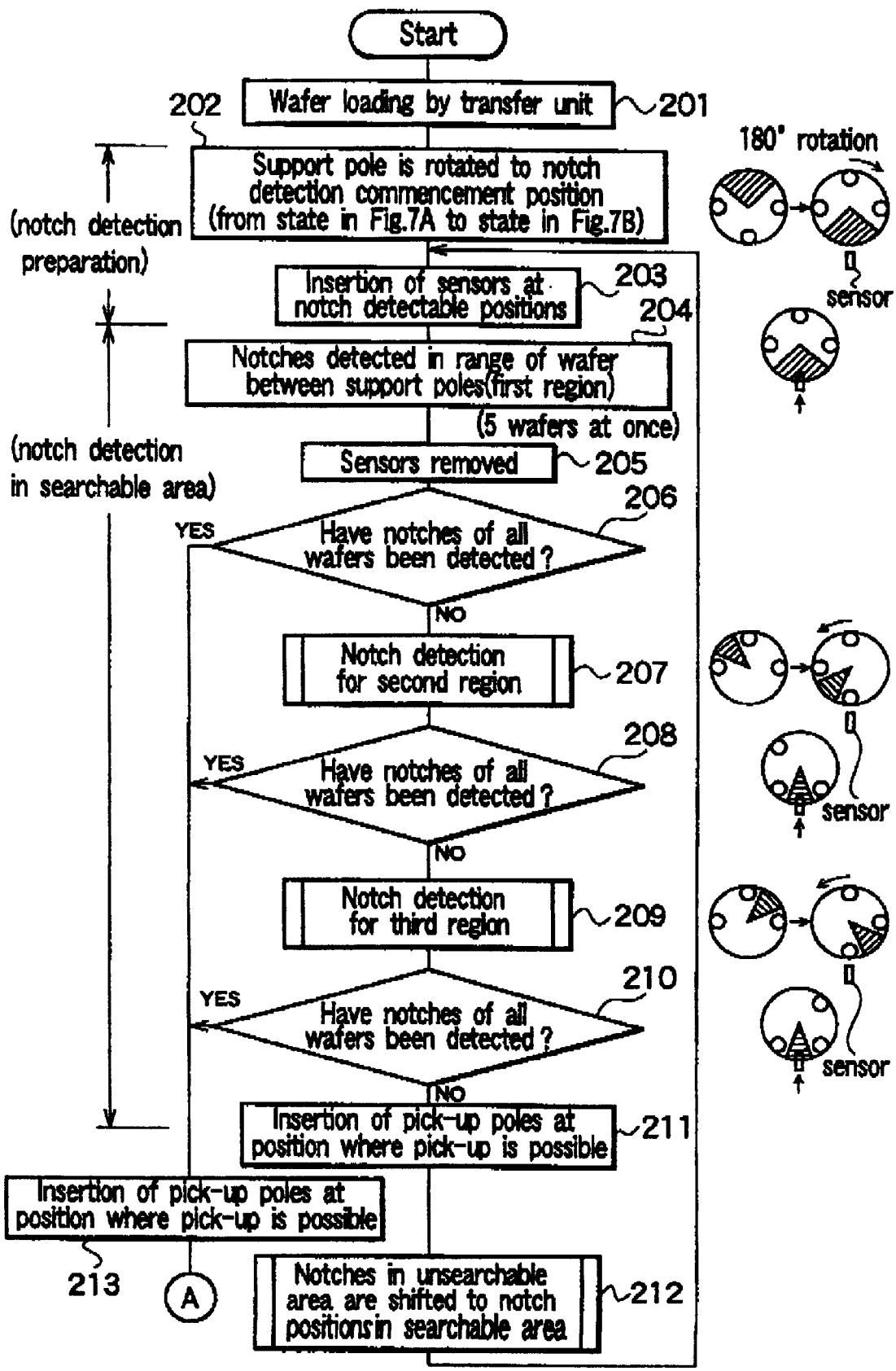
FIG. 11 is a flow chart illustrating the operation of the first embodiment when the notch is within the specified angle θ range.
Figure 12:
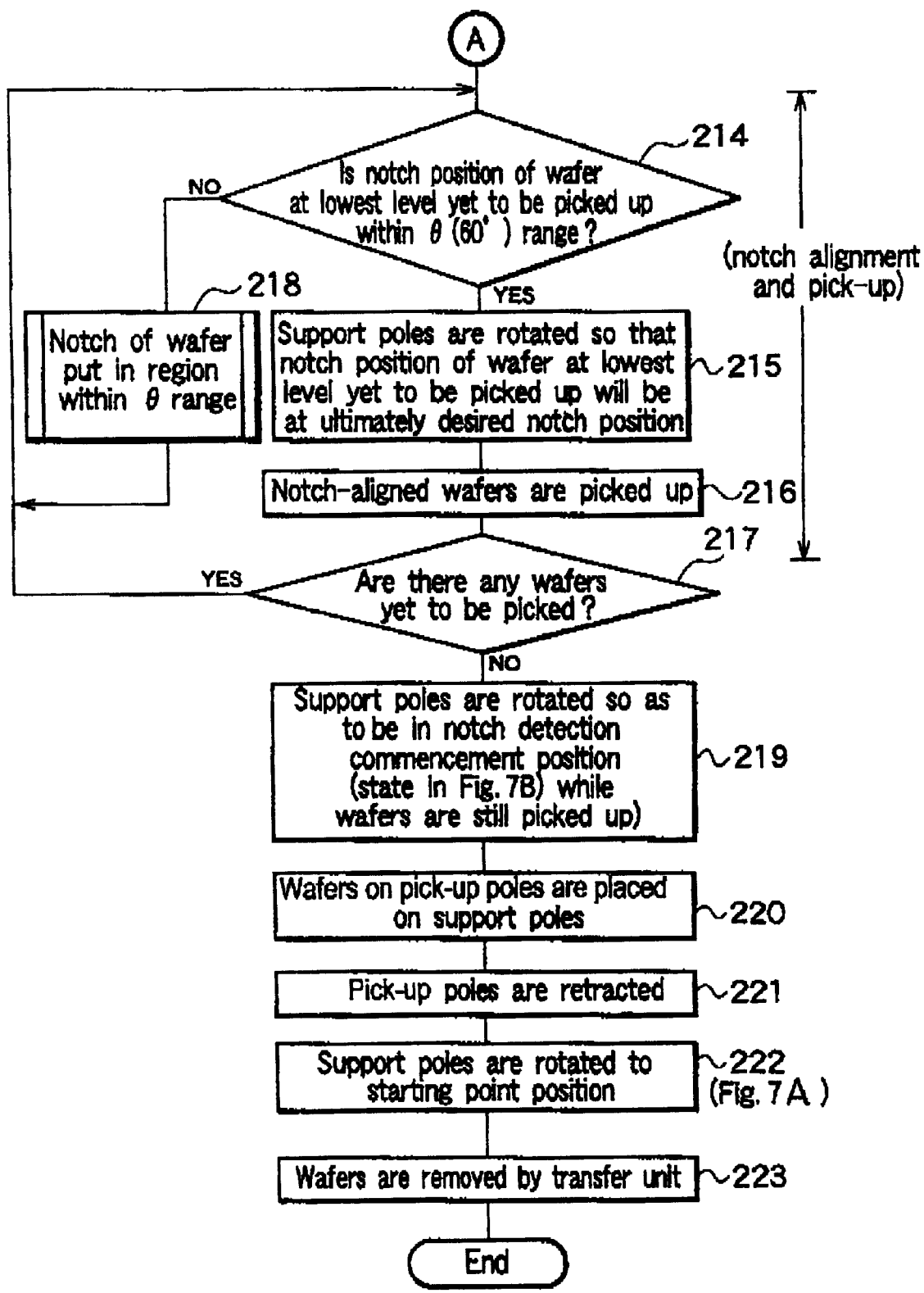
FIG. 12 is a flow chart illustrating the operation of the first embodiment when the notch is not within the specified angle θ range.

FIGS. 11 to 13 illustrate the details of the flow in the above series of operations related to the above-mentioned control component.

Five wafers 104 are put all at once into the substrate alignment apparatus 100 by the wafer transfer unit 286 and transferred onto the three support poles 105 (step 201). After this transfer, the support poles 105 are rotated 180° up to the notch detection commencement point for notch detection, changing the state in FIG. 7A to the state in FIG. 7B (step 202). The sensor pole 117 is moved forward until the optical sensors 116 reach the positions where notches can be detected (step 203). Everything up to this point is notch detection preparation.

The next step is performing notch detection for the searchable regions. Specifically, the notches 104*a* are searched for all at once for the five wafers 104 with respect to the range with an angle of 148° (first region R1) between the support poles 105 (step 204). After notch detection, the sensor pole 117 is retracted and the sensors 116 moved away (step 205). The reason for this is to avoid interference with the support poles 105 during the transition to searching other regions, and to avoid interference with the wafers 104 when they are picked up.

At this point a decision is made as to whether the notches 104*a* of all the wafers 104 have been detected (step 206). If they have, the flow moves on to step 213, and the substrate support pins 107 are inserted at the positions where pick-up is possible. If they have not all been detected, the flow moves to step 207, and notch detection is performed for the next region of the wafer with an 81° angle (the second region R2). A decision is made as to whether the notches 104*a* of all the wafers 104 have been detected (step 208). If they have, the flow moves on to the above-mentioned step 213. If they have not, the flow moves to step 209, and notch detection is performed for the remaining region of the wafer 104 with an angle of 81° (the third region R3).

A decision is made as to whether the notches of all the wafers have been detected (step 210). It they have, the flow moves on to the above-mentioned step 213. If they have not, it is assumed that the notches 104*a* are in one of the above-mentioned three unsearchable regions D1 to D3, the flow moves to step 211, and the pick-up poles 110 are inserted at the positions where pick-up is possible. The notch positions are shifted with respect to the support poles so that the notches 104*a* that were in the unsearchable regions D1 to D3 will enter the searchable regions R1 to R3 (step 212). After the notches 104*a* that were in the unsearchable regions are thus moved into the searchable regions, the flow returns to step 203, and the above-mentioned series of notch detection operations (steps 203 to 210) are once again carried out for the searchable regions. The above procedure allows the notches 104*a* of all the wafers 104 to be detected.

Once the notch positions for all the wafers 104 have been detected, the pick-up poles 110 are inserted into the positions where pick-up is possible as mentioned above (step 213), and after this step 213 is complete, the flow moves on to step 214 in order to carry out notch alignment and pick-up. At this point, a decision is made as to whether the notch position of the lowermost wafer 104 which has yet to be picked up is within the θ (60°) range (step 214). This decision is made using the stored notch angular position data. If the position is within the θ range, then the relative position of the notch 104*a* with respect to the support poles is shifted the required amount so that the notch 104*a* will enter a region within the θ range (step 218), and the flow returns to the above-mentioned step 214.

If the position is within the θ range, the support poles 105 are rotated such that the notch position of the lowermost wafer 104 which has yet to be picked up is at the notch position S that is ultimately desired (step 215). The wafer 104 that has undergone notch alignment is then picked up (step 216). Next, a decision is made as to whether there are any wafers 104 that have yet to be picked up (step 217). If there are, the flow returns to the above-mentioned stop 214, and steps 214 to 217 are repeated until all of the wafers have been picked up.

Once all of the wafers have been picked up, the flow moves on to step 219, at which point the support poles 105 are rotated such that they are in the notch detection commencement position (the state in FIG. 7B) while the wafers 104 are still picked up by the pick-up poles 110. After this, the wafers 104 on the pick-up poles 110 are placed on the support poles 105 (step 220), and the pick-up poles 110 a retracted (step 221). The support poles 105 are then rotated to their starting point positions and returned to the positions shown in FIG. 7A (step 222). Finally, the wafers are removed by the wafer transfer unit 256 (stop 223).

The individual processing steps 207, 209, 212, and 218 mentioned above will now be described in detail through reference to FIGS. 13A, 13B, 13C and 13D.

(a) Step 207 (notch detection in second region)

First the individual processing step 207 will be described in detail through reference to FIG. 13A. The support poles 105 are rotated the required amount so that the second region of the wafers 104 becomes searchable (step 2071). The optical sensors 116 are inserted (step 2072), and a search is made for notches 104a only for undetected wafers with respect to the 81° range of the wafers 104 between the support poles 105 (step 2073). After this search, the optical sensors 116 are retracted (step 2074).

(b) Step 209 (notch detection in third region)

Next the individual processing step 209 will be described in detail through reference to FIG. 13B. The support poles 105 are rotated the required amount so that the remaining third region of the wafers 104 becomes searchable (step 2091). The optical sensors 116 are inserted (step 2092), and a search is made for notches 104a only for undetected wafers with respect to the 81° range of the wafers 104 between the support poles 105 (step 2093). After this search, the optical sensors 116 are retracted (step 2094).

(c) Step 212 (shifting the positions of notches in the unsearchable regions so that they enter the searchable regions)

Next the individual processing step 212 will be described in detail through reference to FIG. 13C. The wafers 104 on the support poles 105 are picked up by the pick-up poles 110 (step 2121). After this, the support poles 105 are rotated the required amount so that the notches 104a move from the unsearchable regions to the searchable regions (148°, 81°, and 81°). Here, for those wafers whose notches have been detected, the data is corrected such that the amount of rotation hare will be reflected in the detected notch position date. In specific terms, the amount of rotation is added to the detected notch position data (step 2122). The above-mentioned specific amount that the support poles 105 are rotated is at least (360°−(148°+81°+81°))/3=16.7°. After this specific amount of rotation, the pick-up poles 110 are lowered and the wafers 104 returned onto the support poles 105, and the pick-up poles 110 are retracted (step 2123).

(d) Step 218 (putting the notches of the wafers in a region within the θ range)

At the end the individual processing step 218 will be described in detail through reference to FIG. 13D. The lowermost wafer 104 on the support poles 105 which has yet to be picked up is picked up by the pick-up poles 110 and retracted (step 2181). The support poles 105 are rotated the required amount in the direction opposite to the direction in which the notches 104a are moved (step 2182), the pick-up poles 110 are lowered, and the wafers picked up in the previous step are returned onto the support poles (step 2183). After this, the support poles 105 are rotated so that the notches 104a will go from the notch positions to the notch alignment position in the direction of the shortest path (clockwise or counter-clockwise) (step 2184). As mentioned above, the shortest path is determined by the stored angular position data for the notches 104a. Specifically, in FIG. 10A, the notches 104a are rotated counterclockwise if they are on the left side, and clockwise if on the right side. After this, the flow returns to step 214, and a decision is made as to whether the notch position is within the θ range. If not, steps 2181 to 2184 are carried out again, and these steps are repeated until the notch position is within the θ range.

FIGS. 14A, 14B, 14C and 14D illustrate how the wafers 104 that have undergone notch position detection in steps 214 to 218 are rotated the required amount and the notch positions 104a are aligned on the line OB (see FIGS. 7A and 7B). The dotted lines in the figures express the rotational transition of the support poles 105, while the one-dot chain lines are lines passing through he wafer center and the notch 104a, and express the rotational transition of the wafers 104. The reason these dotted lines and one-dot chain lines have been drawn on the wafers 104 is to facilitate an understanding of the rotational transition of the wafers with respect to the support poles. When this operation it actually carried out, the pick-up poles 110 are inserted in the inward radial direction of the wafers, but to make the operation easier to understand, the figures are drawn with the pick-up poles 110 in a retracted state.

After notch position detection of all the wafers 104, a decision is made as to whether the notch position of the wafer 104 about to undergo notch alignment (the lowermost wafer 104 which has yet to be picked up) is within the θ range, using the stored angular position data. If the notch position is outside the θ range, a decision is made as to whether it is on the left or right side of the line AB (see FIG. 7A and 7B), again using the stored angular position 25 data. If it is on the tight side, the wafer 104 is rotated the required amount counterclockwise, or clockwise if on the left side, and the shortest path is taken in moving the notch 104a onto the line OB.

Figure 14A:
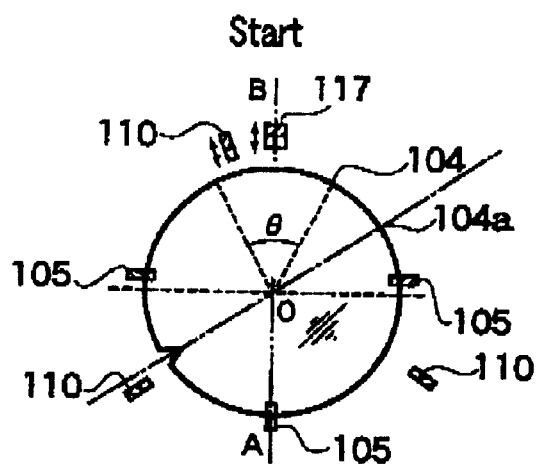
FIG. 14 is a diagram of how the notch positions are gradually shifted in the operation of the first embodiment when the notch is not within the specified angle θ range.
Figure 14B:
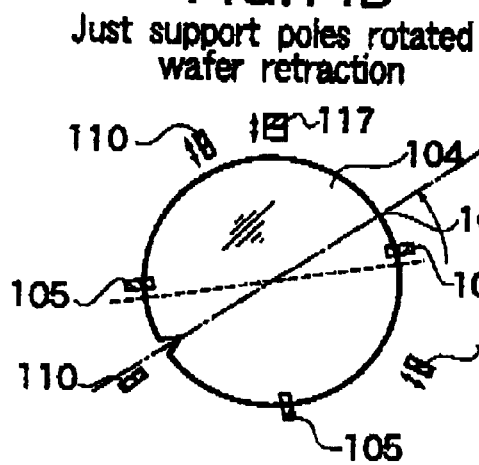
Figure 14C:
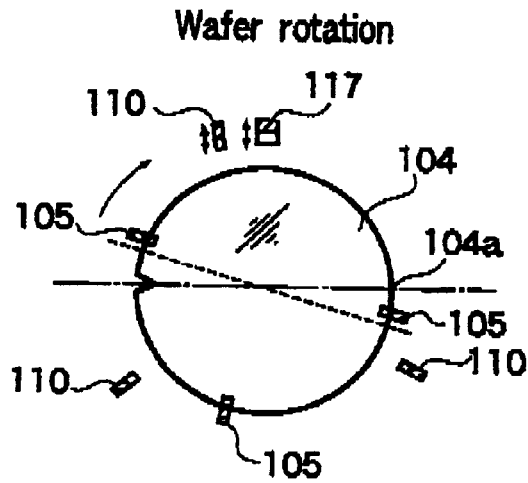
Figure 14D:
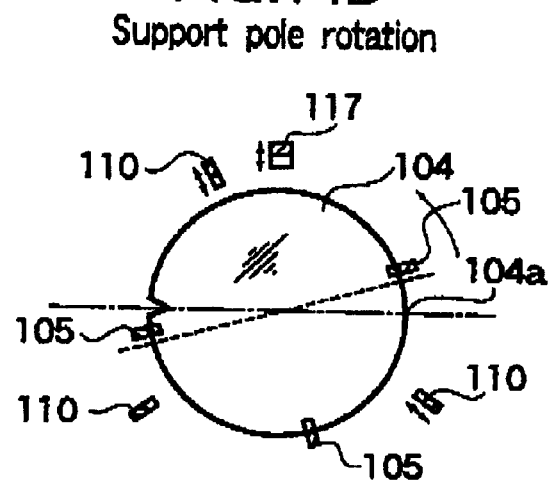
Figure 14E:
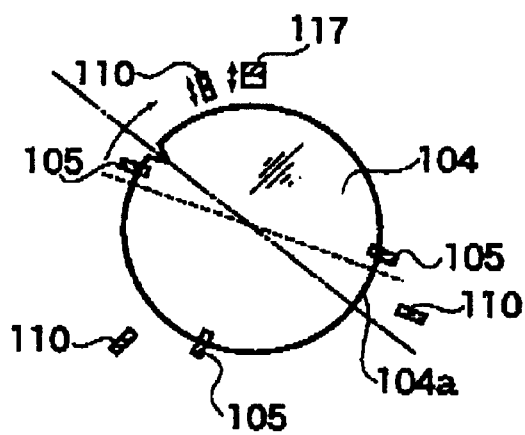

In the initial state (after notch detection and before notch alignment), we will assume that the notch position of the wafer 104 is at the lower left (FIG. 14A). In this case, since the notch 104a is not within the θ range and is to the left of the line AB, the wafer 104 is rotated clockwise by the required amount so that the notch 104a will be moved by the shortest path onto the line OB. The water 104 is temporarily picked up, and just the support poles 105 are rotated the required amount counterclockwise, which is the direction opposite to the direction in which the notch 104a is moved. Therefore, the notch position of the wafer 104 does not move with this operation (FIG. 14B). The wafers 104 are returned to the support poles 105, and the support poles 105 (that is, the wafers 104) are rotated clockwise by the required amount. This moves the notch position clockwise by the required amount (FIG. 14C). The wafers 104 are once again picked up and the support poles 105 rotated by the required amount counter-clockwise, which is the direction opposite to the direction in which the notch 104a is moved (FIG. 14D). The wafers 104 are returned to the support poles 105 and rotated clockwise. This moves the notch position further around to the right (FIG. 14E). Thus, the notch position is shifted to within the θ range and finally aligned on the line OB.

In the description up to this point, the wafers 104 were first temporarily picked up and just the support poles 105 were rotated by the required amount in the direction opposite to the direction in which the notches were shifted, but the support poles 105 may also be rotated in the direction in which the notch positions will reach the line OB by the shortest path, with the wafers 104 resting on the support poles 105 prior to the above operation.

In the first embodiment, the turntables used for wafer placement and required for each wafer are eliminated, and in their place the support poles 105 are provided for supporting the wafers, and pick-up poles are provided so that notch-aligned wafers can be retracted, so notch alignment can be performed for a plurality of wafers all at once. Also, If the substrate outer periphery 104b it supported with the tapered portions 99 during notch alignment, the support will be in a state of linear or point contact, so the contact surface area will be small, fewer particles will be generated than when the backs of the wafers are vacuum chucked, and furthermore, since it is the substrate outer periphery 104b that is being supported, there will be a marked reduction in the clinging of particles to the backs of the wafers.

Even with the substrate alignment apparatus of the above first embodiment, however, the operation is still fairly complicated and alignment is not very fast. Another problem is that the apparatus height is increased by disposing the motor 106 and other such drive components under the wafers 104. In view of this, the second embodiment described below solves these problems by introducing an individual turntable system.

Second Embodiment (FIGS. 15 to 18)

This is a substrate alignment apparatus having five motors Corresponding to the number of wafers, and is capable of detecting the notches of all five wafers with almost no contact with the wafers.

Figure 15:
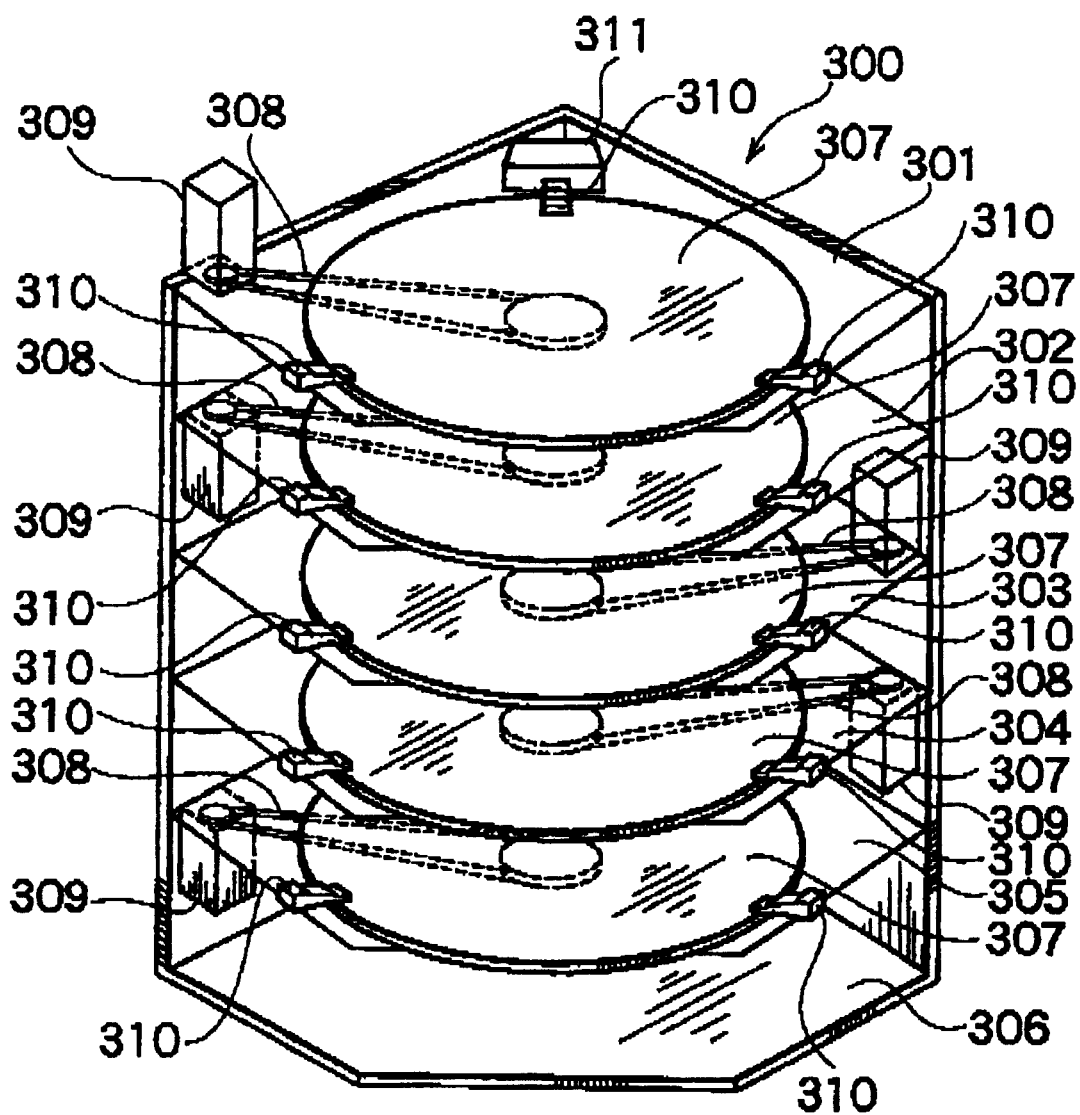
FIG. 15 is an oblique view of the substrate alignment apparatus of the semiconductor manufacturing apparatus pertaining to the second embodiment.
Figure 16:
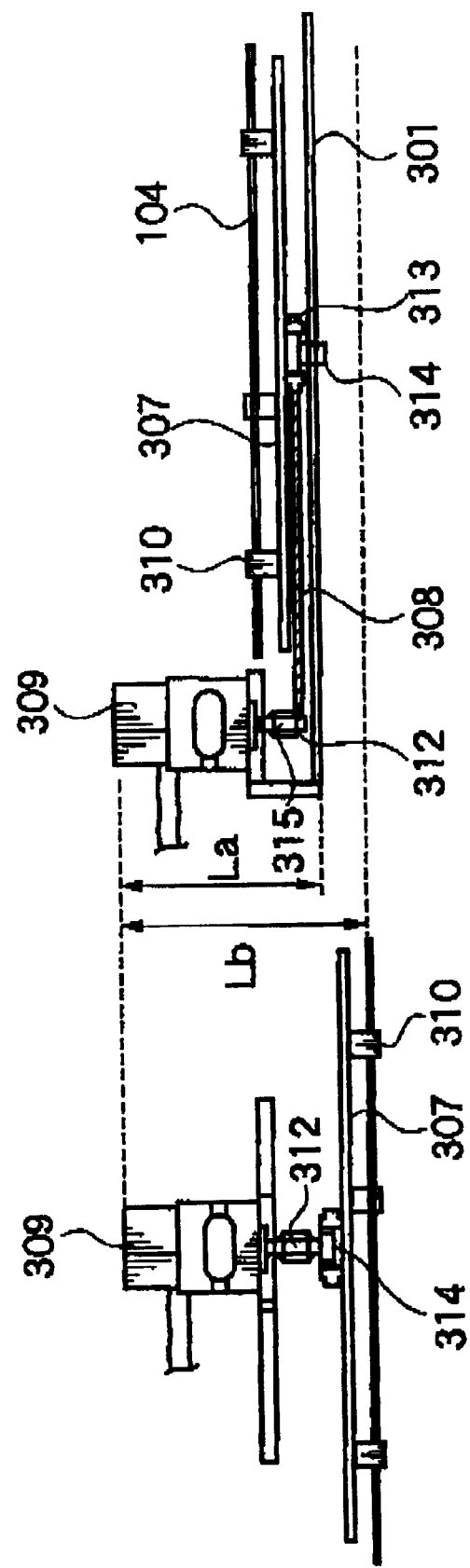
FIGS. 16A and 16B are cross sections illustrating the drive system of the turntables in the second embodiment, with FIG. 16A being an embodiment in which the motor is disposed on the wafer side, and FIG. 16B a comparative example of a direct-linkage type in which the motor is disposed opposite the wafer surface.

As shown in FIG. 15, the substrate alignment apparatus is equipped with a housing 300 having five shelves 301 to 305 (including a top plate 301) and a bottom plate 306, and has an open design in which the two front sites of the housing 300 are open. Turntables 307 with a common rotational center are attached to the top sides of the five shelves 301 to 305, allowing the notches of the five wafers to be detected. The turntables 307 are capable of independent rotary drive, and their drive mechanisms consist of timing belts 308 and motors 309. The motors 309 are provided to the side, rather than under the turntables 307. In addition to functioning as attachment plates for the turntables 307, the shelves 301 to 305 also function as barriers for preventing any particles that might be generated from clinging to the surface of the next lower wafer. The corner sections at the front of the shelves 301 to 305 are cut off, and serve as the loading and unloading point for the wafers.

As to how the motors 309 are attached in the illustrated example, they are split up and disposed on the front and back sides of the shelves 301 to 305 or on the left and right of the housing 300, the reason being that the length of the motors 309 requires them to be disposed so that they take up as little space as possible. The spacing between the turntables here is kept to within 30 mm.

Three support pins 310 are attached at approximately 120° intervals around the outer periphery of the top sides of the turntables 307 such that the outer periphery of the wafers can be supported. Optical sensors 311 are attached at the backs of the shelves 301 to 305 (the opposite side from where the wafers are loaded), allowing the notch of each of the five wafers supported on the support pins 310 to be detected.

FIGS. 16A and 16B are side views illustrating the details of the drive system of the turntables 307. FIG. 16A is an embodiment (corresponding to the uppermost level) in which the motor 309 is provided to the side of the turntables 307, and FIG. 16B is a comparative diagram in which the motor 309 is provided directly beneath the turntables 307. To facilitate comparison. FIG. 16B is turned upside-down.

As shown in FIG. 16A, a pulley 313 is fitted to the rotary shaft 314 of the turntable 307, a pulley 312 is fitted to the drive shaft 315 of the motor 309, and a timing belt 308 is provided between the pulleys 312 and 313. The timing belt 308 follows along the space between the turntable 307 and the shelf 301. If the motor 309 is provided to the side of the turntable 307, and the rotary shaft 314 and the drive shaft 315 are arranged in parallel, then part of the height (thickness) of the motor 309 including the drive shaft 315 can be accommodated within the thickness of the turntable 307, and the apparatus height La can be lowered and the apparatus made more compact because the drive shaft 315 and the rotary shaft 314 do not need to be connected serially. In contrast, if the motor 309 is below the turntable 307 as shown in FIG. 16B, then the connection length of the drive shaft 315 of the motor 309 and the rotary shaft 314 of the turntable 307, and the height of the motor 309 protrude fully as the height of these parts, making the apparatus height Lb taller and the apparatus bulkier.

Figure 17:
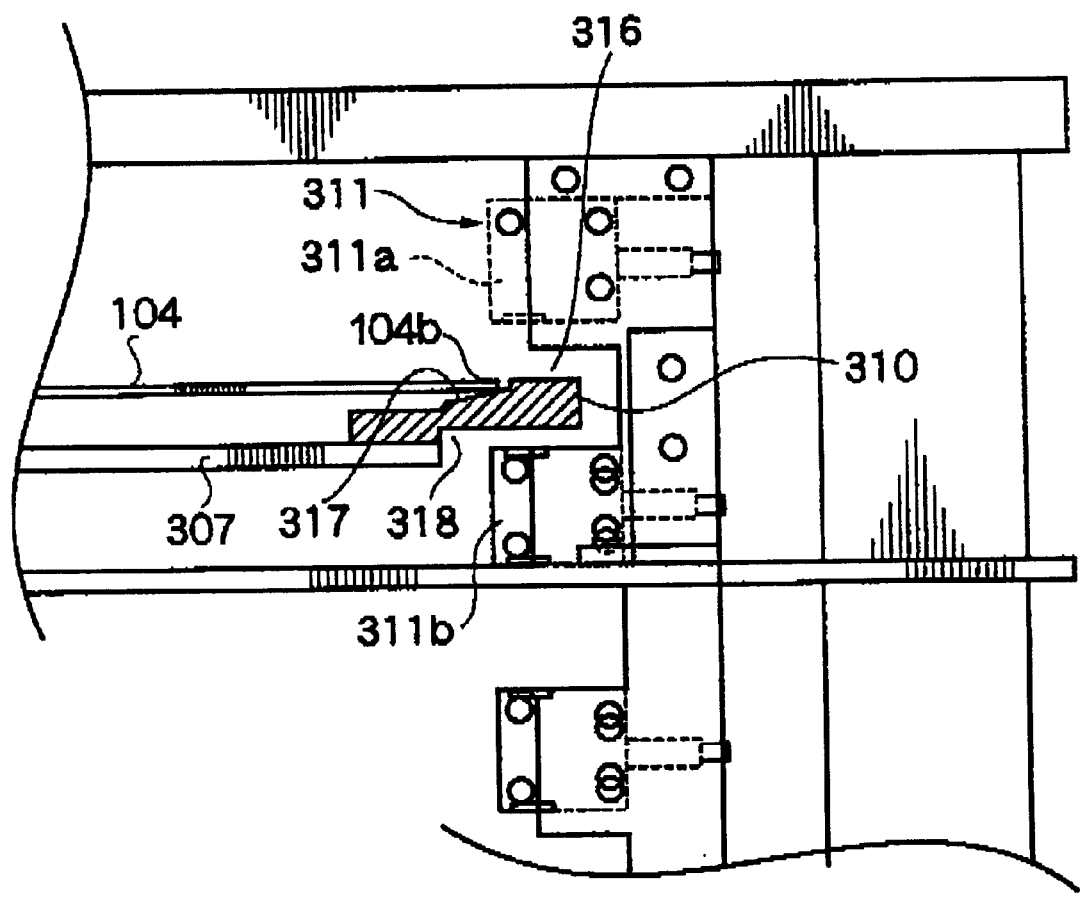
FIG. 17 to a layout diagram illustrating the relationship between the support pins and the optical sensors for detecting notches in the second embodiment.

FIG. 17 is a detail view of the above-mentioned optical sensors 311 and support pins 310. The optical sensor 311 has a cross section with a square indentation on the side, and the outer periphery 104b of the wafer 104 fits into the opening 316 that is this indentation. A light emitting element 311a is provided above the indentation, and a light receiving element 311b below, and the design is such that there is a change in the amount of light received by the light receiving element 311b when the notch arrives at the opening 316, allowing the notch position to be detected.

The diameter of the turntable 307 is slightly smaller than the diameter of the wafer 104 placed thereon, and the support pins 310 protrude out from the outer periphery of the turntable 307 in the outward radial direction so as to support the outer periphery 104b of the wafer 104. Forming the support pins 310 that support the outer periphery 104b of the wafers 104 in this manner eliminates any interference between the support pins 310 and the optical sensors 311, so the wafers 104 can be rotated without restriction and notch alignment can be performed faster and more easily.

The support surfaces of the support pins 310 on which the wafers 104 are supported have tapered portions 317, which allow the wafer center to be aligned more easily with the center of rotation of the turntables 307, allowing any eccentricity of the wafers 104 to be corrected automatically. Also, supporting the substrate outer periphery 104b on the tapered portions 317 prevents particles from clinging to the backs of the wafers.

As shown in the figure, the support pins 310 have an approximate L-shape, and are attached to the outer periphery of the turntable 307 in a position in which they are turned sideways with the bent section 318 facing down. The depression of this L-shaped bent section 318 serves as a recess for the protruding light receiving element 311b of the optical sensor 311. Forming this recess allows the facing distance to be shortened between the light emitting element 311a and the light receiving element 311b, so the apparatus can be more compact.

The above-mentioned recess is not essentially however. If there is no sensor recess on the back side, then there should be no interference of the support pins 310 between the light emitting element 311a and the light receiving element 311b of the optical sensor 311.

The procedure for aligning five wafers all at once with the substrate alignment apparatus having the above structure will now be described through reference to FIG. 18.

Five wafers 104 are loaded into the substrate alignment apparatus with a wafer transfer unit capable of handling five wafers at a time, and these wafers are transferred to the various turntables 307 (steps 401 and 402). The various turntables 307 are independently rotated and the notches are detected by the various sensors 311 (step 403), and the notches are then aligned to the specified position (step 404). Once notch alignment has been completed for all five of the turntables 307, the wafers 104 are transferred out of the substrate alignment apparatus by the wafer transfer unit. In the above notch alignment, the wafers are rotated and the notches are detected on the first rotation, and are controlled such that they are decelerated at the point of detection, their rotation is stopped, and they are returned by the amount they have gone too far. At first glance this operation appears to result in alignment that is simultaneous with notch detection.

Thus, in the second embodiment, the outer periphery 104b of the wafers 104 is supported by the tapered portions 317 of the support pins 310 provided to the turntables 307, the wafers 104 are rotated, and the notches 104a of the wafers 104 are detected and arranged in non-contact fashion, and this affords a reduction in particle generation and effectively prevents particles from clinging to the backs of the wafers. Also, the motors 309 that rotate the turntables 307 are provided for every one of the turntables 307 and operate them independently, so even if a notch position is badly shifted, its alignment will not be hindered by the other wafers, and each notch can be dealt with independently. Also, the apparatus height can be lowered because the motors 309 are not disposed directly beneath the wafers 104, and are instead provided to the side of the turntables 307, with the drive force to the turntables 307 being transmitted by timing belts 308. Thus, with a relatively simple construction, there is no restriction on rotation, and since alignment of the wafers is accomplished all at once, notch position detection is extremely fast.

Figure 19A:
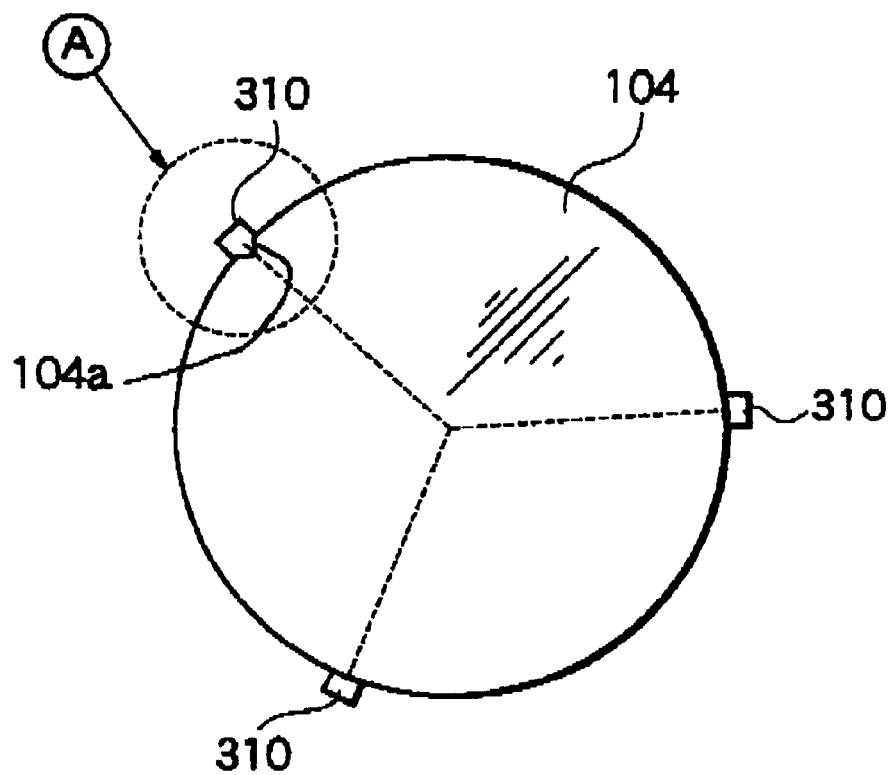
FIGS. 19A and 19B consist of diagrams of the second embodiment illustrating a case in which the notch position overlaps a support pin, with FIG. 19A being a plan view of the wafer and FIG. 19B an enlarged view of (A)
Figure 19B:
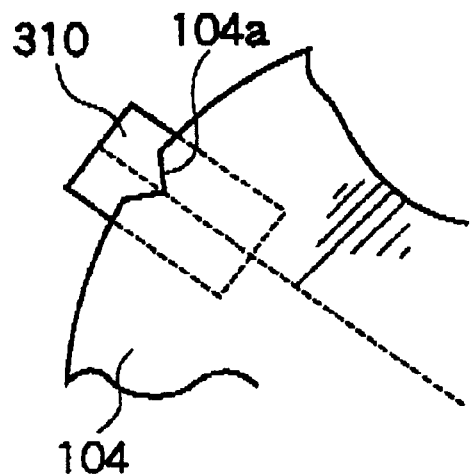
Figure 20A:
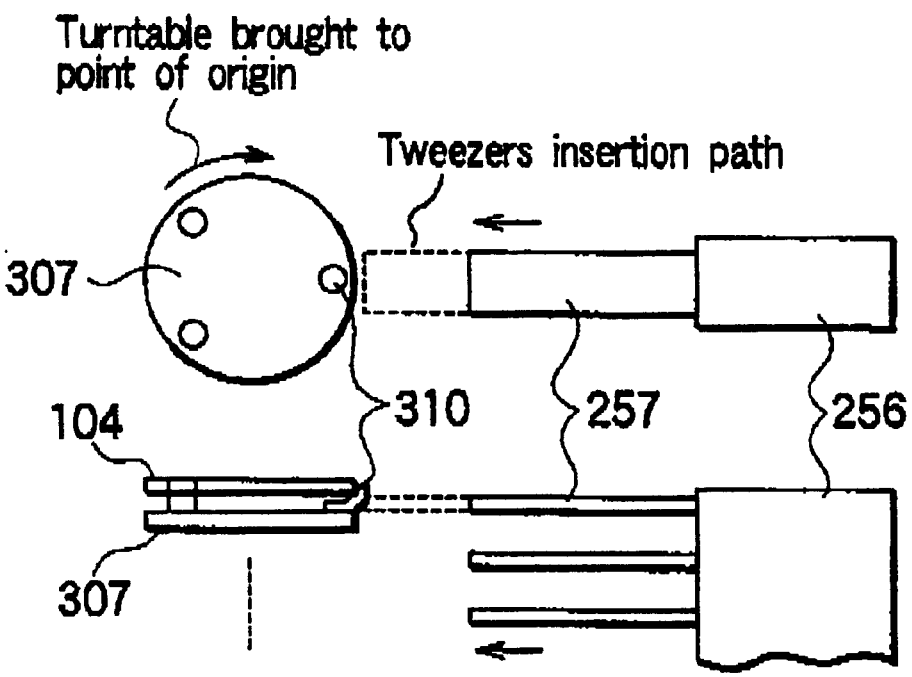
FIGS. 20A and 20B consist of diagrams of the second embodiment illustrating interference between a tweezers and a support pin, with FIG. 20A being when the support pin is located in the forward path of the tweezers, and FIG. 20B when the turntable has return to its point of origin and the support pin is out of the forward path.
Figure 20B:
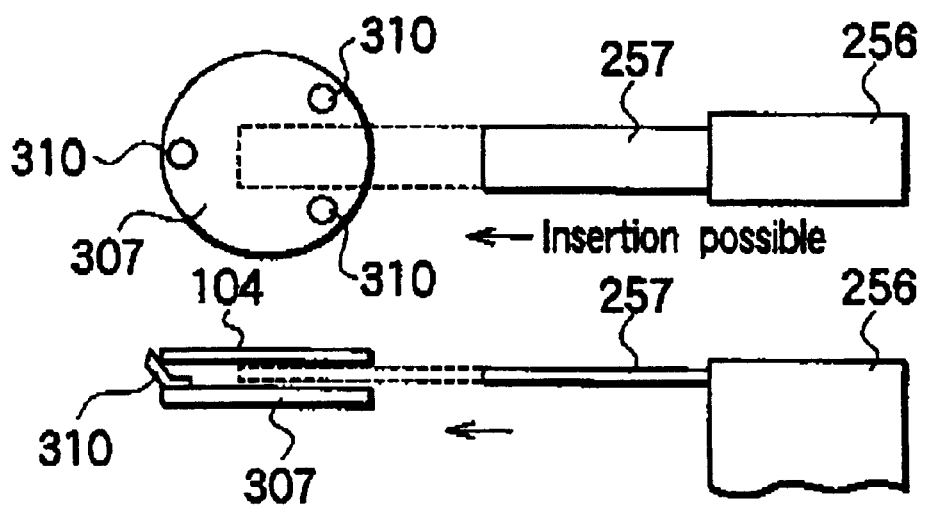

Nevertheless, even with this second embodiment, the following problems are encountered when the notches overlap the support pins 310, or when the support pins 310 come to the tweezers entrance position after notch alignment. For example, as shown in FIGS. 19A and 19B. If the support pin 310 overlaps the notch position, the support pin 310 will block the optical path of the optical sensor and prevent the detection of the notch position. Also, as shown in FIGS. 20A and 20B, there are times when the positions of the support pins 310 are shifted because the turntables 307 have been rotated for the sake of notch alignment, and the support pins 310 are in the way of the forward movement of the tweezers 257 of the wafer transfer unit 256. In a case such as this, the turntables 307 must be brought to their starting point so that the tweezers 257 can move forward, but the problem with this is that the notches that were so carefully aligned become misaligned again.

In view of this, in the third embodiment discussed below, in a case such as that described above, all of the wafers are picked up and retracted, and the turntables are rotated by a specific amount so as to shift the positions of the support pins, and this solves the above-mentioned problems. This pick-up mechanism incorporates the concept of the first embodiment.

Third Embodiment (FIGS. 21 to 29)

This is a substrate alignment apparatus with which notch alignment is possible even when the notches of wafers overlap with the support pins of the turntables.

Figure 21:
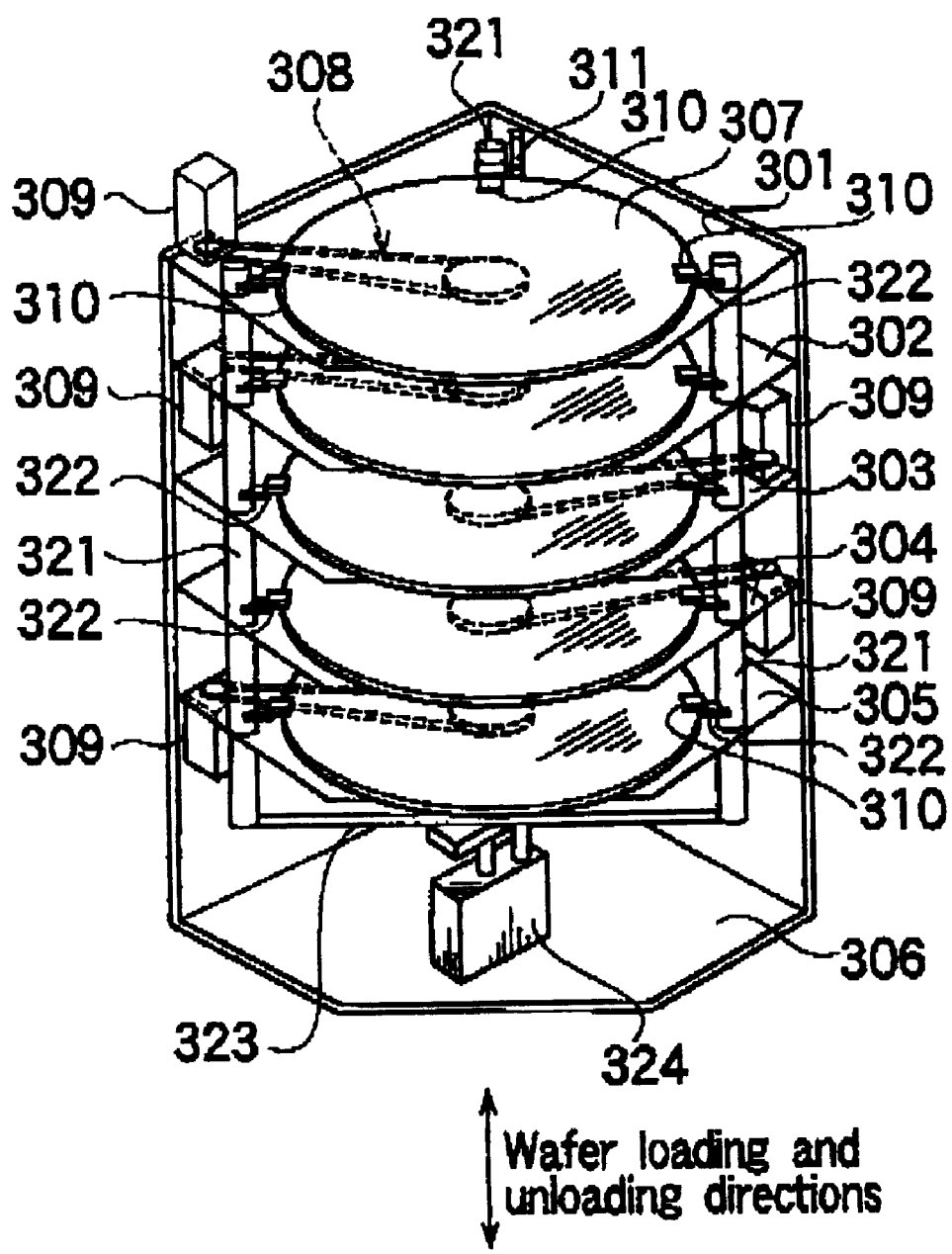
FIG. 21 is an oblique view of the substrate alignment apparatus of the semiconductor manufacturing apparatus pertaining to the third embodiment.

The basic structure shown in FIG. 21 is the same as that of the substrate alignment apparatus in the second embodiment shown in FIG. 15. The difference is that the substrate retraction mechanism employed in the first embodiment is provided for picking up and retracting the wafers, so that when a notch overlaps with a support pin, the wafer is first picked up and retracted, during which time just the turntable is shifted, and the wafer is put back on the shifted turntable, thereby preventing overlap with the support pins. Also, even If a support pin blocks the forward path of the tweezers after alignment, here again, just the turntable is shifted to open up the forward path of the tweezers.

Three pick-up poles 321 are elevatably provided around the outer periphery of a stack of five turntables 307. The direction in which these poles are erected is parallel to the rotational axis of the turntables 307. Pick-up support pins 322 that support the substrate outer periphery of the wafers and pick up the wafers are provided at a specific pitch in the lengthwise direction to these pick-up poles 321 such that they project like arms toward the center of rotation of the pick-up support pins 322. In FIG. 21, the pick-up support pins 322 are drawn such that they overlap with the support pins 310 provided to the turntables 307. The wafer support surfaces of the pick-up support pins 322 are wafer-bearing edge surfaces that are slightly tapered, just as in the first embodiment.

The three pick-up poles 321 go all the way through the shelves 301 to 305 and are integrally attached to a base 323 provided in the space formed between the lowermost shelf 305 and the bottom plate 306. The base 323 can be raised and lowered by an air cylinder 324. The pick-up poles 321 merely go up and down, and neither rotate nor move back and forth. When the pick-up poles 321 are raised, the pick-up support pins 322 are stopped at the substrate outer periphery and pick up the wafers from the support pins 310. After being picked up, the wafers are returned to the support pins 310 by the lowering of the pick-up poles 321.

How the various motors 309 that rotate the turntables 307 are attached is the same as described in the second embodiment, but here we will describe another way of laying out and attaching the motors. This is illustrated in detail in FIG. 22A. The motor 309 cannot be disposed on the arrow side of line Z because the motor 309 will interfere with the wafer 104 during loading. As shown in FIG. 22B, the spacing between the shelves 301 to 305, that is, the spacing between the various turntables 307, must be no more than 30 mm due to restriction of the pitch varying mechanism of the wafer transfer unit 256. If an attempt is made to align the shaft of an upper motor 309 (motor (2) at the second level) with that of a lower motor 309 (motor (4) at the fourth level), the motors will interfere with each other and the spacing cannot be kept within 30 mm, so the motors are alternately shifted in their positions with respect to one another (FIG. 22A). The reason the motors 309 are at the corners is to provide enough distance to accommodate the timing belts 308 between the motor shafts and the center of the turntables 307. Similarly, the purpose of staggering the motors 309 to the left and right at odd and even numbered levels is to keep the motors from interfering with one another, so as to provide a spacing of no more than 30 mm between levels.

Figure 23A:
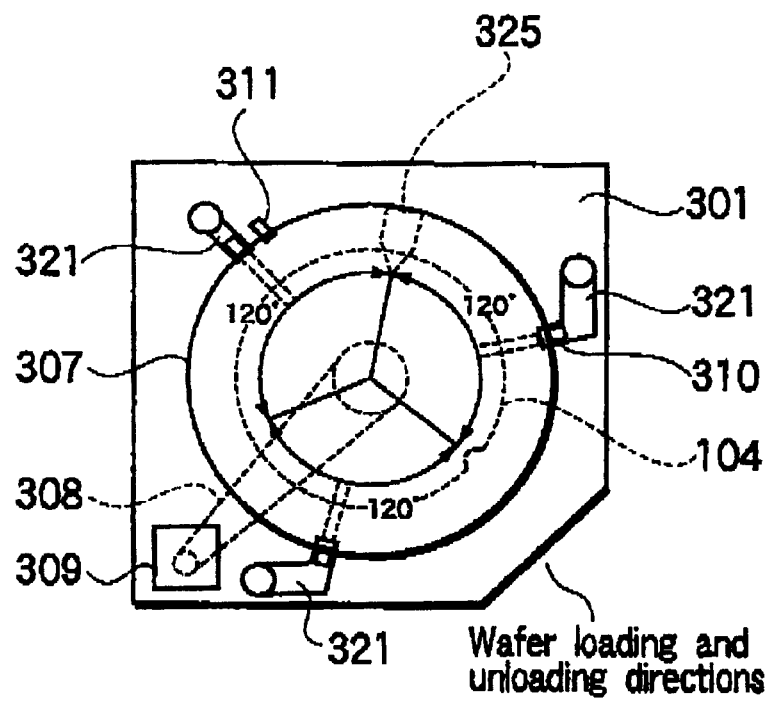
FIGS. 23A and 23B consist of diagrams of the substrate alignment apparatus in the third embodiment, with FIGS. 23A being a plan view and FIG. 235 a vertical cross section.
Figure 23B:
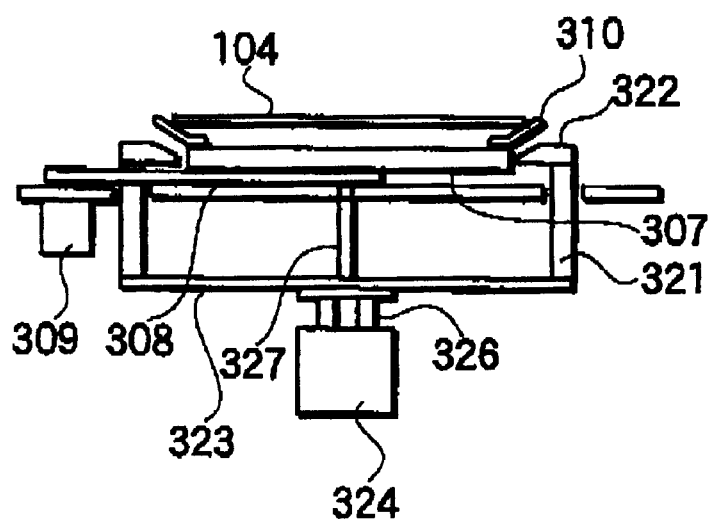

FIGS. 23A and 23B is a detail view of the substrate alignment apparatus shown in FIG. 21, with FIG. 23A being a plan view and FIG. 23B a vertical cross section of the lowermost level. The support pin position sensor 325 shown in FIG. 23A is used to return the turntable 307 to its starting point. The turntable 307 is returned to its starting point using the signals from this sensor, which prevents interference between the tweezers and the support pins 310 on the turntable 307, as will be discussed below. As shown in FIG.

23B, the air cylinder 324 raises and lowers the pick-up poles 321 by driving the base 323, and a guide 327 is provided parallel to elevator rods 326 of the air cylinder 324. This guide 327 allows the pick-up poles 321 to be raised and lowered more smoothly.

Figure 24:
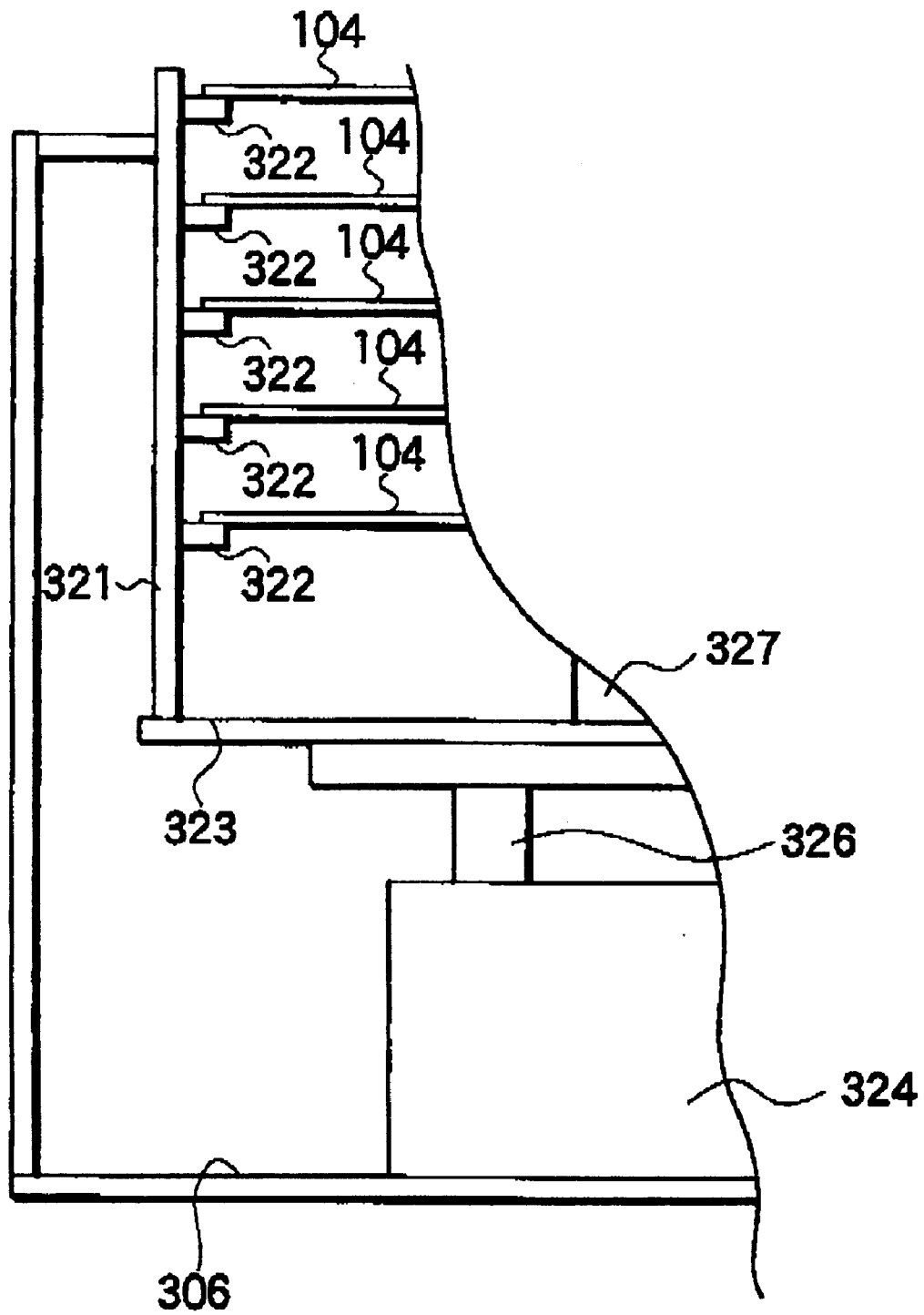
FIG. 24 is a vertical cross section of the main components, illustrating the pick-up mechanism in the third embodiment.

As shown in FIG. 24, the pick-up poles 321 in the third embodiment has the pick-up support pins 322 provided at equidistant spacing in the lengthwise direction, and when the wafers 104 are picked up, all five of them are picked up at once. Just as in the first embodiment, the wafer support surfaces of the pick-up support pins 322 are wafer-bearing surfaces that are slightly tapered, and the wafers are supported around their outer periphery.

Notch alignment with the above structure will now be described through reference to FIGS. 25A, 25B to 28, including a case when a notch position cannot be detected because the notch of a wafer overlaps a support pin 310.

Figure 27:
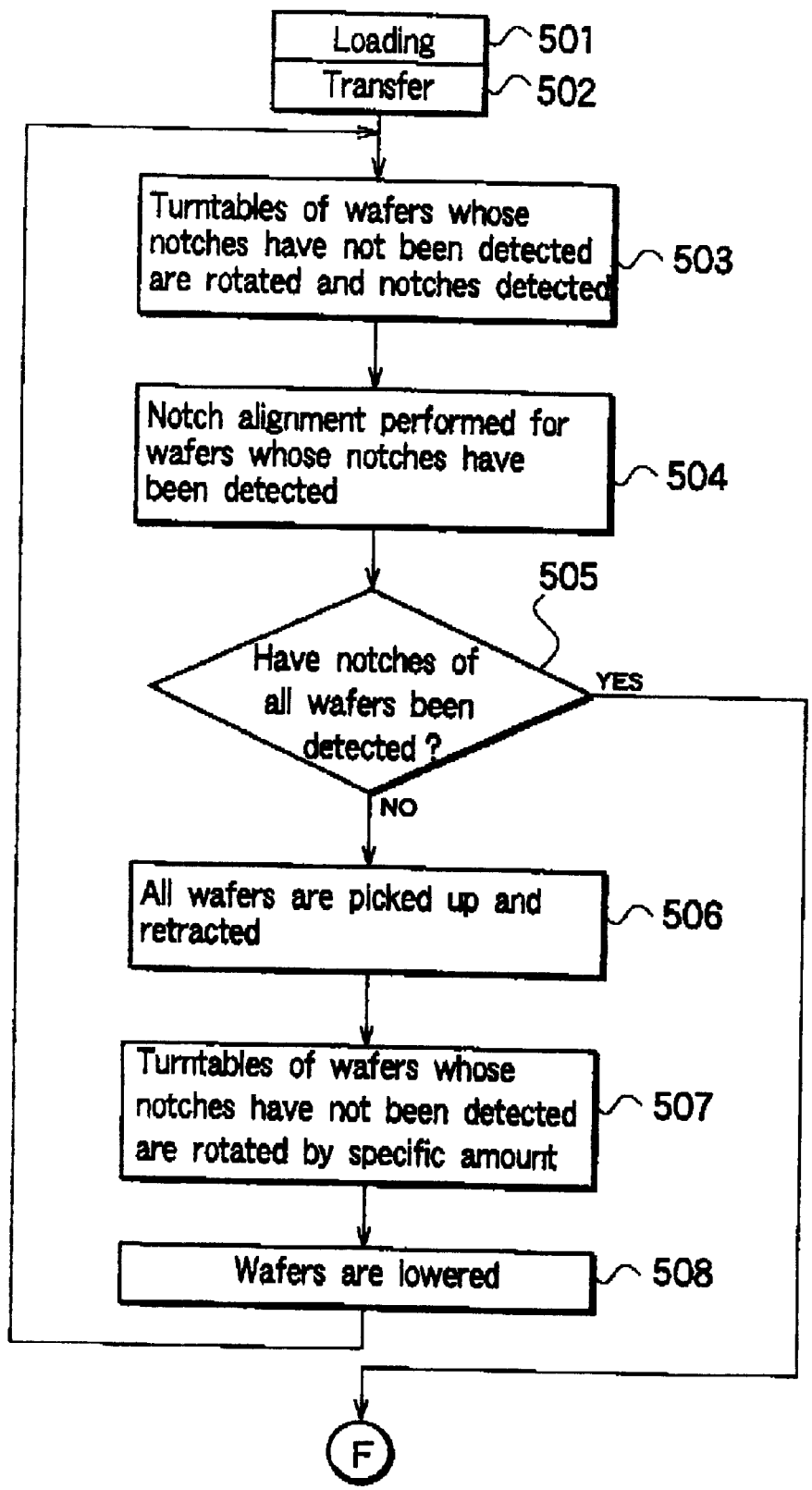
FIG. 27 is a flow chart illustrating the operation of avoiding interference between a notch and a support pin in the third embodiment.
Figure 28:
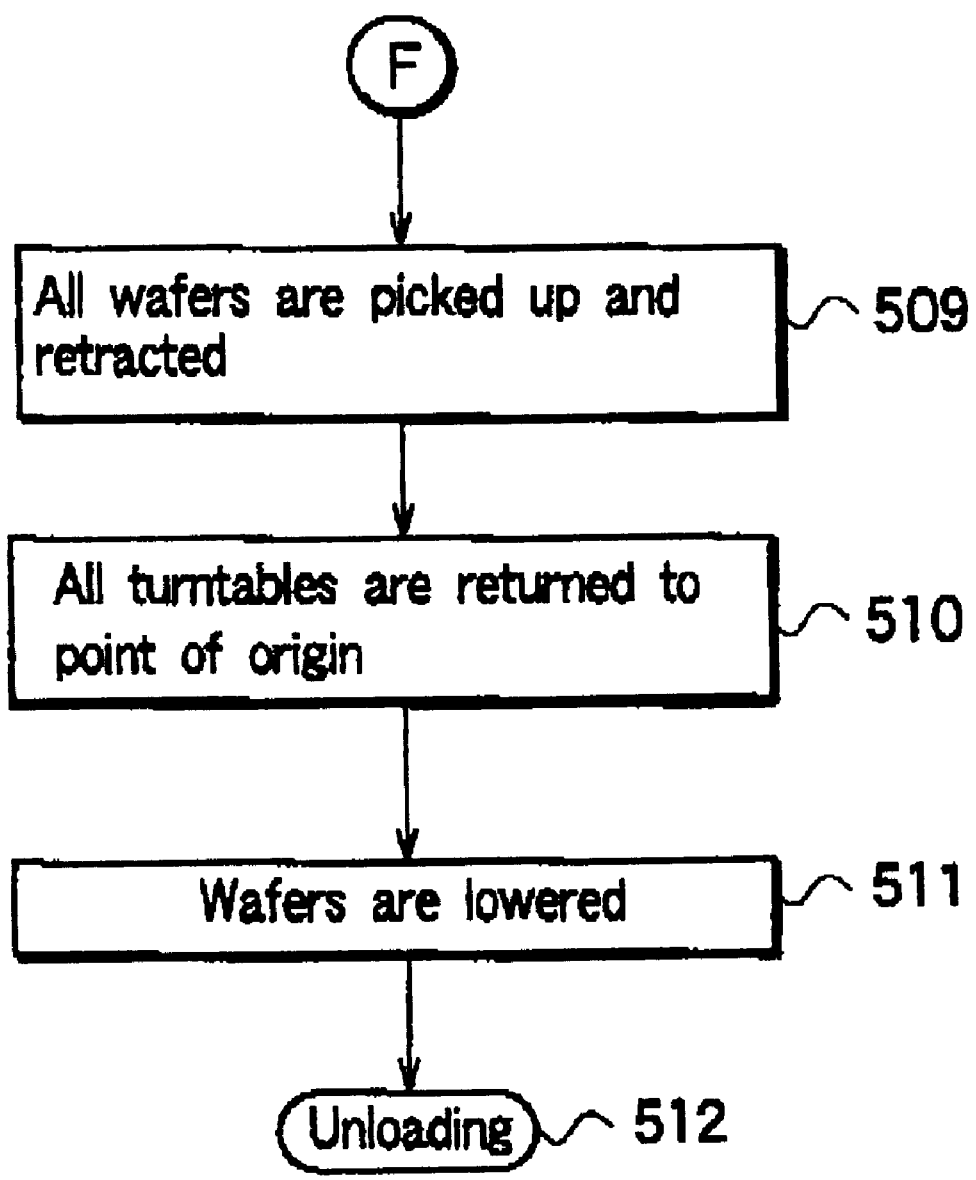
FIG. 28 is a flow chart illustrating the operation of avoiding interference between a tweezers and a support pin in the third embodiment.

As shown in FIG. 27, five wafers 104 are loaded into the substrate alignment apparatus by a wafer transfer unit capable of handling five wafers all at once, and are transferred to the various turntables 307 (steps 501 and 502). After this transfer, the turntables 307 are rotated and the notches 104a are detected (step 503). After this notch detection, those wafers 104 whose notches 104a have been detected are aligned so that their notches are parallel (step 504). In this embodiment, just as in the second embodiment, the turntables 307 are decelerated at the point when notches 104a are detected, rotation is stopped, and the wafers are returned by the amount they have gone too far, Therefore, for wafers 104 whose notches 104a have been detected, at first glance this operation appears to result in alignment of the notches 104a simultaneously with detection of the notches 104a. After this, a decision is made as to whether the notches 104a of all the wafers 104 have been detected (step 505). If the notches 104a of all the wafers 104 have been detected, then the notch alignment is complete for all the wafers 104 at that point, and the flow jumps to step 509. If the notches 104a of all the wafers 104 have not been detected, this means that there is a notch 104a overlapping a support pin 310 of the turntable 307, so an operation is performed to eliminate this overlapping for that wafer 104. First, the pick-up poles 321 are raised by the operation of the air cylinder 324, and all the wafers 104 supported by the support pins 310 of the turntables 307 (FIG. 25A) are temporarily picked up and retracted by the pick-up poles 321 (FIG. 253) (step 506).

Figure 25A:
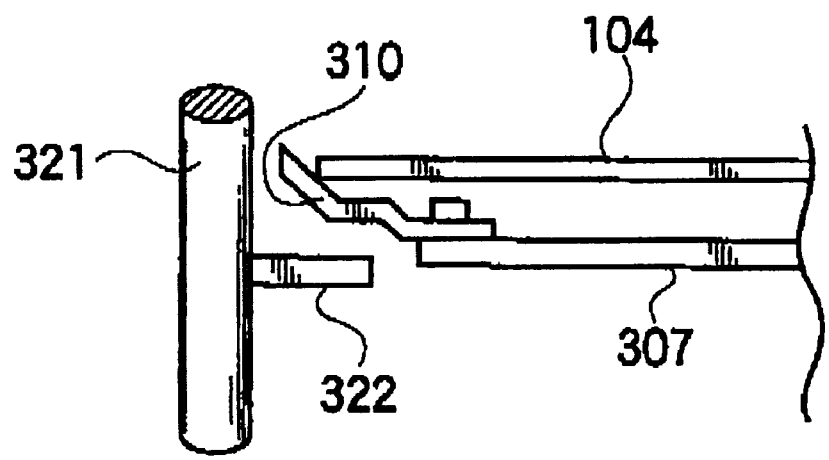
FIGS. 25A and 25B consist of diagrams of the wafer being picked up in the third embodiment with FIG. 25A being before pick-up and FIG. 25B after pick-up.
Figure 25B:
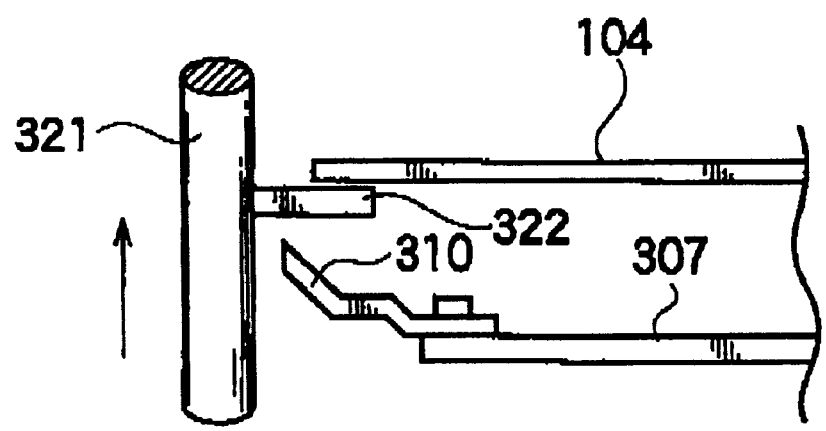
Figure 26:
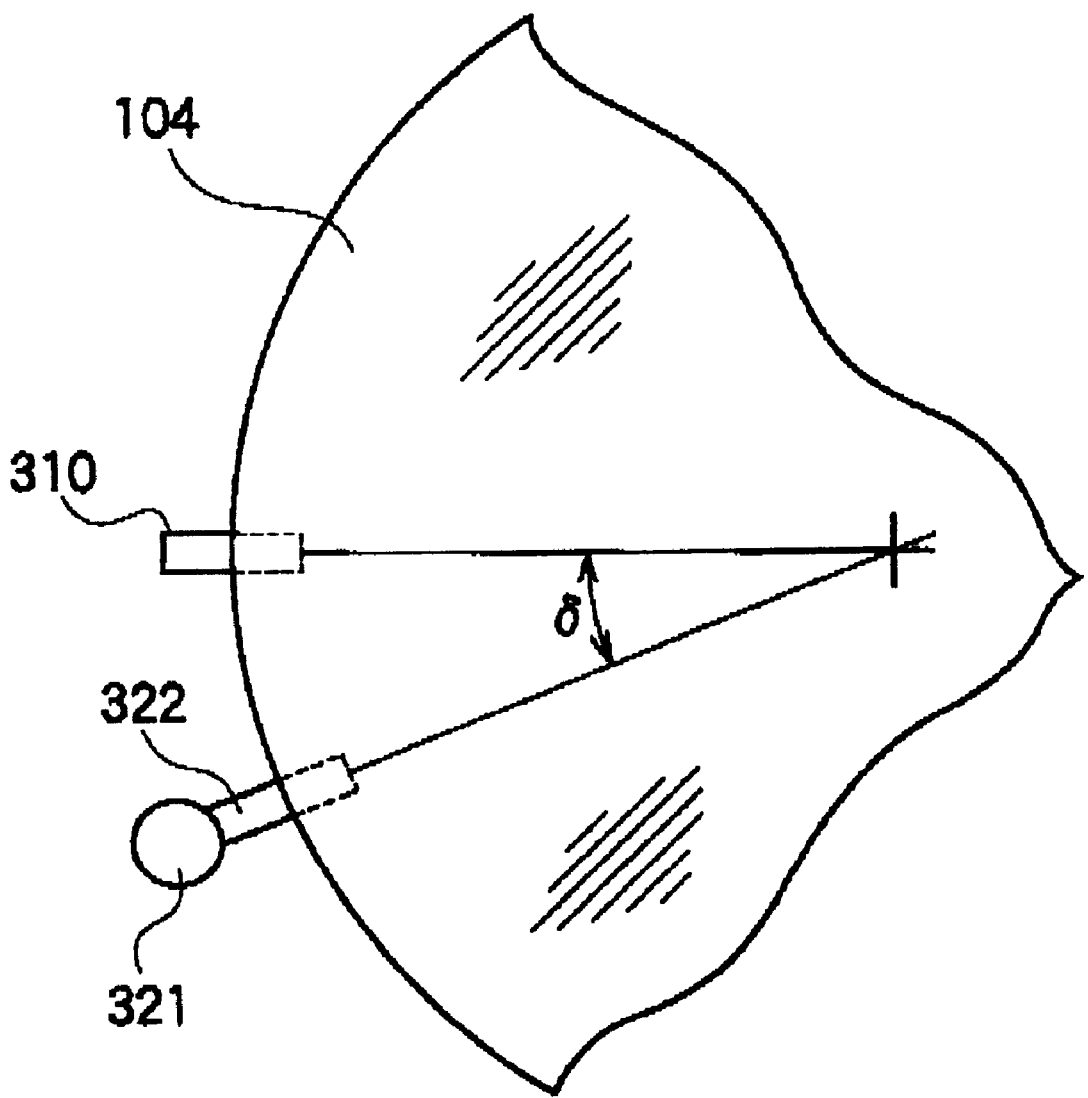
FIG. 26 is a diagram of the third embodiment illustrating the location where the turntable supports with respect to the support pin.

While all the wafers 104 are retracted, the support pins 310 of the turntable 307 of the wafer 104 whose notch 104a was not detected are rotated bye a specific amount and the turntable 307 is halted (step 507). As shown in FIG. 26, when the turntable is stopped, the support pins 310 and the pick-up support pins 322 are stopped at a position shifted by the angle δ. Therefore, any overlap between a support pin 310 and a notch can be eliminated. In this state, the air cylinder 324 is operated in reverse to lower the pick-up poles 321 (step 508), and the wafers 104 are transferred to the support pins 310 (FIG. 25A). This allows the notch positions to be detected.

Once the overlap between the support pins 310 and the notches 104a has been eliminated so that the notches 104a can be detected, the flow returns to step 503, and the above-mentioned series of notch detection and notch alignment operations are performed again for those wafers 104 whose notches 104a have not been detected (steps 503 to 505). The above operation allows notch alignment to be performed for all the wafers 104.

After the notch alignment of all the wafers, all the wafers 104 are retracted (step 509), and the turntables 307 are rotated by the required amount during this retraction so as to return all the turntables to their starting point (step 510). This return to the starting point is performed after every notch alignment, regardless of whether support pins are in the tweezers transfer position, in order to create a state in which the next notch alignment can be performed. After this, the wafers are returned onto the turntables 307 (step 511). The wafers 104 are then smoothly removed using the wafer transfer unit (step 512).

As discussed above, the notches of the wafers 104 taken out of a FOUP by the wafer transfer unit can be aligned in their specified positions by a substrate alignment apparatus having a substrate retraction mechanism, even when the notches are placed overlapping with the support pins of the substrate alignment apparatus. Also, even if the support pin positions of the turntables are in the forward path of the tweezers after completion of notch alignment for all the wafers, the wafers are all temporarily lifted by the pick-up mechanism, during which time the turntables, which are not carrying anything, are rotated by a specific amount and returned to their starting point. After this, the wafer lifting mechanism is lowered and the wafers are put back on the turntables that have undergone starting point alignment, so the forward motion of the tweezers is not impeded.

Figure 29:
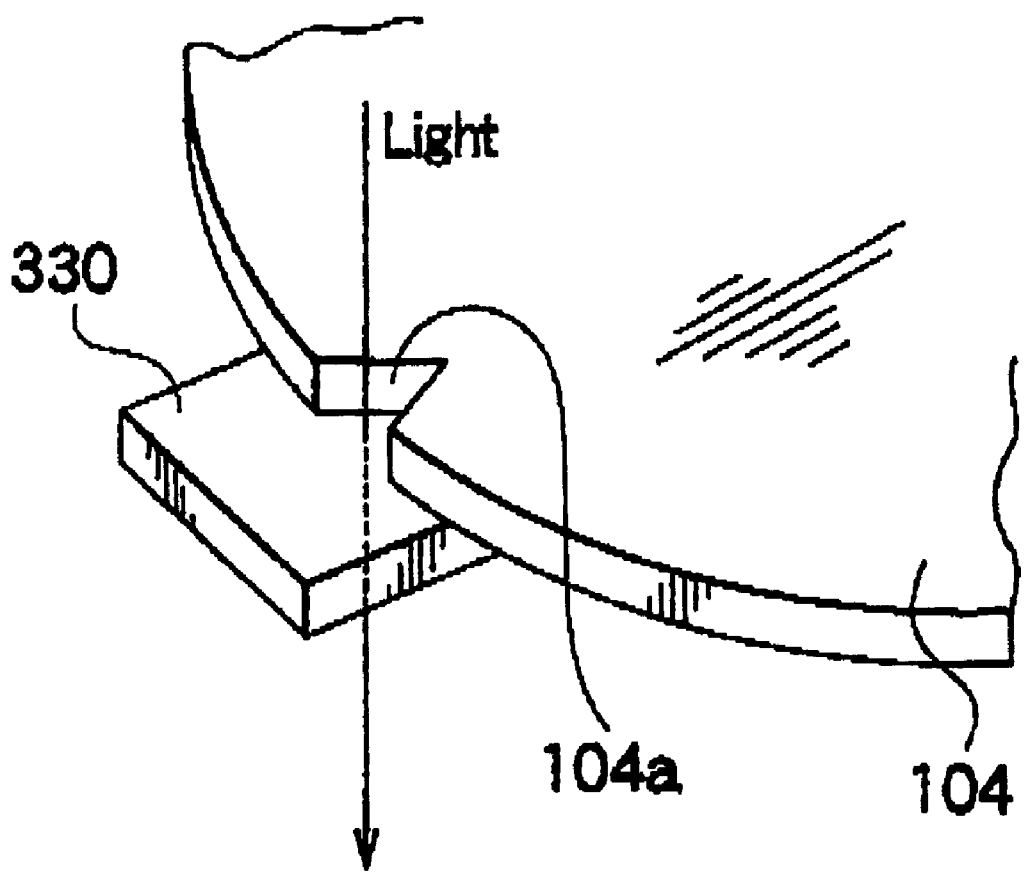
FIG. 29 is an oblique view of the main components in the third embodiment in which the support pin is made of a transparent member.

In the third embodiment, when a notch overlaps a substrate support pin and the notch cannot be detected, this overlap is eliminated using a substrate retraction mechanism, but as shown in FIG. 29, the overlapping notch can be detected without the use of a substrate retraction mechanism if the support pin 330 is molded from a material that is transparent with respect to the light of the optical sensor. Even though the notch 104a overlaps with the support pin 330, the support pin 330 does not block the light because it is transparent, allowing the notch 104a to be detected. Quartz glass is good as the material of the support pins 330. An advantage to making the support pins 330 from a transparent material is that the notches 104a can be detected even when the notches 104a are overlapping the support pins 330, eliminating the need for the notch detection to be carried out again, and this shortens the time it takes for notch detection. Here again, however, a substrate retraction mechanism is necessary because of the problem of interference between the support pins 330 on the turntables 307 and the transfer unit tweezers that move forward into the substrate alignment apparatus.

As a rule, the above first embodiment is premised on the notch position being within a specific angle θ range, but the second and third embodiments do not have this restriction, and notches can be detected wherever they are. The flow of the control components in the second and third embodiments was described, but no control block diagram is given. The control blocks would be structured basically the same as in the first embodiment (see FIG. 9).

In the first embodiment, the notch positions are detected, and the notches are successively aligned to their specific positions, one at a time, on the basis of angular position data for the detected notches, and the notch alignment time here is 36 seconds for five wafers (7.2 seconds/wafer). The results are even better in the second and third embodiments, in which the notches are aligned to their specific positions all at once on the basis of angular position data for the detected notches, taking 19 seconds for five wafers (3.8 seconds/wafer). The above time for the third embodiment is for when there is no overlap between notches and support pins, or is the shortest time when a notch 104a overlaps a support pin 330 and the support pins 330 are made of a transparent material. When the material is not transparent and there is overlap between a notch and support pin, the time is 30+α seconds for five wafers (6+α'/wafer). The above notch alignment times are just examples of when the present apparatus is used, and shorter times can be achieved by varying the rotational speed, the pick-up speed, and other such factors to the extent that no problems such as wafer shifting occur.

From the standpoint of wafer support stability, it is preferable for there to be three support poles and three pick-up poles, but four or more may also be used. In these embodiments, a substrate transfer unit is used for loading and unloading the wafers to and from the substrate alignment apparatus, but when the pitch between wafers in the substrate alignment apparatus is different from the pitch between wafers in the FOUP or boat, then the pitch between the tweezers of the substrate transfer unit must be changed to watch this.

EXAMPLES

The structure of a specific substrate alignment apparatus of the first embodiment, and the pitch values P1 and P2 when notches are detected on all five wafers at once will now be described.

(1) Substrate Alignment Apparatus

Figure 31:
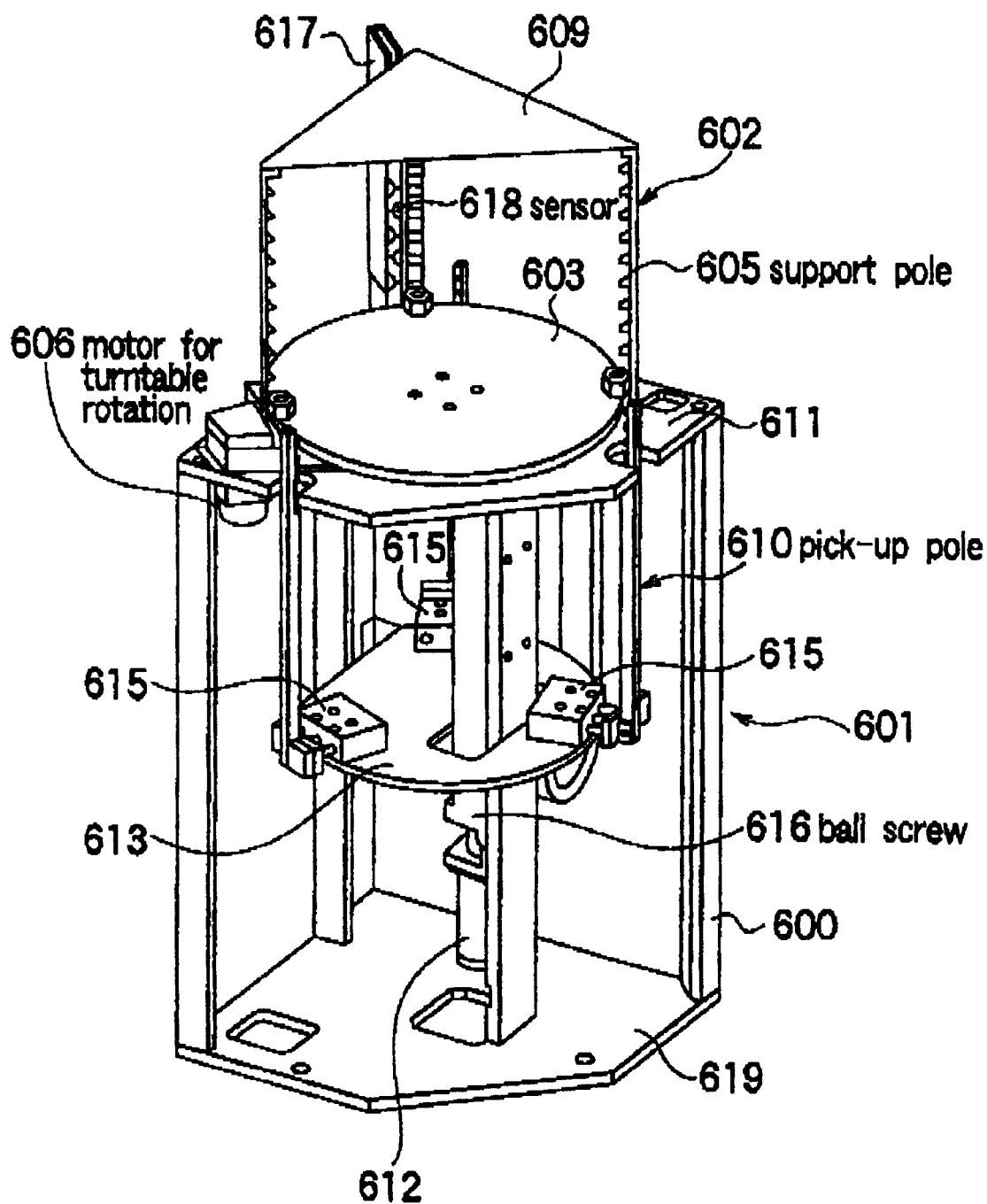
FIG. 31 is an oblique view of a specific substrate alignment apparatus of the semiconductor manufacturing apparatus of the first embodiment in a working example.

FIG. 31 is an oblique view of a specific substrate alignment apparatus of the first embodiment.

The substrate alignment apparatus has a two-level structure. The first level is a mechanism chamber 601 containing mechanisms for raising, lowering, advancing, and retracting pick-up poles 610, and the second level is an alignment mechanism chamber 602 where notch alignment is performed.

The alignment mechanism chamber 602 at the second level comprises a turntable 603 rotatably provided over the mechanism chamber 601, three support poles 605 that are erected around the outer periphery of the turntable 603 and that support five horizontally stacked wafers, a triangular plate 609 that is supported at the top of the three support poles 605 and that covers the surface of the five wafers supported on the support poles 605, a sensor pole 617 that is provided such that it can move back and forth in the radial direction of the turntable 603, that has five optical sensors 618 for notch detection, and that detects the notches in the wafers with these optical sensors 618, and a motor 606 for driving the turntable.

The mechanism chamber 601 at the first level is equipped with a housing 600 having a top plate 611 and bottom plate 619 with a modified pentagonal shape produced by cutting off one corner of a square. The front two sides of the housing 600 are open. The inside of this open housing 600 is provided with an approximately disk-shaped horizontal plate 613 that is provided elevatably, three pick-up poles 610 that are retracted within the mechanism chamber 601 in their initial state and rise during notch alignment to a position where pick-up is possible on the second level, three cylinders 615 that move the various pick-up poles 610 back and forth in the radial direction, a ball screw 616 that goes through the horizontal plate 613, a ball nut (not shown) attached to the horizontal plate 613 and threaded onto the ball screw 616, and a motor 612 that rotates the ball screw 616.

Figure 32:
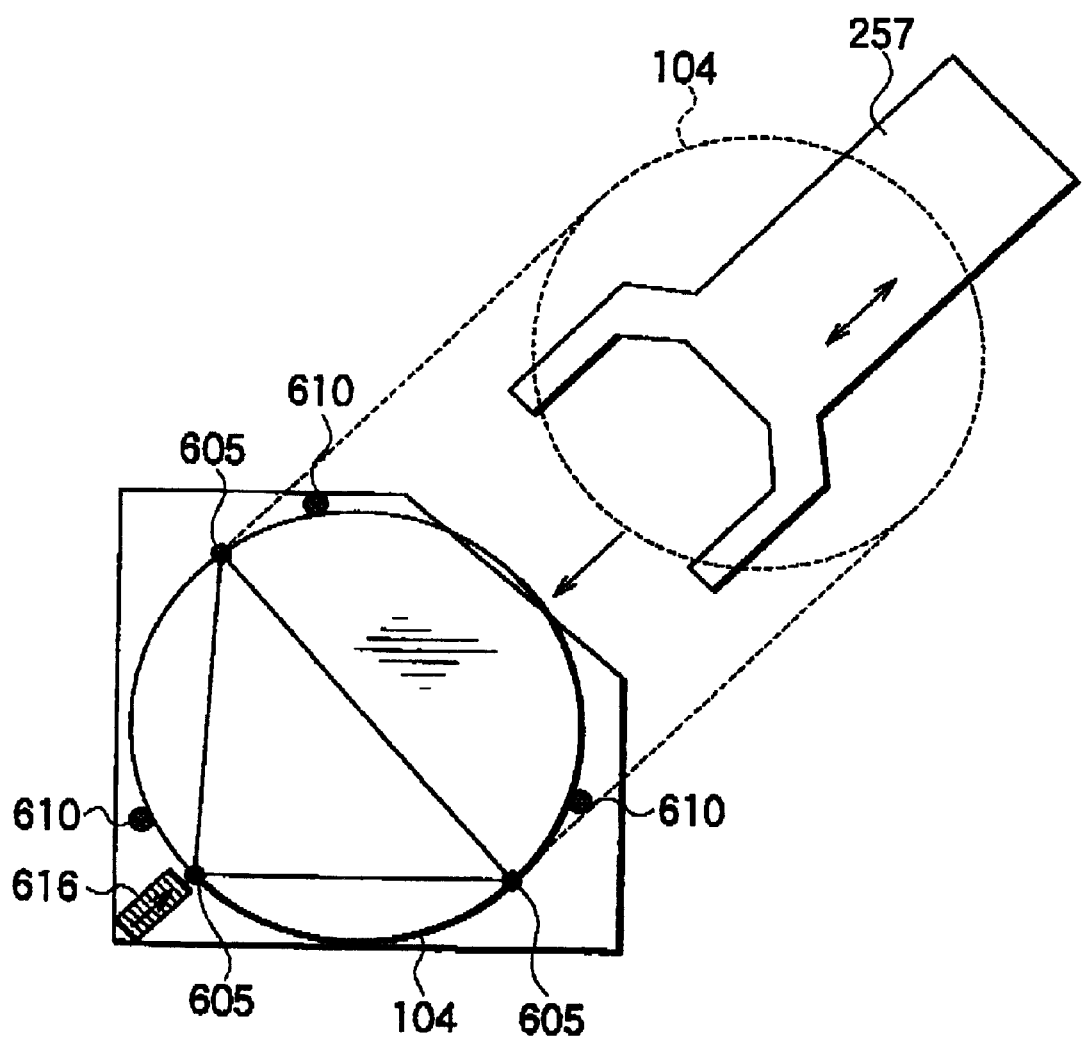
FIG. 32 is a diagram illustrating interference between a pick-up pole and a tweezers in the working example.

The reason the pick-up poles 610 are retracted in the mechanism chamber 601 at the first level in the initial state is to prevent them from interfering with the wafers during the loading of the wafers if the pick-up poles 610 are in the position at the second level where pick-up is possible. Specifically, as shown in FIG. 32, the pick-up poles 610 have to be retracted because they are within the operating range in which the wafers are transferred during wafer transfer. This is why the above-mentioned retraction of the pick-up poles 610 is necessary, and wafer transfer is always conducted in the retracted position.

When the motor 612 is driven, the ball screw 616 rotates and the horizontal plate 613 rises along the ball screw 616. As the horizontal plate 613 rises, the pick-up poles 610 rise up from their retracted position at the first level and rise all the way to the position at the first level where pick-up is possible. The cylinders 613 attached to the horizontal plate 613 are actuated to move the pick-up poles 610 in the inward radial direction, and the pick-up support pins slide under the outer periphery of the wafers 104. The motor 612 is driven again, and as the pick-up poles 610 rise, the wafers 104 supported on the support poles 605 are lifted up and transferred to the pick-up poles 610.

The change points in the flow of FIGS. 11 and 12 when notch alignment is performed using the substrate alignment apparatus with the above structure are the point in step 202 when the support poles 605 have been rotated to the notch detection commencement position and the pick-up poles 610 are then further raised to the position where pick-up is possible, and the point in step 221 when the pick-up poles 610 have been retracted and are then further lowered out of the way down to the mechanism chamber 601 at the first level. As long as the operation of raising the pick-up poles 610 to a position where pick-up is possible is after step 201 but before step 211, it may be performed at any time.

(2) Pitch P1 and P2

When the wafers 104 are actually picked up one by one, the wafer banding ε, the spacing between the wafers 104 and the pick-up support pins 111 and between the wafers 104 and the substrate support pins 107, and so forth must be taken into account in order to avoid interference between the wafers 104 and the pick-up support pins 111 and substrate support pins 107. An example will now be given of a method in which these factors are considered, for determining the pitch P1 of the pick-up support pins 111 and the pitch P2 of the substrate support pins 107 in the actual picking up of the wafers 104 one by one.

In FIGS. 8A, 8B, 8C and 8D, S1, S2, . . . , S5 are the pick-up support pins 111 (in order from the bottom), K1, K2, . . . , K5 are the substrate support pins 107 (in order from the bottom). W1, W2, . . . , W5, are the wafers 104 (in order from the bottom), s is the thickness of the pick-up support pins 111, k is the thickness of the substrate support pins 107, w is the thickness of the wafers 104, and ε is the wafer bending.

Also, in FIGS. 8A, 8B, 8C and 8D, if we let (1) the spacing between the lowermost pick-up support pin S1 and the lowermost wafer W1 in the initial state (FIG. 8A), (2) the spacing between the substrate support pin Km and the picked-up water Wm in a state in which the m-th water (m is an Integer front 1 to 4) has been picked up, and the spacing between the wafer W(m+1) that is picked up next and the pick-up support pin S(m+1) that picks up this wafer (m−1 in FIG. 8B), and (3) the spacing between the uppermost wafer W5 and the uppermost substrate support pin K5 in a state in which the last (fifth) wafer has been picked up, and the spacing between the lowermost wafer W1 and the second lowest substrate support pin K2 (FIG. 8D)

each be ΔL, then the following equations hold true.

$$P2=P1+2\Delta L \quad (4)$$

$$4P1=3P2+k+w+2\Delta L \quad (5)$$

Figure 33:
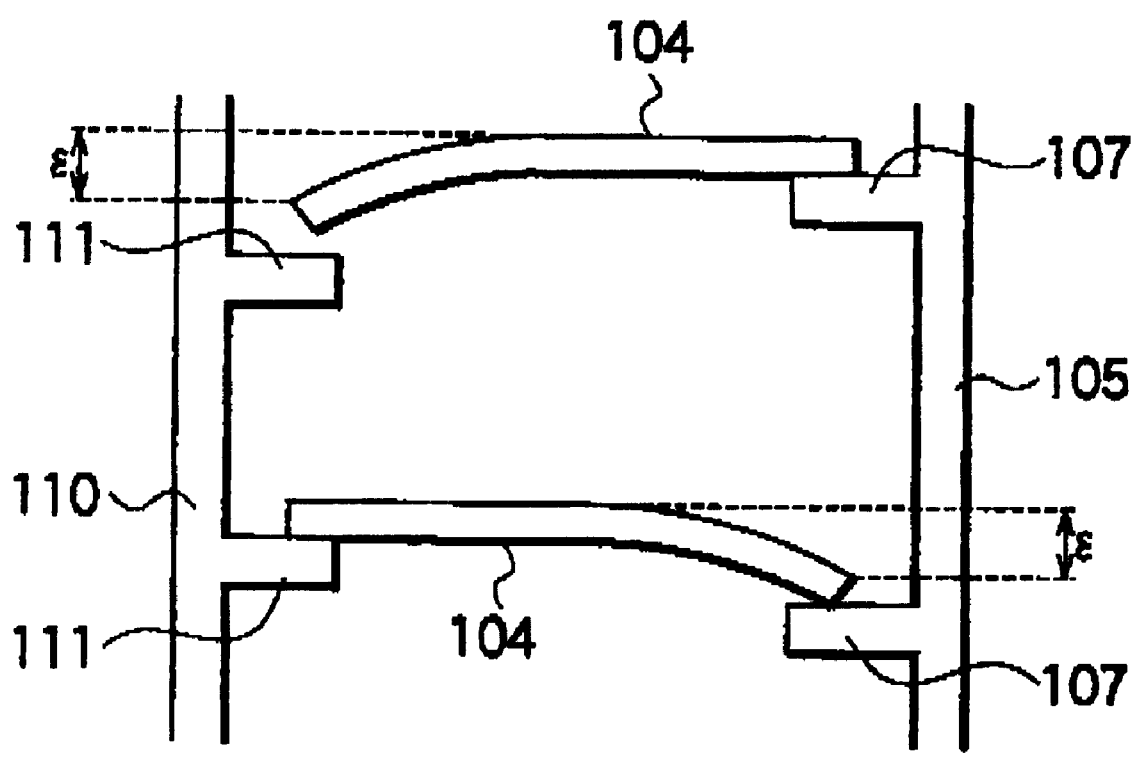
FIG. 33 is a diagram of the wafer strain in the working example.

The spacing ΔL here must be at least greater than the wafer bending ε so that there will be no interference between the wafers 104 and the substrate support pins 107 and pick-up support pins 111 (FIG. 33). An even better margin ΔL' is provided to obtain ΔL=ε+ΔL'. Considering that ε=0.3 mm and the margin ΔL'≧1 mm, the value during design was set to ΔL=2 mm.

Based on FIGS. 8A, 8B, 8C and 8D, the pick-up pitch is 2ΔL=4 mm. Also, s=k=2 mm and w=0.775 mm, and if we let w=0.775 mm be approximately 1 mm, then Formulas 4 and 5 become as follows.

$$P2=P1+4$$

$$4P1=3P2+7$$

Thus, the pitch P1 of the pick-up support pins 111 of the pick-up poles 110 and the pitch P2 of the substrate support pins 107 of the support poles 105 are determined at P1=19 mm and P2=23 mm.

The values given here for the margin ΔL', the thickness s of the pick-up support pins 111, and the thickness k of the substrate support pins 107 are merely examples, and the thickness w of the wafers 104 can be varied according to the type of wafer, the material, the size, and other such factors. Thus, the pitch P1 of the pick-up support pins 111 of the pick-up poles 110 and the pitch P2 of the substrate support pins 107 of the support poles 105 can be set to various values.

What the spacing ΔL from the wafer should be set to in the design of a notch alignment apparatus is not entirely clear in terms of the relationship of bending in a 12-inch wafer. In view of this, the spacing at which there is no interference when the substrate support poles are rotated when the wafers are picked up is tentatively assumed to be 2 mm. This is because the presence of bending is believed to be irrelevant if the spacing is at least six times the bending of 0.3 mm.

Also, the discussion here was about constant spacing of the pick-up support pins 111 and constant spacing of the substrate support pins 107, but the spacing does not have to be equidistant as long as the wafers after notch alignment can be successively picked up one at a time.

With the present invention, the substrates are supported by their outer periphery, rather than their back sides, so particles do not cling to the backs of the substrates. Also, a plurality of substrates can be aligned all at once by providing support poles capable of supporting a plurality of substrates. A plurality of substrates can also be aligned simultaneously by providing a plurality of levels of turntables carrying the substrates. Furthermore, throughput can be increased by utilizing the idle time of the substrate transfer unit to perform the alignment of the substrates. In particular, by providing a substrate retraction mechanism, even if problems such as overlap between an orientation flat or notch and a substrate support component should occur, this problem can be eliminated and the orientation flat or notch of the substrate aligned to its specific position.

What is claimed is:

1. A semiconductor manufacturing apparatus equipped with a substrate alignment apparatus that performs orientation flat or notch alignment for one or a plurality of substrates supported horizontally, wherein said substrate alignment apparatus comprises a substrate support mechanism that has a substrate support component which supports a outer periphery of the substrate and that rotates said substrate support component around a substrate center so as to rotate said substrate, and a detection sensor that detects in non-contact fashion the orientation flat or notch of the substrate supported and rotated by said substrate support mechanism.

2. The semiconductor manufacturing apparatus according to claim 1, wherein a supporting tapered portion is provided to said support component, and a outer periphery of the substrate is supported by this supporting tapered portion.

3. The semiconductor manufacturing apparatus according to claim 1, wherein said detection sensor is constituted such that it moves forward in the inward radial direction of the substrate when detecting the orientation flat or notch of the substrate, and moves backward in the outward radial direction of the substrate when not detecting.

4. The semiconductor manufacturing apparatus according to claim 1, wherein said substrate support mechanism comprises:

a turntable;

a plurality of support poles erected on said turntable;

a substrate support component that is provided to each support pole and supports the outer periphery of each of a plurality of substrates; and a single rotary drive component that rotates said turntable.

5. The semiconductor manufacturing apparatus according to claim 2, wherein said substrate support component further has a tapered portion for correcting substrate eccentricity.

6. The semiconductor manufacturing apparatus according to claim 1, having a substrate retraction mechanism for retracting said substrate from the substrate support component of said substrate support mechanism.

7. The semiconductor manufacturing apparatus according to claim 6, comprising a control component for controlling said substrate support mechanism and said substrate retraction mechanism as in (a) to (c) below:

(a) the rotation of said substrate support mechanism is controlled such that the orientation flats or notches of a plurality of substrates are detected and the orientation flats or notches of the substrates are aligned one by one;

(b) said substrate retraction mechanism is controlled such that the substrates that have undergone orientation flat or notch alignment are successively retracted from said substrate support mechanism one by one; and (c) said substrate retraction mechanism is controlled such that the plurality of retracted substrate are returned to said substrate support mechanism after completion of the orientation flat or notch alignment of all the substrates.

8. The semiconductor manufacturing apparatus according to claim 6, wherein said substrate retraction mechanism comprises:

a base provided such that it can be raised or lowered;

a lifting drive component for raising or lowering said base;

a plurality of pick-up poles that are erected on said base and pick up a plurality of substrates one at a time from said substrate support component as said base is raised and lowered; and a substrate support component that is provided to each of a pick-up poles and supports the outer periphery of the substrate.

9. The semiconductor manufacturing apparatus according to claim 8, wherein said substrate support component has:
   a turntable;
   a plurality of support poles erected on said turntable;
   a substrate support component that is provided to each support pole and supports the outer periphery of each of a plurality of substrates; and
   a single rotary drive component that rotates said turntable,
   wherein a pitch P1 of the substrate support components provided to said pick-up poles and a pitch P2 of the substrate support components of said support poles satisfy a relationship P1<P2.

10. The semiconductor manufacturing apparatus according to claim 9, wherein when n number of substrates are successively picked up one at a time by said pick-up poles,
   the pitch P1 of the substrate support components provided to said pick-up poles and the pitch P2 of the substrate support components of said support poles satisfy a relationship $(n-1)P1>(n-2)P2$.

11. A semiconductor manufacturing apparatus equipped with an orientation flat or notch alignment apparatus that performs orientation flat or notch alignment for a plurality of substrates supported horizontally,
   wherein a substrate alignment apparatus comprises:
      a plurality of turntables provided in a stacked state and sharing a common center of rotation, on each of which is placed one substrate;
      a plurality of substrate support components provided to a turntables for supporting the outer periphery of the substrates;
      a plurality of rotary drive components for independently rotating each of said plurality of turntables; and
      a detection sensor for detecting a orientation flats or notches in non-contact fashion.

12. The semiconductor manufacturing apparatus according to claim 11, wherein said substrate support components are transparent.

13. The semiconductor manufacturing apparatus according to claim 11, further comprising a substrate retraction mechanism for retracting the substrates from the substrate support components.

14. The semiconductor manufacturing apparatus according to claim 13, wherein said substrate retraction mechanism comprises:
   a plurality of pick-up poles that are erected snob that they can be raised or lowered; and
   a plurality of substrate support components that are provided to the each pick-up pole, support the substrate outer periphery and pick up the substrates from the substrate support components when raised, and return the substrates that have been picked up to the substrate support components when lowered.

15. The semiconductor manufacturing apparatus according to any of claim 11, wherein said detection sensor and said substrate support components are in a positional relationship such that there is no contact when said substrates are rotated.

16. The semiconductor manufacturing apparatus according to claim 15, wherein when said detection sensor is an optional sensor, then the structure in which said detection sensor and said substrate support components are in a non-contact positional relationship is a structure comprising:
   a turntable that is smaller in diameter than said substrates;
   a substrate support component protruding in a outward radial direction from said turntable and forming a support component that supports the outer periphery of said substrate; and
   an optical sensor that is outside said turntable in a radial direction and has a light receiving component or light emitting component disposed on a back side of the substrate outer periphery that protrudes out from the smaller-diameter turntable when a substrate is supported by said substrate support component, and a light emitting component or light receiving component disposed on a front side of the substrate outer periphery opposite the light receiving component or light emitting component.

17. The semiconductor manufacturing apparatus according to claim 11, wherein a rotary drive component for rotating the turntable is not disposed beneath said turntable.

18. The semiconductor manufacturing apparatus according to claim 31, wherein rotary drive components that are adjacent in the vertical direction are disposed so as to have different centers of rotation.

* * * * *

UNITED STATES PATENT AND TRADEMARK OFFICE
CERTIFICATE OF CORRECTION

PATENT NO.   : 6,368,049 B1
DATED        : April 9, 2002
INVENTOR(S)  : Akihiro Osaka, Hiroshi Sekiyama, Kouichi Noto and Masaki Sugawara It is certified that error appears in the above-identified patent and that said Letters Patent is hereby corrected as shown below:

Column 42,
Line 4, change "snob" to -- such --.
Line 19, change "optional" to -- optical --.
Line 39, change "31" to -- 17 --.

Signed and Sealed this

Tenth Day of September, 2002

Attest:

Attesting Officer

JAMES E. ROGAN
*Director of the United States Patent and Trademark Office*